United States Patent
Ershov et al.

(10) Patent No.: US 7,746,913 B2
(45) Date of Patent: Jun. 29, 2010

(54) LASER SYSTEM

(75) Inventors: Alexander I. Ershov, San Diego, CA (US); William N. Partlo, Poway, CA (US); Daniel J. W. Brown, San Diego, CA (US); Igor V. Fomenkov, San Diego, CA (US); Robert A. Bergstedt, Carlsbad, CA (US)

(73) Assignee: Cymer, Inc., San Diego, CA (US)

( * ) Notice: Subject to any disclaimer, the term of this patent is extended or adjusted under 35 U.S.C. 154(b) by 262 days.

(21) Appl. No.: 11/981,449

(22) Filed: Oct. 30, 2007

(65) Prior Publication Data
US 2008/0225908 A1 Sep. 18, 2008

Related U.S. Application Data

(63) Continuation-in-part of application No. 11/787,180, filed on Apr. 13, 2007, which is a continuation-in-part of application No. 11/584,792, filed on Oct. 20, 2006, now abandoned, and a continuation-in-part of application No. 11/521,904, filed on Sep. 14, 2006, now abandoned, and a continuation-in-part of application No. 11/522,052, filed on Sep. 14, 2006, now abandoned, and a continuation-in-part of application No. 11/521,833, filed on Sep. 14, 2006, now abandoned, and a continuation-in-part of application No. 11/521,860, filed on Sep. 14, 2006, now abandoned, and a continuation-in-part of application No. 11/521,834, filed on Sep. 14, 2006, now abandoned, and a continuation-in-part of application No. 11/521,906, filed on Sep. 14, 2006, now abandoned, and a continuation-in-part of application No. 11/521,858, filed on Sep. 14, 2006, now abandoned, and a continuation-in-part of application No. 11/521,835, filed on Sep. 14, 2006, now abandoned, and a continuation-in-part of application No. 11/521,905, filed on Sep. 14, 2006, now abandoned.

(60) Provisional application No. 60/814,293, filed on Jun. 16, 2006, provisional application No. 60/814,424, filed on Jun. 16, 2006, provisional application No. 60/732,688, filed on Nov. 1, 2005.

(51) Int. Cl.
*H01S 3/22* (2006.01)

(52) U.S. Cl. .......................................... 372/57; 372/55

(58) Field of Classification Search .................. 372/55, 372/57, 54, 61
See application file for complete search history.

(56) References Cited

U.S. PATENT DOCUMENTS 3,530,388 A    9/1970   Guerra et al. ................. 330/4.3

(Continued)

FOREIGN PATENT DOCUMENTS

JP    2000-223408    2/1999
WO    WO97/08792    3/1997

OTHER PUBLICATIONS

Buczek, et al, "C02 Regenerative Ring Power Amplifiers," *Journal of Applied Physics*, vol. 42, No. 8, pp. 33133-3137, (Jul. 1971).

(Continued)

*Primary Examiner*—Minsun Harvey
*Assistant Examiner*—Tuan N. Nguyen
(74) *Attorney, Agent, or Firm*—DiBerardino Law LLC

(57) ABSTRACT

An apparatus/method which may comprise a line narrowed pulsed excimer or molecular fluorine gas discharge laser system which may comprise a seed laser oscillator producing an output comprising a seed laser output light beam of pulses which may comprise a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, which may comprise a ring power amplification stage; a seed injection mechanism.

33 Claims, 29 Drawing Sheets

U.S. PATENT DOCUMENTS

| | | | |
|---|---|---|---|
| 3,566,128 A | 2/1971 | Arnuad | 250/199 |
| 3,646,468 A | 2/1972 | Buczek et al. | 331/94.5 |
| 3,646,469 A | 2/1972 | Buczek et al. | 331/94.5 |
| 3,969,685 A | 7/1976 | Chenausky et al. | 331/94.5 |
| 4,019,157 A | 4/1977 | Hutchinson | 331/94.5 |
| 4,107,628 A | 8/1978 | Hill et al. | 331/94.5 |
| 4,135,787 A | 1/1979 | McLafferty | 350/294 |
| 4,227,159 A | 10/1980 | Barrett et al. | 331/94.5 |
| 4,229,106 A | 10/1980 | Dorschner et al. | 356/350 |
| 4,239,341 A | 12/1980 | Cason, III et al. | 350/294 |
| 4,247,831 A | 1/1981 | Lindop | 331/94.5 |
| 4,264,870 A | 4/1981 | Avicola et al. | 330/4.3 |
| 4,268,800 A | 5/1981 | Johnson, Jr. | 331/94.5 |
| 4,490,823 A | 12/1984 | Komine et al. | 372/95 |
| 4,499,582 A | 2/1985 | Karning et al. | 372/93 |
| 4,606,034 A | 8/1986 | Eden et al. | 372/57 |
| 4,689,794 A | 8/1987 | Brosnan | 372/18 |
| 4,982,406 A | 1/1991 | Facklam | 372/18 |
| 5,097,478 A | 3/1992 | Verdiell et al. | 372/94 |
| 5,233,460 A | 8/1993 | Partlo et al. | 359/247 |
| 5,239,551 A | 8/1993 | Roberts | |
| 5,835,520 A | 11/1998 | Das | |
| 5,940,418 A | 8/1999 | Shields | 372/22 |
| 6,031,854 A | 2/2000 | Ming | 372/22 |
| 6,067,311 A | 5/2000 | Morton | |
| 6,151,349 A * | 11/2000 | Gong et al. | 372/58 |
| 6,191,887 B1 | 2/2001 | Michaloski et al. | 359/495 |
| 6,240,117 B1 * | 5/2001 | Gong et al. | 372/58 |
| 6,252,666 B1 | 6/2001 | Mandella | |
| 6,272,158 B1 | 8/2001 | Kleinschmidt | |
| 6,320,886 B1 | 11/2001 | Dawber et al. | 372/22 |
| 6,373,869 B1 | 4/2002 | Jacob | 372/22 |
| 6,477,188 B1 | 11/2002 | Takaoka et al. | 372/22 |
| 6,549,551 B2 | 4/2003 | Ness et al. | 372/38.07 |
| 6,560,263 B1 | 5/2003 | Morton et al. | 372/87 |
| 6,567,450 B2 | 5/2003 | Myers et al. | 372/55 |
| 6,577,663 B2 | 6/2003 | Vogler | |
| 6,590,698 B1 | 7/2003 | Ohtsuki et al. | 359/326 |
| 6,590,922 B2 | 7/2003 | Onkels et al. | 372/57 |
| 6,625,191 B2 | 9/2003 | Knowles et al. | 372/55 |
| 6,654,163 B1 | 11/2003 | Du et al. | 359/347 |
| 6,690,704 B2 | 2/2004 | Fallon et al. | 372/58 |
| 6,693,939 B2 * | 2/2004 | Klene et al. | 372/58 |
| 6,700,096 B2 | 3/2004 | Yamazaki | |
| 6,721,344 B2 * | 4/2004 | Nakao et al. | 372/55 |
| 6,741,627 B2 * | 5/2004 | Kitatochi et al. | 372/57 |
| 6,816,520 B1 | 11/2004 | Tulloch et al. | 372/22 |
| 6,839,373 B1 | 1/2005 | Takehisa et al. | 372/57 |
| 6,865,210 B2 | 3/2005 | Ershov et al. | 272/55 |
| 6,901,084 B2 | 5/2005 | Pask et al. | 372/3 |
| 6,904,073 B2 | 6/2005 | Yager et al. | 372/57 |
| 6,928,093 B2 | 8/2005 | Webb et al. | 372/25 |
| 6,940,880 B2 | 9/2005 | Butterworth et al. | 372/22 |
| 7,006,547 B2 | 2/2006 | Steiger | |
| 7,016,388 B2 * | 3/2006 | Klene et al. | 372/55 |
| 7,061,959 B2 | 6/2006 | Partlo et al. | 372/55 |
| 7,072,375 B2 | 7/2006 | Ariga | |
| 7,167,499 B2 | 1/2007 | Das et al. | 219/121.76 |
| 7,184,204 B2 | 2/2007 | Govorkov et al. | 372/25 |
| 7,212,275 B2 | 5/2007 | Ohtsuki | 372/26 |
| 7,227,881 B2 | 6/2007 | Govorkov et al. | 372/25 |
| 7,317,196 B2 | 1/2008 | Partlo | |
| 7,369,597 B2 | 5/2008 | Smith et al. | 372/94 |
| 2004/0202220 A1 | 10/2004 | Hua et al. | 372/57 |
| 2005/0269300 A1 | 12/2005 | Partlo et al. | 219/121.65 |
| 2005/0286599 A1 | 12/2005 | Rafac et al. | 372/55 |
| 2006/0007978 A1 | 1/2006 | Govorkov et al. | 372/55 |
| 2006/0114958 A1 | 6/2006 | Trintchouk et al. | 372/55 |
| 2006/0126697 A1 | 6/2006 | Knowles et al. | 372/55 |
| 2006/0146900 A1 | 7/2006 | Jacques et al. | 372/38.1 |
| 2006/0209916 A1 | 9/2006 | Holtaway et al. | 372/55 |
| 2006/0222034 A1 | 10/2006 | Ujazdowski et al. | 372/57 |
| 2006/0227839 A1 | 10/2006 | Besaucele et al. | 372/55 |
| 2006/0291517 A1 | 12/2006 | Gillespie et al. | 372/55 |
| 2007/0001127 A1 | 1/2007 | Reiley et al. | 250/492.2 |
| 2007/0091968 A1 | 4/2007 | Wakabayashi | |
| 2007/0237192 A1 | 10/2007 | Das et al. | 372/25 |
| 2007/0279747 A1 | 12/2007 | Hofmann | 359/583 |

OTHER PUBLICATIONS

Cobb, et al, "EUV Photoresist Performance Results From The VNL and The EUV LLC," *Emerging Lithographic Technologies VI*, Roxann L. Engelstad, Editor Proceedings of SPIE, vol. 4688 (2002).

Fork, et al, "Amplification of Femtosecond Optical Pulses Using A Double Confocal Resonator," *Optics Letters*, vol. 14, No. 19 (Oct. 1989).

Goodman, "Speckle In Certain Imaging Applications," Chapter 6 of *Speckle Phenomena In Optics: Theory and Applications*, pp. 187-233.

Lee, "Effect Of Line Edge Roughness (LER) And Line Width Roughness (LWR) On Sub-100 nm Device Performance, Advances In Resist Technology and Processing XXI," edited by John L. Sturtevant, *Proceedings of SPIE* vol. 5376 (SPIE, Bellingham, WA. 2004).

Leunissen, et al, "Full Spectral Analysis Of Line Width Roughness, Metrology, Inspection and Process Control For Microlithography XIX," edited by Richard M. Silver, Proc. Of SPIE vol. 5752 (SPIE, Bellingham, WA 2005).

Ming-Lai, et al., "Transversely Pumped 11-Pass Amplifier For Femtosecond Optical Pulses," *Applied Optics*, vol. 30, No. 30, pp. 4365-4367 (Oct. 20, 1991).

Monga, et al., "Collimination Of The Output Beam From An Asymmetric Unstable Ring Resonator," *Applied Optics*, vol. 24, No. 6, pp. 914-916 (Mar. 15, 1985).

Mückenheim, et al., "Attaining The Wavelength Range 189-197 By Frequency Mixing In B-BaB2O4," Appl.Phys. B 45, pp. 259-261 (1988).

Nabors, et al., "Injection Locking Of A 13-W cw Nd:YAG Ring Laser," *Optics Letters*, vol. 14, No. 21, (Nov. 1989).

Nabekawa, et al., "50-W Average Power, 200-Hz Repetition Rate, 480-fs KrF Excimer Laser With Gated Gain Amplification," *CLEO*, p. 96 (2001).

Naulleau, "Relevance Of Mask-Roughness-Induced Printed Line-Edge Roughness In Recent and Future Extreme-Ultraviolet Lithography Tests," *Applied Optics*, vol. 43, Issue 20, pp. 4025-4032 (2004).

Naulleau, "The Role of Temporal Coherence In Imaging With Extreme Ultraviolet Lithography Optics," *Optics Communications*, 219 pp. 57-63 (2003).

Nilsson, et al., "High-Power Wavelength-Tunable Cladding-Pumped Rare-Earth-Doped Silica Fiber Lasers," *Opt. Fiber Tech.*, 10, pp. 5-30 (2004).

Olson, et al., "Multipass Diode-Pumped Nd:YAG Optical Amplifiers At 1.06 um and 1.32 um," *IEEE Photonics Technology Letters*, vol. 6, No. 5, pp. 605-608 ( May 5, 1994).

Pacala, et al., "A Wavelength Scannable XeCl Oscillator-Ring Amplifier Laser System", *App. Phys. Letters*, vol. 40, No. 1 (Jan. 1982).

Partlo, et al., "Diffuser Speckle Model: Application to Multiple Moving Diffusers," *Applied Optics*, vol. 32, No. 16, pp. 3009-3014 (Jun. 1993).

Paschotta, "Regenerative Amplifiers," found at http://www.rp-photonics.com/regenerative_amplifiers.html.

Patsis, et al., "Integrated Simulation Of Line-Edge Roughness (LER) Effects on Sub-65 nm Transistor Operation: From Lithography Simulation, To LER Metrology, To Device Operation," Emerging Lithographic Technologies X. edited by Michael J. Lercel, *Proc. Of SPIE*. vol. 6151, 61513J (2006).

Pawloski, et al., "Characterization Of Line Edge Roughness In Photoresist Using An Image Fading Technique," Advances In Resist Technology and Processing XXI, John L. Sturtevant, Editor, *Proc., of SPIE*, vol. 5376, pp. 414-425 (SPIE, Bellingham, WA 2004).

Plaessmann, et al., "Multipass Diode-Pumped Solid-State Optical Amplifier," *Optics Letters*, vol. 18, No. 17, pp. 1420-1422 (Sep. 1, 1993).

Rydberg, et al., "Dynamic Laser Speckle As A Detrimental Phenomenon In Optical Projection Lithography," *J. Microlith., Microfab., Microsyst.*, vol. 53, No. 1-1-1-8 (Jul.-Sep. 2006).

Sandstrom, et al., "Dynamic Laser Speckle in Optical Projection Lithography: Causes, Effects On CDU and LER, and Possible Remedies," *Optical Microlithography XVIII*, Bruce W. Smith, Editor, *Proc., of SPIE*, vol. 5754, pp. 274-284 (SPIE, Bellingham, WA 2005).

Uppal, et al., "Performance of a General Asymmetric Unstable Nd: Glass Ring Laser", *Applied Optics*, Vo. 25, No. 1, pp. 97-101 (Jan. 1986).

Yamaguchi, et al., "Impact of Long-Period Line-Edge Roughness (LER) on accuracy in CD Measurement," edited by Richard M. Silver, *Proc. Of SPIE*, vol. 5752, (SPIE, Bellingham, WA 2005).

"Ti-Sapphire Laser," found at http://en.wikipedia.org/wiki/Ti-sapphire_laser.

"Second Harmonic Generation," found at http://en.wikipedia.org/wiki/Second_harmonic_genertation.

"Acousto-Optics Introduce Phase Shift," found at http://laserfocusworld.com/articles.

* cited by examiner

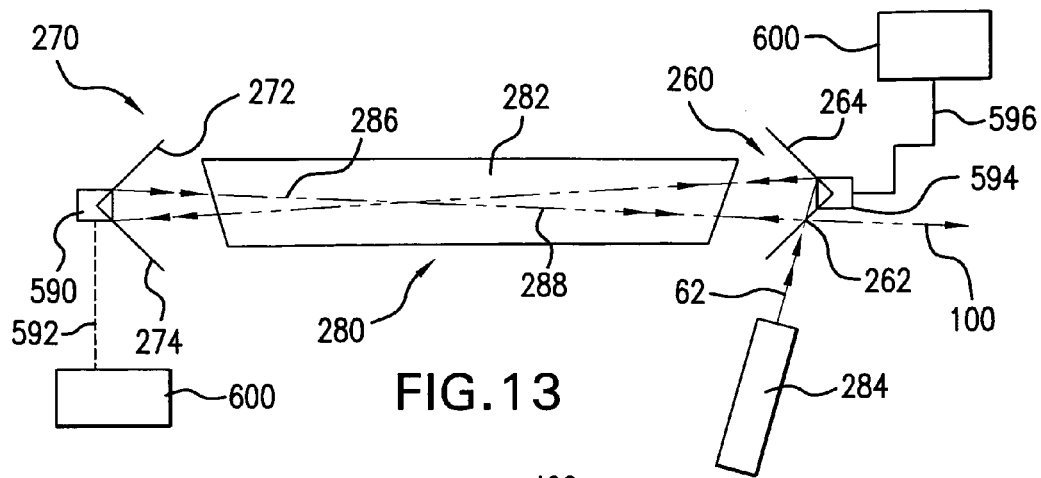
FIG. 13
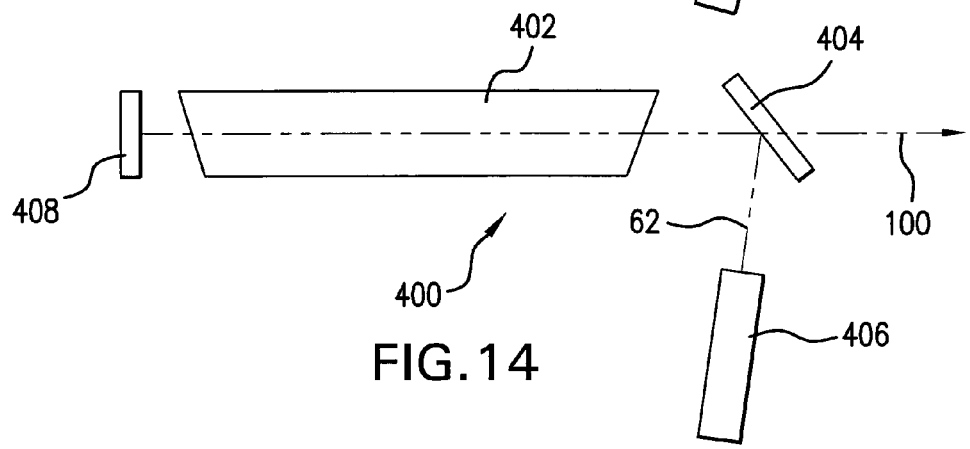
FIG. 14
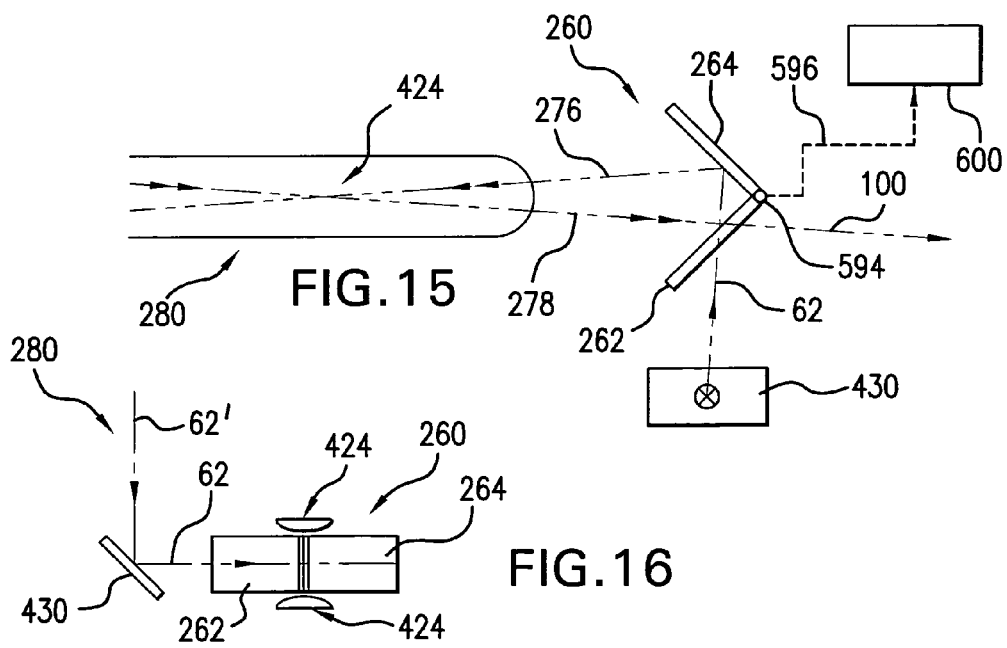
FIG. 15
FIG. 16

LASER SYSTEM

CROSS-REFERENCE TO RELATED APPLICATIONS

The present application is a Continuation-in-Part of U.S. patent application Ser. No. 11/787,180, filed on Apr. 13, 3007, entitled LASER SYSTEM, which was a Continuation-in-Part of U.S. patent application Ser. No. 11/584,792, filed on Oct. 20, 2006, now abandoned entitled LASER SYSTEM, which claimed priority to U.S. Provisional Application Ser. No. 60/732,688, filed on Nov. 1, 2005, entitled 200 W GAS DISCHARGE EXCIMER OR MOLECULAR FLUORINE MULTICHAMBER LASER, and to Ser. No. 60/814,293 filed on Jun. 16, 2006, entitled 200 WATT DUV GAS DISCHARGE LASER SYSTEM, and to Ser. No. 60/814,424, filed on Jun. 16, 2006, entitled LONG LIVED MO IN MOPO CONFIGURED LASER SYSTEM, and was a Continuation-in-Part of U.S. patent application Ser. No. 11/521,904, filed on the Sep. 14, 2006, now abandoned entitled LASER SYSTEM, and Ser. No. 11/522,052, filed on Sep. 14, 2006, now abandoned entitled LASER SYSTEM, and Ser. No. 11/521,833, filed on Sep. 14, 2006, now abandoned entitled LASER SYSTEM, and Ser. No. 11/521,860, filed on Sep. 14, 2006, now abandoned entitled LASER SYSTEM, and Ser. No. 11/521,834, filed on Sep. 14, 2006, now abandoned entitled LASER SYSTEM, and Ser. No. 11/521,906, filed on Sep. 14, 2006, now abandoned entitled LASER SYSTEM, and Ser. No. 11/521,858, filed on Sep. 14, 2006, now abandoned entitled LASER SYSTEM, and Ser. No. 11/521,835, filed on Sep. 14, 2006, now abandoned entitled LASER SYSTEM, and Ser. No. 11/521,905, entitled LASER SYSTEM, filed Sep. 14, 2006, now abandoned, the disclosures of each of which are hereby incorporated by reference.

The present application is related to U.S. patent application Ser. No. 11/447,380, entitled DEVICE AND METHOD TO STABILIZE BEAM SHAPE AND SYMMETRY FOR HIGH ENERGY PULSED LASER APPLICATIONS, filed on Jun. 5, 2006, and is related to U.S. patent application Ser. No. 10/881,533, entitled METHOD AND APPARATUS FOR GAS DISCHARGE LASER OUTPUT LIGHT COHERENCY REDUCTION, filed on Jun. 29, 2004, and published on Dec. 29, 2005, Pub. No. 20050286599, the disclosures of which are hereby incorporated by reference. The present application is also related to U.S. Pat. No. 6,549,551, issued on Apr. 15, 2003, to Ness et al, entitled INJECTION SEEDED LASER WITH PRECISE TIMING CONTROL; and U.S. Pat. No. 6,567,450, issued on May 20, 2003, to Myers et al, entitled VERY NARROW BAND TWO CHAMBER HIGH REP RATE GAS DISCHARGE LASER SYSTEM; and U.S. Pat. No. 6,625,191, entitled VERY NARROW BAND TWO CHAMBER HIGH REP RATE GAS DISCHARGE LASER SYSTEM, issued on Sep. 23, 2003 to Knowles et al; and U.S. Pat. No. 6,865,210, issued on Mar. 8, 2005, to Ershov et al, entitled TIMING CONTROL FOR TWO CHAMBERED GAS DISCHARGE LASER SYSTEM; and U.S. Pat. No. 6,690,704, entitled CONTROL SYSTEM FOR TWO CHAMBER GAS DISCHARGE LASER SYSTEM, issued on Feb. 10, 2004 to Fallon et al; and U.S. Pat. No. 6,561,263, issued on May 6, 2003, to Morton et al., entitled DISCHARGE LASER HAVING ELECTRODES WITH SPUTTER CAVITIES AND DISCHARGE PEAKS; and U.S. Pat. No. 6,928,093, entitled LONG DELAY AND HIGH TIS PULSE STRETCHER, issued to Webb et al. on Aug. 9, 2005; the present application is also related to co-pending U.S. patent application Ser. No. 10/781,251, filed on Feb. 18, 2004, entitled VERY HIGH ENERGY, HIGH STABILITY GAS DISCHARGE LASER SURFACE TREATMENT SYSTEM, and Ser. No. 10/884,547, filed on Jul. 1, 2004, entitled LASER THIN FILM POLY-SILICON ANNEALING SYSTEM, published on Jun. 30, 2005, Pub. No. US-2005-0141580; and Ser. No. 11/173,988, entitled ACTIVE BANDWIDTH CONTROL FOR A LASER, filed on Jun. 30, 2005, and to Ser. No. 11/169,203, entitled HIGH PULSE REPETITION RATE GAS DISCHARGE LASER, filed on Jun. 27, 2005, and to Ser. No. 11/095,293, entitled GAS DISCHARGE LASER OUTPUT LIGHT BEAM PARAMETER CONTROL, filed on Mar. 31, 2005, and Ser. No. 11/095,976, entitled 6 KHZ AND ABOVE GAS DISCHARGE LASER SYSTEM, filed on Mar. 31, 2005; and Ser. No. 11/201,877, filed on Aug. 11, 2005, entitled LASER THIN FILM POLY-SILICON ANNEALING OPTICAL SYSTEM, Published on Dec. 8, 2005, Pub. No. US-2005-0269300; and Ser. No. 11/254,282, entitled METHOD AND APPARATUS FOR GAS DISCHARGE LASER BANDWIDTH AND CENTER WAVELENGTH CONTROL, and Ser. No. 11/346,519, filed on Feb. 1, 2006, entitled, VERY NARROW BAND, TWO CHAMBER, HIGH REP RATE GAS DISCHARGE LASER SYSTEM, and Ser. No. 11/323,604, filed on Dec. 29, 2005 entitled MULTI-CHAMBER GAS DISCHARGE LASER BANDWIDTH CONTROL THROUGH DISCHARGE TIMING; and Ser. No. 11/363,116, entitled VERY HIGH REPETITION RATE NARROW BAND GAS DISCHARGE LASER SYSTEM, filed on Feb. 27, 2006, and Ser. No. 10/881,533, entitled METHOD AND APPARATUS FOR GAS DISCHARGE LASER OUTPUT LIGHT COHERENCY REDUCTION, filed on Jun. 30, 2004, and Ser. No. 10/847,799, entitled LASER OUTPUT LIGHT PULSE STRETCHER, filed on May 18, 2004, and U.S. patent application Ser. No. 11/394,512, entitled CONFOCAL PULSE STRETCHER, filed on Mar. 31, 2006, the disclosures of each of which are incorporated herein by reference.

FIELD OF THE SUBJECT MATTER DISCLOSED

The subject matter disclosed is related to high power gas discharge laser systems for DUV light sources, e.g., used in integrated circuit photolithography, e.g., in highly line narrowed versions, e.g., for immersion lithography and other lithography uses requiring high power and/or requiring longer component life in lower power applications, or broad band versions used for treatment of material on a workpiece substrate, e.g., laser annealing for low temperature poly-silicon processing ("LTPS"), such as thin beam sequential lateral solidification ("tbSLS"), and more particularly to a seed laser and amplification gain medium system with an improved power amplification stage providing higher gain and reduced ASE and coherency busting, e.g., for reduction in speckle.

BACKGROUND

Deep ultraviolet light sources, such as those used for integrated circuit photolithography manufacturing processes have been almost exclusively the province of excimer gas discharge lasers, particularly KrF excimer lasers at around 248 nm and followed by ArF lasers at 198 nm having been brought into production since the early 90's, with molecular fluorine $F_2$ lasers also having also been proposed at around 157 nm, but as yet not brought into production.

Immersion lithography, e.g., at 193 nm, by introducing water above the wafer allows for NA's up to 1.35 and this relaxes the k1 requirement, however, requiring higher power for exposures and potentially double patterning, which requires still more power delivered in the light from the laser light source.

Since the introduction of applicant's assignee's XLA-XXX, i.e., the XLA-100 initially, applicant's assignee's chosen solution for delivering, e.g., much higher power than with earlier lasers, while still achieving various beam quality requirements, e.g., narrower bandwidths as well as other light source requirements such as dose stability, has been a two chambered laser system comprising a seed laser pulse beam producing laser chamber, e.g., a master oscillator ("MO"), also of the gas discharge excimer variety, seeding another laser chamber with an amplifying lasing medium, also of the same excimer gas discharge variety, acting to amplify the seed beam, a power amplifier ("PA"). Other so-called master oscillator-power amplifier ("MOPA") laser systems had been known, mostly in the solid state laser art, essentially for boosting power output. Applicants' assignee came up with the concept of the utilization of seed laser chamber in which a seed laser was produced, with the view of optimizing that chamber operation for selecting/controlling desirable beam parameters, e.g., bandwidth, beam profile, beam spatial intensity distribution, pulse temporal shape, etc. and then essentially amplifying the pulse with the desirable parameters in an amplifier medium, e.g., the PA. This breakthrough by applicants' assignee was able to meet the then current demands attendant to the continually shrinking node sizes for semiconductor photolithography DUV light sources.

It is also possible to use an amplifying medium that comprises a power oscillator. The PA of applicants' assignee is optimized both for amplification and for preservation of the desirable output beam pulse parameters produced in the MO with optimized, e.g., line narrowing. An amplifier medium that is also an oscillator, a power oscillator ("PO"), has been proposed and used by applicants' assignee's competitor GigaPhoton, as evidenced in U.S. Pat. No. 6,721,344, entitled INJECTION LOCKING TYPE OR MOPA TYPE OF LASER DEVICE, issued on Apr. 13, 2004 to Nakao et al; U.S. Pat. No. 6,741,627, entitled PHOTOLITHOGRAPHIC MOLECULAR FLUORINE LASER SYSTEM, issued on May 25, 2004 to Kitatochi et al, and U.S. Pat. No. 6,839,373, entitled ULTRA-NARROWBAND FLUORINE LASER APPARATUS, issued on Jan. 4, 2005 to Takehisha et al.

Unfortunately the use of an oscillator such as with front and rear reflecting mirrors (include a partially reflecting output coupler, and input coupling, e.g., through an aperture in one of the or through, e.g., a 95% reflective rear reflector) has a number of drawbacks. The input coupling from the MO to the amplifier medium is very energy loss-prone. In the amplifier medium with such an oscillator cavity optimized beam parameters selected, e.g., in the MO chamber, may be denigrated in such an oscillator used as an amplifying medium. An unacceptable level of ASE may be produced.

Applicant's propose an architecture that can preserve the optimized beam parameters developed in an MO chamber almost to the same degree as applicants' assignee's present XLA XXX systems, while producing much higher output from the amplification medium or, alternatively give current levels of output average power with strikingly reduced CoC for the MO. Further, applicants believe that according to aspects of embodiments of the subject matter disclosed, e.g., pulse-to-pulse stability can be greatly improved.

Buczek, et al, $CO_2$ Regenerative Ring Power Amplifiers, J. App. Phys., Vol. 42, No. 8 (July 1971) relates to a unidirectional regenerative ring $CO_2$ laser with above stable (conditionally stable) operation and discusses the role of gain saturation on $CO_2$ laser performance. Nabors, et al, Injection locking of a 13-W Nd:YAG ring laser, Optics Ltrs., vol. 14, No 21 (November 1989) relates to a lamp-pumped solid-state CW ring laser injection locked by a diode-pumped solid state Nd:YAG master oscillator. The seed is input coupled into the ring laser by a half-wave plate, a Faraday rotator and a thin film polarizer forming an optical diode between the seed laser and the amplifier. Pacala, et al., A wavelength scannable XeCl oscillator-ring amplifier laser system, App. Phys. Ltrs., Vol. 40, No. 1 (January 1982); relates to a single pass excimer (XeCl) laser system seeded by a line narrowed XeCl oscillator. U.S. Pat. No. 3,530,388, issued to Buerra, et al. on Sep. 22, 1970, entitled LIGHT AMPLIFIER SYSTEM, relates to an oscillator laser seeding two single pass ring lasers in series with beam splitter input coupling to each. U.S. Pat. No. 3,566,128, issued to Amaud on Feb. 23, 1971, entitled OPTICAL COMMUNICATION ARRANGEMENT UTILIZING A MULTIMODE OPTICAL REGENERATIVE AMPLIFIER FOR PILOT FREQUENCY AMPLIFICATION, relates to an optical communication system: with a ring amplifier. U.S. Pat. No. 3,646,468, issued to Buczek, et al. on Feb. 29, 1972 relates to a laser system with a low power oscillator, a high power oscillator and a resonance adjustment means. U.S. Pat. No. 3,646,469, issued to Buczek, et al. on Feb. 29, 1097, entitled TRAVELLING WAVE REGENERATIVE LASER AMPLIFIER, relates to a laser system like that of the '468 Buczek patent with a means for locking the resonant frequency of the amplifier to frequency of the output of the oscillator. U.S. Pat. No. 3,969,685, issued to Chenausky on Jul. 13, 1976, entitled ENHANCED RADIATION COUPLING FROM UNSTABLE LASER RESONATORS relates to coupling energy from a gain medium in an unstable resonator to provide a large fraction of the energy in the central lobe of the far field. U.S. Pat. No. 4,107,628, issued tot Hill, et al., on Aug. 15, 1978, entitled CW BRILLOUIN RING LASER, relates to a Brillouin scattering ring laser, with an acousto-optical element modulating the scattering frequency. U.S. Pat. No. 4,135,787, issued to McLafferty on Jan. 23, 1979, entitled UNSTABLE RING RESONATOR WITH CYLINDRICAL MIRRORS, relates to an unstable ring resonator with intermediate spatial filters. U.S. Pat. No. 4,229,106, issued to Domschner on Oct. 21, 1980, entitled ELECTROMAGNETIC WAVE RING GENERATOR, relates to a ring laser resonator with a means to spatially rotate the electronic field distribution of laser waves resonant therein, e.g., to enable the waves to resonate with opposite polarization. U.S. Pat. No. 4,239,341 issued to Carson on Dec. 16, 1980, entitled UNSTABLE OPTICAL RESONATORS WITH TILTED SPHERICAL MIRRORS, relates to the use of tilted spherical mirrors in an unstable resonator to achieve asymmetric magnification to get "simultaneous confocality" and obviate the need for non-spherical mirrors. U.S. Pat. No. 4,247,831 issued to Lindop on Jan. 27, 1981, entitled RING LASERS, relates to a resonant cavity with at least 1 parallel sided isotropic refracting devices, e.g., prisms, with parallel sides at an oblique angle to part of light path that intersects said sides, along with a means to apply oscillating translational motion to said refracting devices. U.S. Pat. No. 4,268,800, issued to Johnston et al. on May 19, 1981, entitled, VERTEX-MOUNTED TIPPING BREWSTER PLATE FOR A RING LASER, relates to a tipping Brewster plate to fine tune a ring laser located close to a flat rear mirror A acting as one of the reflecting optics of the ring laser cavity. U.S. Pat. No. 4,499,582, entitled RING LASER, issued to Karning et al. on Feb. 5, 1980, relates to a ring laser system with a folded path pat two separate pairs of electrodes with a partially reflective input coupler at a given wavelength. U.S. Pat. No. 5,097,478, issued to Verdiel, et al. on Mar. 17, 1992, entitled RING CAVITY LASER DEVICE, relates to a ring cavity which uses a beam from a master laser to control or lock the operation of a slave laser located in the ring cavity. It uses a non-linear medium in the cavity to avoid the need of insulators, e.g., for stabilizing to suppress oscillations, e.g., as discussed in Col 4 lines 9-18. Nabekawa et al., 50-W average power, 200-Hz repetition rate, 480-fs KrF excimer laser with gated gain amplification, CLEO (2001), p. 96, e.g., as discussed with respect to FIG. 1, relates to a multipass amplifier laser having a solid state seed that is frequency multiplied to get to about 248 nm for KrF excimer amplification. U.S. Pat. No. 6,373,869, issued to Jacob on Apr. 16, 2002, entitled SYSTEM AND METHOD FOR GENERATING COHERENT RADIATION AT ULTRAVIOLET WAVELENGTHS, relates to using an Nd:YAG source plus an optical parametric oscillator and a frequency doubler and mixer to provide the seed to a multipass KrF amplifier. U.S. Pat. No. 6,901,084, issued to Pask on May 31, 2005, entitled STABLE SOLID STATE RAMAN LASER AND A METHOD OF OPERATING SAME, relates to a solid-state laser system with a Raman scattering mechanism in the laser system oscillator cavity to frequency shift the output wavelength. U.S. Pat. No. 6,940,880, issued to Butterworth, et al. on Sep. 6, 2005, entitled OPTICALLY PUMPED SEMICONDUCTOR LASER, relates to a optically pumped semiconductor laser resonance cavities forming part of a ring resonator, e.g., with a non linear crystal located in the ring, including, as discussed, e.g., with respect to FIGS. 1,2, 3, 5 & 6, having a bow-tie configuration. United States Published Patent Application No. 2004/0202220, published on Oct. 14, 2004, with inventors Hua et al, entitled MASTER OSCILLATOR—POWER AMPLIFIER EXCIMER LASER SYSTEM, relates to an excimer laser system, e.g., with in a MOPA configuration, with a set of reflective optics to redirect at least a portion of the oscillator beam transmitted through the PA back thru PA ion the opposite direction. United States Published Patent Application No. 2005/0002425, published on Jan. 1, 2003, with inventors Govorkov et al, entitled MASTER-OSCILLATOR POWER-AMPLIFIER (MOPA) EXCIMER OR MOLECULAR FLUORINE LASER SYSTEM WITH LONG OPTICS LIFETIME, relates to, e.g., a MOPA with a pulse extender and using a beamsplitting prism in the pulse extender, a housing enclosing the (MO+PA) and reflective optics, with the pulse extender mounted thereon, and reflective optics forming a delay line around the PA. United States Published application No. 2006/0007978, published on Jan. 12, 2006, with inventors Govokov, et al., entitled BANDWIDTH-LIMITED AND LONG PULSE MASTER OSCILLATOR POWER OSCILLATOR LASER SYSTEM, relates to a ring oscillator with a prism to restrict bandwidth within the oscillator.

U.S. Pat. No. 6,590,922 issued to Onkels et al. on Jul. 8, 2003, entitled INJECTION SEEDED F2 LASER WITH LINE SELECTION AND DISCRIMINATION discloses reverse injection of and $F_2$ laser undesired radiation centered around one wavelength through a single pass power amplifier to selectively amplify a desired portion of the $F_2$ spectrum for line selection of the desired portion of the $F_2$ spectrum in a molecular fluorine gas discharge laser. in F2 laser.

U.S. Pat. No. 6,904,073 issued to Yager, et al. on Jun. 7, 2005, entitled HIGH POWER DEEP ULTRAVIOLET LASER WITH LONG LIFE OPTICS, discloses intracavity fluorine containing crystal optics exposed to lasing gas mixtures containing fluorine for protection of the optic.

Published International application WO 97/08792, published on Mar. 6, 1997 discloses an amplifier with an intracavity optical system that has an optical path that passes each pass of a sixteen pass through the same intersection point at which is directed a pumping source to amplify the light passing through the intersection point.

R. Paschotta, Regenerative amplifiers, found at http://www.rp-photonics.com/regenerative_amplifiers.html (2006) discusses the fact that a regenerative amplifier, may be considered to be an optical amplifier with a laser cavity in which pulses do a certain number of round trips, e.g., in order to achieve strong amplification of short optical pulses. Multiple passes through the gain medium, e.g., a solid state or gaseous lasing medium may be achieved, e.g., by placing the gain medium in an optical cavity, together with an optical switch, e.g., an electro-optic modulator and/or a polarizer. The gain medium may be pumped for some time, so that it accumulates some energy after which, an initial pulse may be injected into the cavity through a port which is opened for a short time (shorter than the round-trip time), e.g., with the electro-optic (or sometimes acousto-optic) switch. Thereafter the pulse can undergo many (possibly hundreds) of cavity round trips, being amplified to a high energy level, often referred to as oscillation. The electro-optic switch can then be used again to release the pulse from the cavity. Alternatively, the number of oscillations may be determined by using a partially reflective output coupler that reflects some portion, e.g., around 10%-20% of the light generated in the cavity back into the cavity until the amount of light generated by stimulated emission in the lasing medium is such that a useful pulse of energy passes through the output coupler during each respective initiation and maintenance of an excited medium, e.g., in a pulsed laser system. Uppal et al, Performance of a general asymmetric Nd: glass ring laser, Applied Optics, Vol. 25, No. 1 (January 1986) discusses an Nd:glass ring laser. Fork, et al. Amplification of femptosecond optical pulses using a double confocal resonator, Optical Letters, Vol. 14, No. 19 (October 1989) discloses a seed laser/power amplifier system with multiple passes through a gain medium in a ring configuration, which Fork et al. indicates can be "converted into a closed regenerative multi pass amplifier by small reorientations of two of the four mirrors that compose the resonator [and providing] additional means . . . for introducing and extracting the pulse from the closed regenerator. This reference refers to the open-ended amplifier portion with fixed number of passes through the amplifier portion (fixed by the optics an, e.g., how long it takes for the beam to walk off of the lens and exit the amplifier portion as a "resonator". As used herein the term resonator and other related terms, e.g., cavity, oscillation, output coupler are used to refer, specifically to either a master oscillator or amplifier portion, the power oscillator, as lasing that occurs by oscillation within the cavity until sufficient pulse intensity exists for a useful pulse to emerge from the partially reflective output coupler as a laser output pulse. This depends on the optical properties of the laser cavity, e.g., the size of the cavity and the reflectivity of the output coupler and not simply on the number of reflections that direct the seed laser input through the gain medium a fixed number of times, e.g., a one pass, two pass, etc. power amplifier, or six or so times in the embodiment disclosed in Fork, et al. Mitsubishi published Japanese Patent Application Ser. No. JP11-025890, filed on Feb. 3, 1999, published on Aug. 11, 2000, Publication No. 2000223408, entitled SEMICONDUCTOR MANUFACTURING DEVICE, AND MANUFACTURING OF SEMICONDUCTOR DEVICE, disclosed a solid state seed laser and an injection locked power amplifier with a phase delay homogenizer, e.g., a grism or grism-like optic between the master oscillator and amplifier. United states Published application 20060171439, published on Aug. 3, 2006, entitled MASTER OSCILLATOR—POWER AMPLIFIER EXCI- MER LASER SYSTEM, a divisional of an earlier published application 20040202220, discloses as master oscillator/ power amplifier laser system with an optical delay path intermediate the master oscillator and power amplifier which creates extended pulses from the input pulses with overlapping daughter pulses.

Partlo et al, Diffuser speckle model: application to multiple moving diffusers, Appl. Opt. 32, 3009-3014 (1993), discusses aspects of speckle reduction. U.S. Pat. No. 5,233,460, entitled METHOD AND MEANS FOR REDUCING SPECKLE IN COHERENT LASER PULSES, issued to Partlo et al. on Aug. 3, 1993 discusses misaligned optical delay paths for coherence busting on the output of gas discharge laser systems such as excimer laser systems.

The power efficiency of a regenerative amplifier, e.g., using a switching element, can be severely reduced by the effect of intracavity losses (particularly in the electro-optic switch). Also, the reflectivity of a partially reflective output coupler can affect both intracavity losses and the duration of the output pulse, etc. The sensitivity to such losses can be particularly high in cases with low gain, because this increases the number of required cavity round trips to achieve a certain overall amplification factor. A possible alternative to a regenerative amplifier is a multipass amplifier, such as those used in applicants' assignee's XLA model laser systems mentioned above, where multiple passes (with, e.g., a slightly different propagation direction on each pass) can be arranged with a set of mirrors. This approach does not require a fast modulator, but becomes complicated (and hard to align) if the number of passes through the gain medium is high.

An output coupler is generally understood in the art to mean a partially reflective optic that provides feedback into the oscillation cavity of the laser and also passes energy out of the resonance cavity of the laser.

In regard to the need for improvement of Cost Of Consumables, e.g., for ArF excimer lasers, e.g., for photolithography light source use, KrF CoC has long been dominated by chamber lifetime, e.g., due to the robustness of the optics at the higher 248 nm wavelength for KrF. Recent advances in Cymer ArF optical components and designs have led to significant increases in ArF optical lifetimes, e.g., ArF grating life improvements developed for the Cymer NL-7000A, Low intensity on LNMs, e.g., in two stage XLA systems. ArF etalon material improvements have contributed to longer life for ArF wavemeters, stabilization modules, LAMs, SAMs, and BAMs. In addition KrF chamber lifetime has been significantly increased with Cymer ELS-7000 and ELS-7010 products, e.g., through the use of proprietary electrode technology. However, longer life electrode technology requires specific operating parameters, such as are met in ELS-7000 and ELS-7010 KrF chambers, XLA-200 and XLA-300 PA chambers. These parameters, however, are not able to be utilized, e.g., in any of Cymer's ArF XLA MO chambers because of the overall output power requirements of the system. Applicants propose ways to alleviate this detriment to cost of consumables in, e.g., the ArF dual chamber master oscillator/amplifier products, used, e.g., for integrated circuit manufacturing photolithography.

As used herein the term resonator and other related terms, e.g., cavity, oscillation, output coupler are used to refer, specifically to either a master oscillator or amplifier portion, a power oscillator, as lasing that occurs by oscillation within the cavity until sufficient pulse intensity exists for a useful pulse to emerge from the partially reflective output coupler as a laser output pulse. This depends on the optical properties of the laser cavity, e.g., the size of the cavity and the reflectivity of the output coupler and not simply on the number of reflections that direct the seed laser input through the gain medium a fixed number of times, e.g., a one pass, two pass, etc. power amplifier, or six or so times in the embodiment disclosed in Fork, et al. and not on the operation of some optical switch in the cavity. In some of the literature an oscillator in which the round trip through the amplification gain medium, e.g., around a loop in a bow-tie or racetrack loop, is not an integer number of wavelengths, may be referred to as an amplifier, e.g., a power amplifier, while also constituting an oscillator laser. The term power amplification stage and more specifically ring power amplification stage is intended herein to cover both of these versions of a power oscillator, i.e., whether the path through the gain medium is an integer multiple of the laser system nominal center wavelengths or not and whether the literature, or some of it, would refer to such an "oscillator" as a power amplifier or not. The closed loop path or oscillation loop as used herein refers to the path through the amplification gain medium, e.g., an excimer or similar gas discharge laser amplification stage, around which the seed laser pulse light oscillates in the amplification stage.

SUMMARY OF THE SUBJECT MATTER DISCLOSED

Those skilled in the art will understand that there is disclosed an apparatus and method which may comprise a seed laser oscillator producing an output comprising a seed laser output light beam of pulses which may comprise: a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, which may comprise: a ring power amplification stage; a seed injection mechanism which may comprise: a first partially reflecting input output coupler through which the seed laser oscillator output light beam is injected into the ring power amplification stage, the partially reflecting optical element transmitting the seed laser output laser pulse beam onto a maximally reflective mirror oriented to reflect the seed laser output beam into the ring power amplification stage; the first partially reflecting optical element may comprise a beam splitter; the second optical element may comprise a mirror selected for maximal reflection of the nominal center wavelength of the seed oscillator laser output pulses. The beam splitter may comprise a surface of incidence coated with an anti-reflectivity coating; the mirror may comprise a multilayer reflectivity coating. The seed injection mechanism may comprise a single piece optical element comprising a partially reflecting input surface of incidence upon which is incident the seed oscillator laser output light pulse beam, and further which may comprise a totally internally reflective surface upon which is incident a transmitted portion of the seed oscillator output laser light pulse beam transmitted through the partially reflecting surface, positioned to reflect the seed oscillator output laser light pulse beam to a surface of exit of the single piece optical element positioned such that the exit of the transmitted portion of the seed oscillator output laser light pulse beam from the single piece optical element is generally orthogonally to the seed oscillator laser output light pulse beam at the partially reflecting input surface of incidence and into the ring power amplification stage. The surface of exit of the transmitted portion of the seed oscillator output laser light pulse further may comprise an output surface of incidence of an oscillator cavity output coupler for the ring power amplification stage. The single piece optical element may comprise an uncoated optical element and/or an optic having a rectangular cross-section, which may comprise a truncated prism or a prism. The apparatus and method may comprise a line narrowed pulsed excimer or molecular fluorine gas discharge laser system which may comprise a seed laser oscillator producing an output comprising a seed laser output light beam of pulses which may comprise: a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, which may comprise: a ring power amplification stage; a seed injection mechanism comprising the seed injection mechanism comprising an edge coupler or an on axis partially reflective optical element or a Brewster's angle wedge or a switching coupler, which may comprise an optical switching element within the amplifier gain medium cavity or a polarization coupler or a Q-switch or a Faraday rotator. A beam expander may be included within the within the ring power amplification stage chamber. The seed injection mechanism may be enclosed within an enclosure of the ring power amplification stage chamber. A beam returner may be enclosed within an enclosure of the ring power amplification stage chamber. The beam expander may comprise at least one prism, which may comprise an uncoated optical element. The at least one prism may comprise a two prism beam expander, which may comprise beam expansion and dispersion prism optical elements. The first prism of the two prism beam expander may comprise a split prism and the second prism of the two prism beam expander may comprise a one piece prism.

BRIEF DESCRIPTION OF THE DRAWINGS

FIG. 13 illustrates schematically input coupling useful according to aspects of an embodiment of the subject matter disclosed;

FIG. 14 illustrates schematically input coupling useful according to aspects of an embodiment of the subject matter disclosed;

FIG. 15 illustrates schematically a top view of aspects of an embodiment of an input coupling mechanism useful according to aspects of an embodiment of the subject matter disclosed;

FIG. 16 illustrates schematically a side view of the input coupling mechanism of FIG. 15 useful according to aspects of an embodiment of the subject matter disclosed;

DETAILED DESCRIPTION

Figure 1:
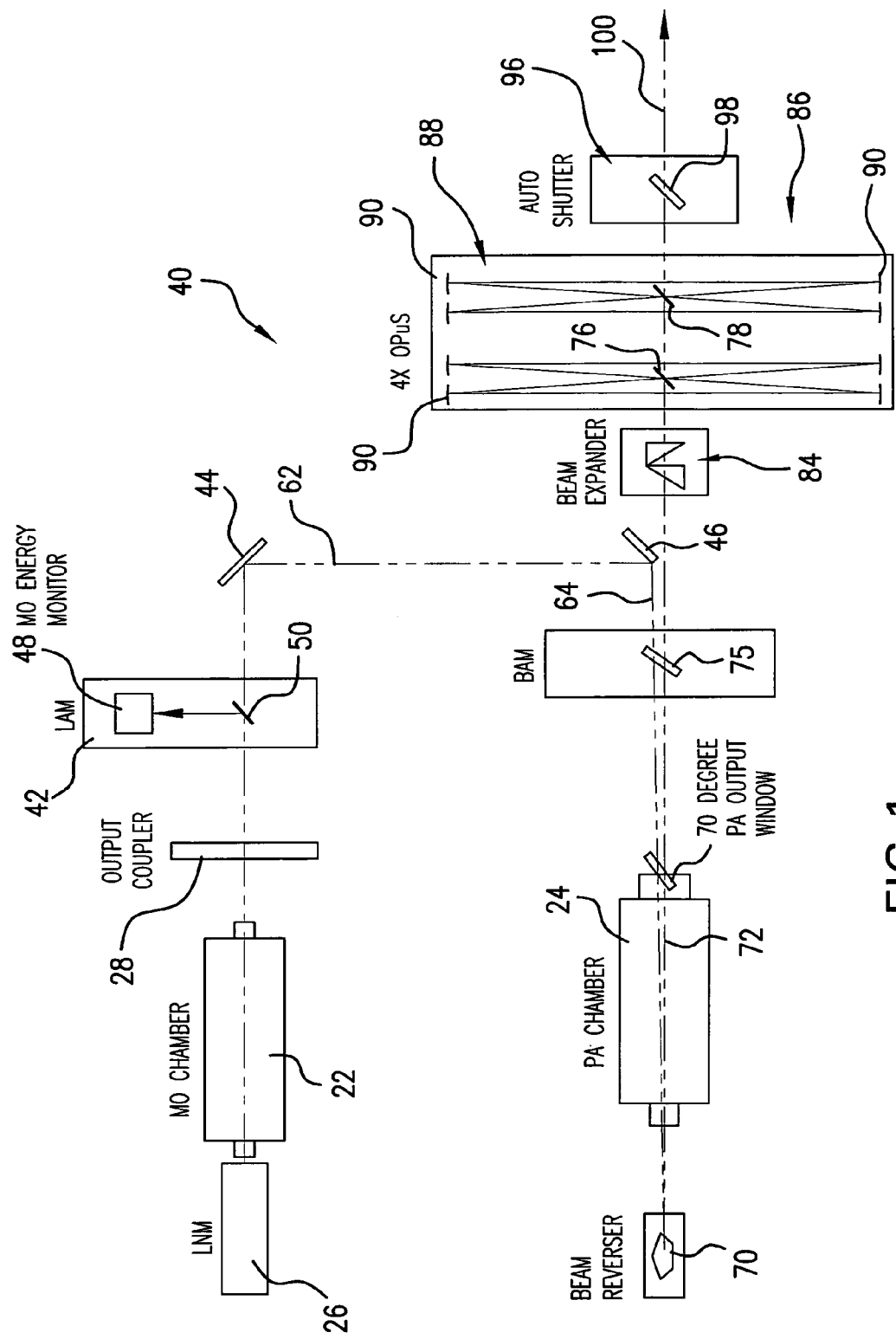
FIG. 1 shows as known MOPA configured multi-chamber laser system.

According to aspects of an embodiment of the subject matter disclosed a gain amplification medium suitable for use with, e.g., an excimer or molecular fluorine gas discharge seed oscillator laser in a multi-chamber (multi-portion) oscillator/amplifier configuration, this could be, e.g., a master oscillator power gain amplification configuration may take advantage of a improved seed laser coupling arrangements, fundamentally designed to insert seed laser, e.g., master oscillator seed output laser light pulse beam pulses, into an amplifying gain medium, generally with little loss and with protection against amplifier oscillation and/or ASE returning to the master oscillator while the master oscillator laser medium is excited, such could interfere with the proper operation of the master oscillator, e.g., in conjunction with the line narrowing module producing the appropriately narrowed seed oscillator output laser light pulse beam pulse bandwidth.

According to aspects of an embodiment of the subject matter disclosed, however, a preferred configuration may comprise, e.g., a ring cavity, e.g., a power oscillator or Power Ring Oscillator ("PRO"). Such a configuration has been determined by applicants to be a very effective solution to going to higher power laser operation in a line narrowed multi-portion (seed laser-amplifier) arrangement, particularly for gas discharge seed laser to identical gas discharge amplifier laser multi-portion laser systems. Such a laser system could be similar in operation to applicants' employers' XLA series lasers, though with a power ring amplifier stage. Improvement in CoC may be attained according to a aspects of an embodiment of the subject matter disclosed. Also, however, a power ring amplification stage may be useful for other applications, including with seed lasers of other than the same type of gas discharge laser, e.g., a solid state seed, e.g., matched to the lasing wavelength of an excimer or molecular fluorine amplifier, e.g., by frequency shifting and/or frequency multiplication. In such systems pulse trimming may be useful for ultimate control of laser system output laser light pulse beam pulse parameters, e.g., bandwidth, bandwidth stability, output pulse energy, output pulse energy stability and the like.

According to aspects of an embodiment of the subject matter disclosed a ring cavity could use, e.g., such a beamsplitter, e.g., with P-polarization instead of the normally used S-polarization, since applicants have found that the reflectivity of such an OPuS beamsplitter changes from 60% for S-polarization to about 25% for P-polarization.

Thus, according to aspects of an embodiment of the subject matter disclosed a ring cavity PO may be constructed, e.g., with a 24% output coupler, e.g., comprising an existing OPuS beamsplitter.

According to aspects of an embodiment of the subject matter disclosed applicants propose to re-arrange, e.g., an existing XLA product, e.g., with an excimer-based MO, from MOPA to MOPO (power oscillator), utilizing a power amplification stage, such as a ring power amplification stage, in accordance with aspects of an embodiment of the subject matter disclosed. Such a system can (1) improve energy stability, e.g., by operating the amplification stage at saturation, or effectively saturation, pulse to pulse, thereby more accurately insuring pulse to pulse energy stability, (2) achieve longer LNM life, e.g., by reducing the required MO output level to the μJ level, e.g., by increasing the amplification in the amplification stage (over applicants' assignees' traditional MOPA configuration) by approximately ten fold, and (3) and exploit the ability to operate the MO at less than 1 mJ in other ways beneficial to overall laser system operating life.

The advantages of the multi-chambered laser system according to aspects of an embodiment of the subject matter disclosed enable meeting the above discussed requirements for, e.g., higher power, better pulse energy stability, better bandwidth control and lower achievable bandwidth, higher repetition rates and lower cost of operation. For example, the lower MO output energy requirement can, e.g., allow for even better control of pulse parameters, e.g., bandwidth in the MO, with less energy loss in the MO, e.g., during line narrowing, and also lower the thermal impact, e.g., transients, and lower optical damage to the line narrowing optics, while maintaining or even increasing output power. Further according to aspects of an embodiment of the subject matter disclosed, e.g., through maintaining currently known MO pulse energy output levels, very high (e.g., 10×) increases in currently available laser system output light average power may be attained. This may be beneficial both for line narrowed systems and for broad band systems, e.g., XeCl multi-chamber laser systems used, e.g., for annealing amorphous silicon on substrates, e.g., in LTPS processes, e.g., for the manufacture of crystallized substrates for the production of, e.g., thin film transistors.

Turning now to FIG. 1 there is shown schematically and partly in block diagram form a more or less typical MOPA laser system 20, such as applicants' assignees XLA multi-chamber MOPA laser systems. The laser system 20 may include, e.g., an oscillator seed laser chamber 22, and an amplifier gain medium laser chamber 24, e.g., a multi-pass power amplifier ("PA"). The MO 22 may have associated with it, e.g., for applications such as semiconductor manufacturing photolithography, a line narrowing module ("LNM") 26, or if desired to be operated in broadband mode, e.g., for application such as LTPS, it may not have line narrowing. An output coupler 28, e.g., a partially reflective mirror, e.g., with a selected reflectivity for the applicable nominal center wavelength, e.g., about 351 for XeF laser oscillators, 248 nm for KrF laser oscillators, 193 nm for ArF laser oscillators and 157 for molecular fluorine laser oscillators, along with the rear end reflection provided by the LNM 26 (or a maximally reflective mirror for the given nominal center wavelength, not shown, substituted for the LNM 26 in the case of broad band operation), may serve to form the laser 20 oscillator cavity.

Relay optics 40, e.g., including a turning mirror 44 and a turning mirror 46, may serve to steer the seed oscillation laser 20 output laser light pulse beam 62 pulses exiting a line center (center wavelength) analysis module ("LAM") 42 along a light path (optical axis) 60 to the input of the amplifier module lasing chamber 24. The LAM, in addition to center wavelength monitoring equipment (not shown) may include an MO energy monitor 48, which may be provided with a small portion of the laser output light pulse beam from the MO chamber 22 for metrology purposes, e.g., for nominal center wavelength and energy detection, by a beam splitter 50 inside the LAM 42. The turning mirror 44 may provide the master oscillator 22 output laser light pulse beam 62 pulses to the turning mirror 46 along an optical path beam path, which may reflect the beam 62 into the amplifier chamber 24 as a beam 64.

In the case of the system 20 of FIG. 1 the gain amplifier 24 is set up as a power amplifier, i.e., the light received from the MO, the MO seed output laser light pulse beam pulses passes through the gain amplification medium a fixed number of times, e.g., determined by the optics, including the turning mirror 46, set up as illustrated schematically in FIG. 1 as an edge coupling optic and a beam returner (reverser) optic 70, e.g., a retro-reflecting mirror, discussed in more detail below, along a beam path 72, exiting the laser gain medium through a window 80, which may be, e.g., set at an angle, e.g., around 70° to the exiting beam path 72 in order to optimize the transmissivity of the exiting light and the thermal loading for the given nominal center wavelength and the material of the window 80, e.g., CaF$_2$ for shorter wavelengths such as the nominal center wavelength for an ArF laser system. The exit light 100 may also pass through a beam splitter 74 within a bandwidth analysis module ("BAM"). The laser system output beam 100 may also pass through a first beam splitter 76 and a second beam splitter 78 within a pulse stretcher 86, e.g., an Optical Pulse Stretcher ("OPuS"), such as are included with many of applicants' assignees' laser systems discussed above as a 4× pulse stretcher, e.g., increasing the T$_{is}$ of the laser system 20 output laser light pulse beam 100 pulses exiting the system as beam 100 from about 17 ns to about 40 ns and also from about 17 nm in length to about 40 nm in length, by directing the beam 100 into delay path 88, as is more fully described in, e.g., U.S. Pat. No. 6,928,093, entitled LONG DELAY AND HIGH TIS PULSE STRETCHER, issued to Webb et al. on Aug. 9, 2005 referenced above.

Also in the path of the laser system 20 output laser light pulse beam 100 pulses may be, e.g., a beam expander 84, e.g., to decrease the energy density on downstream optics, including the OPuS 86 beam splitters 76, 78 and optical delay ling mirrors 90 and optics, e.g., in the scanner (not shown) utilizing the laser system 20 output laser light pulse beam 100 pulses. The laser system 20 may also include a shutter 96, including, e.g., a shutter beam splitter 98, e.g., taking off a portion of the laser system 20 output laser light pulse beam 100 pulses for energy measurement in an output energy monitor (not shown) in the shutter 96.

OPuS 86

This existing XLA MOPA configuration, shown in FIG. 1 is illustrated schematically further in the sense that the illustration switches between the horizontal and vertical axis in several places in order to make this schematic illustration simpler and easier to understand. None of the concepts described here are impacted by properly drawing the horizontal and vertical axis of the light paths.

Figure 2:
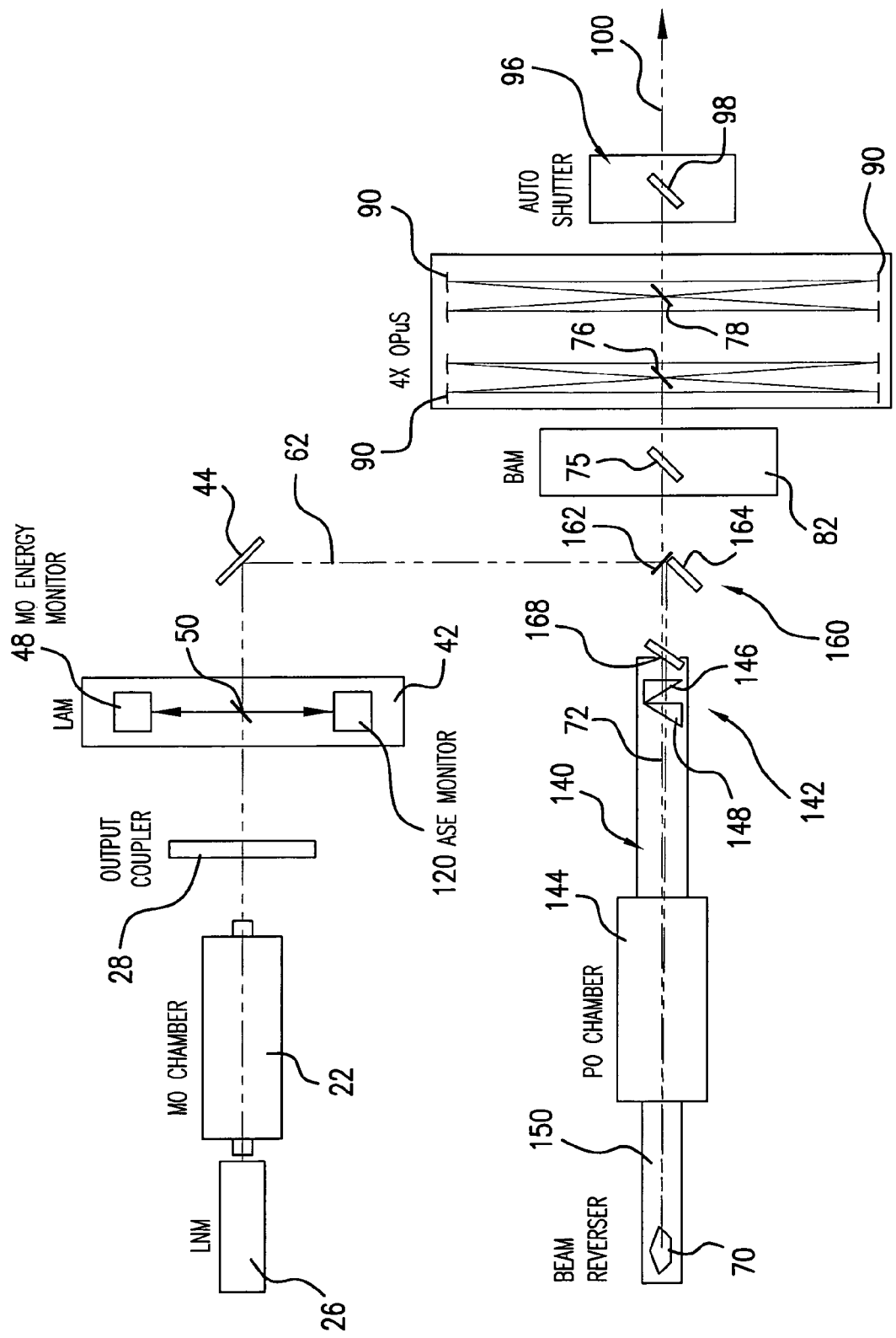
FIG. 2 shows aspects of an embodiment of the claimed subject matter disclosed.

Turning to FIG. 2 there is illustrated a conversion from a MOPA configuration to a master oscillator power oscillation amplification stage configuration according to aspects of an embodiment of the subject matter disclosed, e.g., including a power ring amplification stage, e.g., with a ring cavity power oscillator (also known as a ring cavity regenerative amplifier) formed between the beam reverser 70 and the lower turning mirror 44, replaced with, e.g., an injection seeding mechanism 160 according to aspects of an embodiment of the subject matter disclosed. The BAM as shown in FIG. 1 may be moved or its functionality included within the shutter 96.

Figure 20:
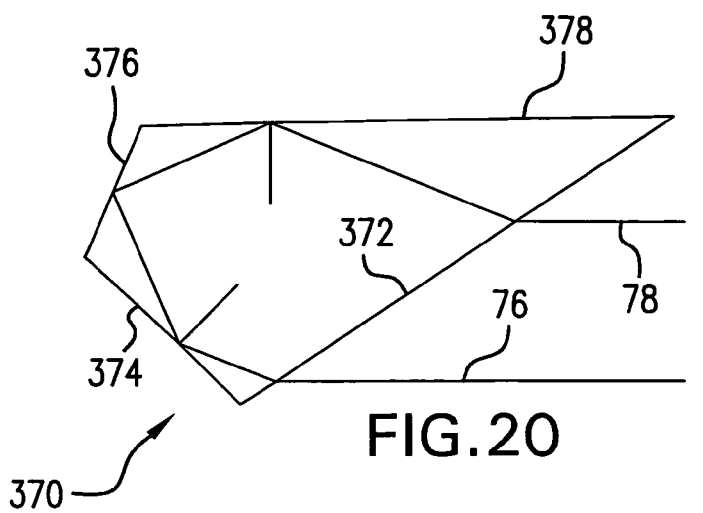
FIG. 20 illustrates schematically illustrates in cross section aspects of an embodiment of a beam returner according to aspects of an embodiment of the subject matter disclosed.
Figure 21:
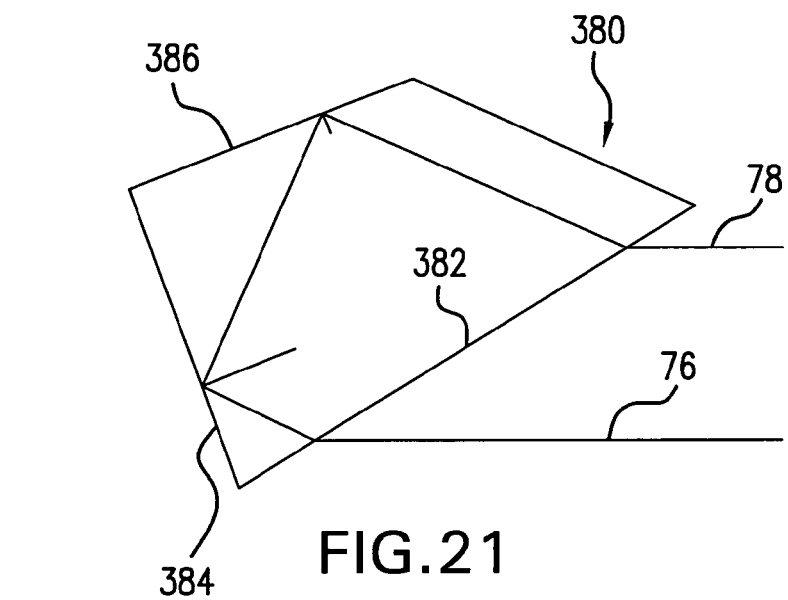
FIG. 21 illustrates schematically illustrates in cross section aspects of an embodiment of a beam returner according to aspects of an embodiment of the subject matter disclosed.
Figure 22:
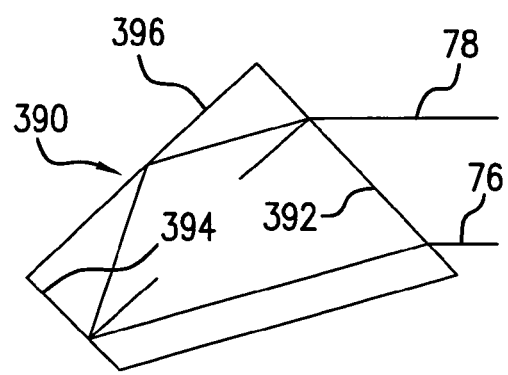
FIG. 22 illustrates schematically illustrates in cross section aspects of an embodiment of a beam returner according to aspects of an embodiment of the subject matter disclosed.

According to aspects of an embodiment of the subject matter disclosed may include, e.g., placing the a beam expander 142 comprising, e.g., first and second beam expanding and dispersing prisms 146, 148 inside of an entrance window and beam expander housing 140 which may be affixed to the gain medium chamber 144 by a suitable means, e.g., welding or bolting with suitable sealing mechanisms. These optics 146, 148 may be placed inside the ring cavity formed between the orthogonal seed injection mechanism 160 input/output coupling partially reflecting mirror 162 and the beam returner 70, e.g., in order to reduce the energy density on the maximum reflector forming the beam returner 70, e.g., as illustrated in FIGS. 20-22, which may be composed of, e.g., CaF$_2$, e.g., a beam splitter of the type currently used in applicants' assignee's OPuSs, and coated with a coating that, e.g., reflects 20% of the incident light, that makes up a portion 162 of the seed injection mechanism 160 of the ring power amplification stage cavity discussed in more detail below. The beam reverser 70 may also be moved to inside the cavity gain medium cavity chamber 144 with the attachment of a housing 150 similar to that of housing 140.

Use of protective coatings on this optic 162 may be eliminated due, e.g., to the much lower energy output of the MO output laser light pulse beam pulses according to aspects of an embodiment of the subject matter disclosed. The beam expander optics 146, 148 and beam returner/reverser 70, due to their makeup including a fluorine containing crystal and their exposure to fluorine in the lasing medium gas in the chamber 144 and housings 140, 150 may be protected from optical damage. The AMPLIFICATION STAGE chamber window 168 similarly constructed, e.g., of a fluorine containing crystal, e.g., CaF$_2$, need not have a protective coating on its face exposed to the highest energy density, facing the ring power oscillator oscillation cavity, due in part to its beam expansion in the beam expanded 14Z in the cavity and also to using around a 45° angle, e.g., a 47 degree orientation.

According to aspects of an embodiment of the subject matter disclosed a ring power oscillator cavity, e.g., as illustrated by way of example in FIG. 2, e.g., with beam expansion on the output coupler side of the chamber 144 and with the beam expansion prisms 146, 148 oriented to produce a net dispersion, has a number of notable advantages, including, e.g., making very efficient use of seed energy, eliminating the need for protective coatings for high power and very short nominal center wavelength, especially at 193 nm and below, elimination of a rear window on the laser chamber 144, dispersion in the cavity, which can, e.g., help to decrease the ASE ratio, and acceptable energy density on the optics, e.g., forming the output coupler portion 162 of the) seed injection mechanism and the maximally reflective mirror ("Rmax") portion 164 of the seed injection mechanism, which may or may not be coated as needed, e.g., as is done in applicants' assignee's OPuSs on existing laser systems (beam splitters 76, 78 and mirrors 90). In addition, the arrangement can, e.g., perform the needed beam expansion function prior to the laser system output laser light pulse beam 100 entering the OPuS 86, and the chamber 144 with additions 140 and 150 can easily be created from applicant's assignee's existing chambers, e.g., XLA model chambers, e.g., by adding two "snouts" 140, 150, e.g., in place of existing window mounting assemblies. This is shown, e.g., in more detail partially schematically FIG. in 23.

Further, all optics inside the chamber, e.g., including the snouts 140, 150 can be, e.g., further removed from the source of chamber dust. The configuration can also be made to fit, e.g., within a present XLA optics bay.

Figure 12:
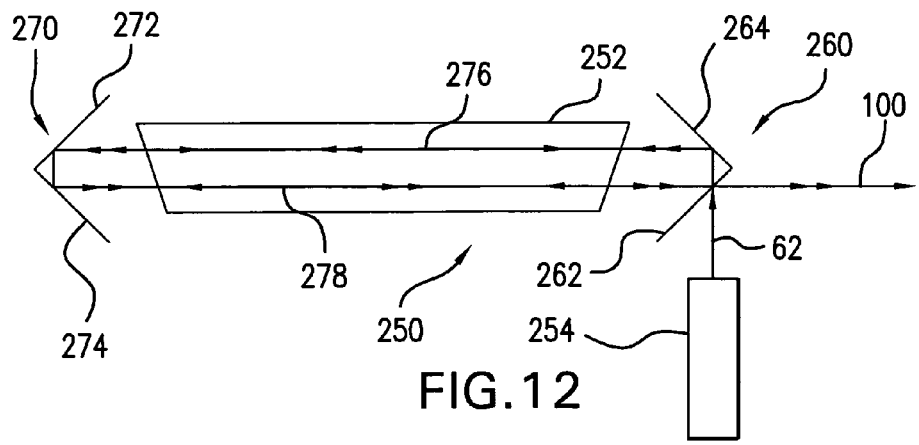
FIG. 12 illustrates schematically input coupling useful according to aspects of an embodiment of the subject matter disclosed.

As explained elsewhere, the ring cavity, e.g., as shown in FIGS. 12 and 13, baffles may also be used with a relatively long round trip time, e.g., about 7 ns to traverse, e.g., from the input/output coupler beam splitter 262 to the beam reverser 270 and back to the beam splitter 262. The ring power amplification stage can allow, e.g., the use of much less energy from the MO; approximately 100 uJ instead of the present value of about 1 mJ. This approximate 10 times or more reduction in MO energy output requirement according to aspects of an embodiment of the subject matter disclosed, can lead to, e.g., a 10 times increase in LNM lifetime, based on current LNM lifetime models utilized by applicants' assignee. Applicants' assignee has determined at least through experimentation and simulation that as little as 1-10 µJ can effectively seed the power ring amplification stage to produce upwards of 18 or so mJ output from the amplification stage. Also, of course, especially in broad band embodiments, but also in line narrowed embodiments, according to aspects of an embodiment of the subject matter disclosed using the more typical 1-3 mJ MO output greatly increases the average power out of the amplification stage over that of, e.g., current XLA-XXX laser systems.

In addition, such small MO energy would likely allow use of a low MO chamber pressure with a number of longer chamber life benefits.

Rather than having to contemplate ways to simply survive high raw power, e.g., in the 200 W range, applicants, according to aspects of an embodiment of the subject matter disclosed contemplate being able to instead focus on bettering energy stability, pointing stability, profile stability, and ASE stability of contemplated configuration while operating at full repetition rate, e.g., between 4 kHz and 6 kHz and even above.

Figure 3:
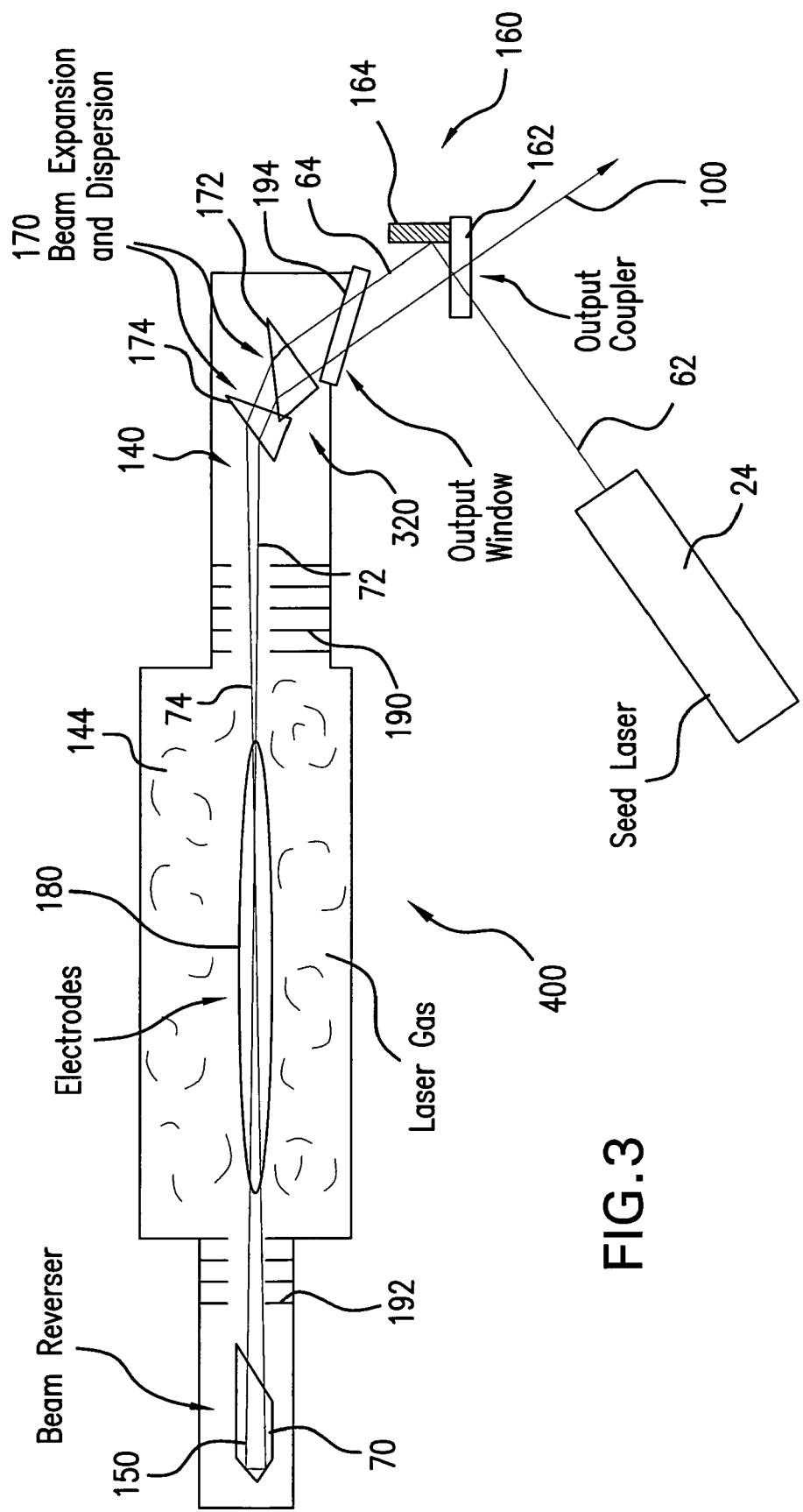
FIG. 3 shows aspects of an embodiment of the claimed subject matter disclosed.

Turning now to FIG. 3 there is shown illustratively and partly schematically and in block diagram form a ring power amplification stage laser system 400, which in addition to the elements shown in FIG. 2 may include, e.g., an injection seeding coupler mechanism 160 that is aligned with a chamber input/output window 94 and with beam expansion and dispersion optic 170, e.g., comprising beam expanding and dispersing prisms 172 and 174, which can, e.g., contract and steer and disperse the beam 64 to one path 74 to the beam reverser 70 in chamber extension 150 and back to the input/output coupler partially reflective mirror 162. Baffles 190 and 192, respectively may protect the optics in the rear snout 150 and the front snout 140, form, e.g., dust circulating within the chamber 144.

Figure 4:
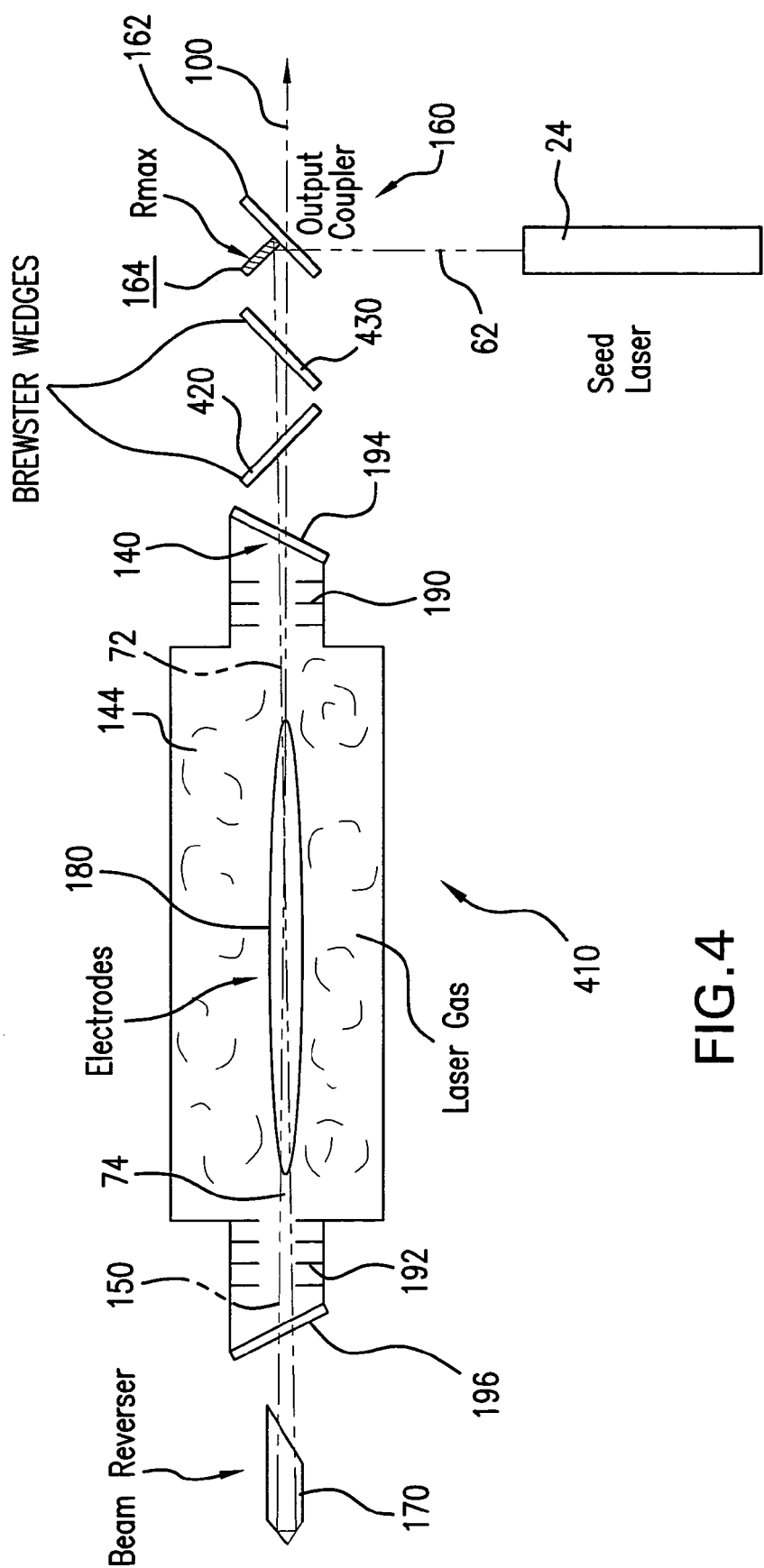
FIG. 4 shows aspects of an embodiment of the claimed subject matter disclosed.

In FIG. 4 a similar system A10, according to aspects of an embodiment of the subject matter disclosed, may include, e.g., the beam returner/reverser 170 outside of the chamber 14A, which may incorporate modified snouts 140, 150, e.g., to protect, respectively, front input/output window 194 and rear window 196 from circulating dust, along with baffles 190, 192. This embodiment may include, e.g., Brewster wedges 420 and 430, for the purpose of, e.g., clearing the desirable polarization by reflecting the undesirable polarization out of the optical cavity.

Figure 5:
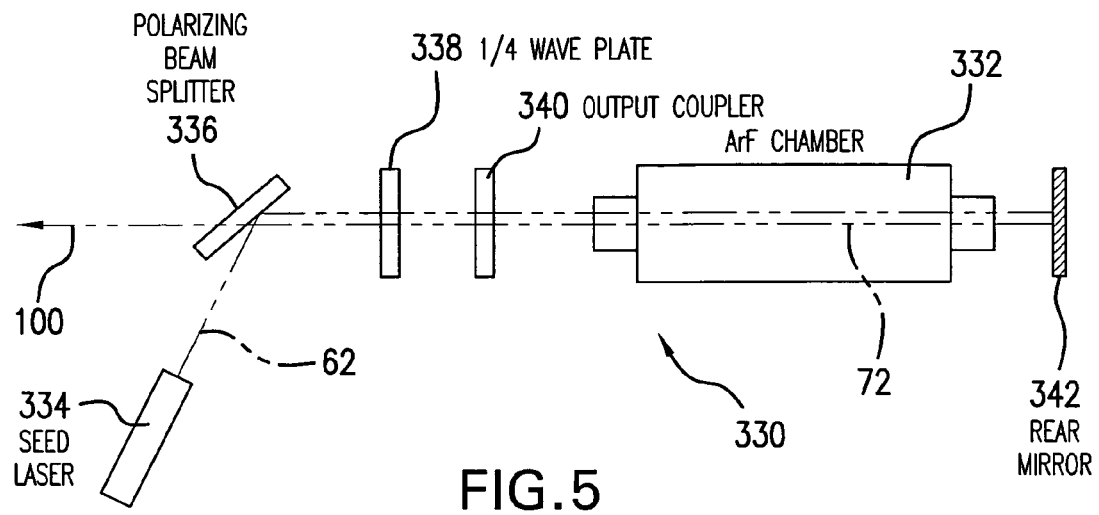
FIG. 5 shows aspects of an embodiment of the claimed subject matter disclosed.

FIG. 5 illustrates schematically and partly in block diagram format a system 330 in which, e.g., a ring power amplification stage is set up by, e.g., the use of a polarizing beam splitter 336, half wave plate 338 and output coupler 340. In operation the seed laser 334 feeds a seed laser output laser light pulse beam 62 to the beam splitter 336 and the ring cavity is set up with a single maximally reflective rear mirror 243, e.g., and a partially reflective output couple 340.

Figure 6:
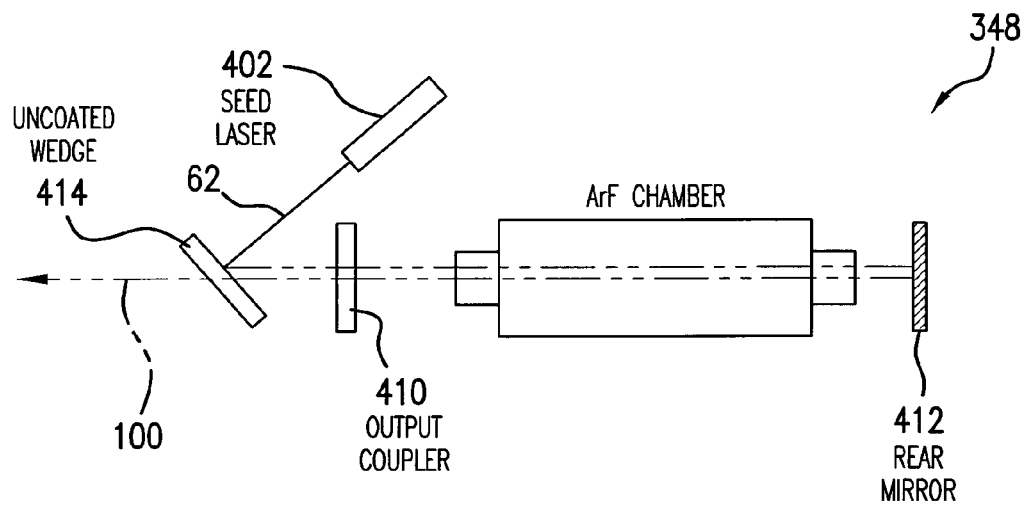
FIG. 6 shows aspects of an embodiment of the claimed subject matter disclosed.

Similarly a ring cavity may be set up according to aspects of an embodiment of the subject matter disclosed as illustrated in FIG. 6 between an output coupler 410 and a rear cavity mirror 412.

Figure 9:
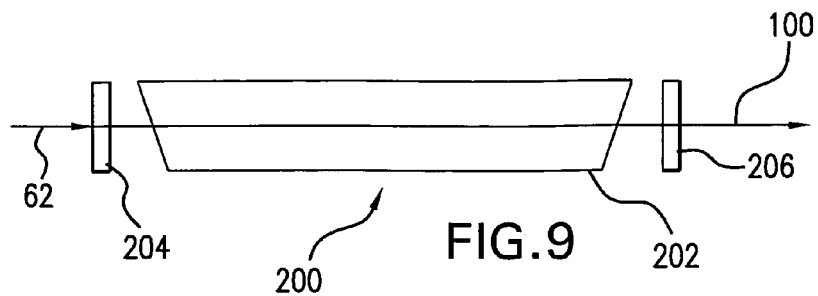
FIG. 9 illustrates schematically input coupling useful according to aspects of an embodiment of the subject matter disclosed.

There are a number of possible ways to couple the output laser light pulse beam pulses from the MO to the power amplification stage, e.g., as illustrated schematically and partly in block diagram format in FIGS. 9-11 and 14. As shown in FIG. 9, e.g., a partial reflection input coupled oscillator 200 may have a chamber 202 and, e.g., a partial reflective optic 204 as an input coupler to the oscillator chamber, with a front partially reflective optic output coupler 206. In operation, the MO output 62 enters the cavity, 200, shown to be a normal oscillator, rather than a ring oscillator, for purposes of, e.g., clarity of description, and oscillates within the cavity formed by the entrance partially reflecting optic 204 and the output coupler partially reflective optic 206, until oscillation results in a significant enough pulse of laser system output light pulse beam 100 leaving the output coupler as is well understood in the art.

Figure 10:
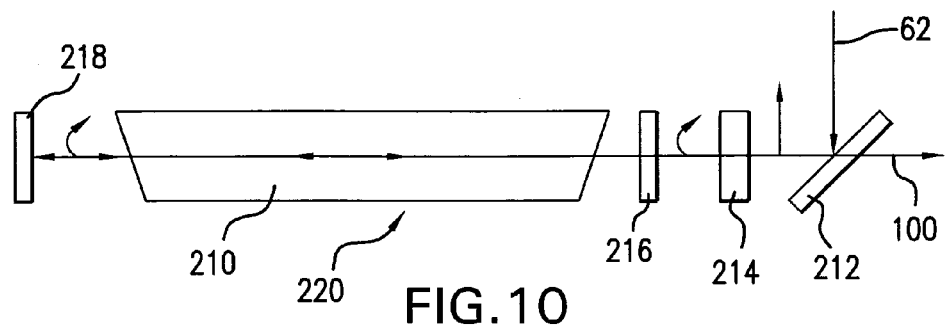
FIG. 10 illustrates schematically input coupling useful according to aspects of an embodiment of the subject matter disclosed.

Illustrated schematically and partly in block diagram form in FIG. 10, a polarization input coupled oscillator 220 forming the ring power amplification stage may include, e.g., a chamber 210, a polarizing beam splitter 212, a quarter wave plate or Faraday rotator 214, a rear maximally reflective mirror and an output coupler 216. In operation, the maximally reflective mirror 218 and the output coupler 216 for an oscillator cavity like that of FIG. 2, also shown as a regular oscillator, rather than a ring oscillator, for convenience. The polarizing beam splitter and quarter wave plate 214 serve, e.g., to isolate the MO from the amplification stage. The incoming beam 62 is of a polarity that is reflected by the beam splitter 212 into the cavity, with, e.g., the quarter wave plate 214 transmitting the beam 62 into the cavity as circularly polarized and converting the return beam from the output coupler 216 to a polarization transmitted by the polarizing beam splitter 212.

Figure 11:
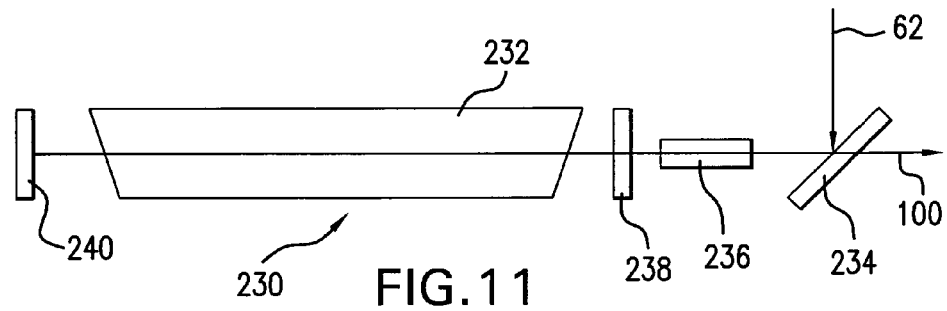
FIG. 11 illustrates schematically input coupling useful according to aspects of an embodiment of the subject matter disclosed.

As illustrated in FIG. 11 a switched input/output coupler coupled oscillator 230 is shown schematically and partly in block diagram format in which, e.g., a chamber 232 may be contained within a cavity formed, e.g., by a maximally reflective mirror 240 and a window 238, with, e.g., an electro-optic switch, e.g., a Q-switch 236, acting as a switch to allow oscillation to build to a selected point and then the Faraday switch is activated to allow a laser system output laser pulse beam 100 pulse to be emitted.

Illustrated in FIG. 12 schematically and in partial block diagram form is a multi-pass regenerative ring oscillator laser system 250, according to aspects of an embodiment of the subject matter disclosed, which may include, e.g., an amplifier chamber 252 and a seed laser 254 the system 250 may also include an input/output coupler, e.g., an injection seed input/output coupler mechanism 260. The input/output coupler 260 may include, e.g., a partially reflective mirror 262, which may be, e.g., a beam splitter of the type used currently by applicants' assignee's OPuSs sold with its laser equipment. The system 250 may also include, e.g., a maximally reflective optic 264, to steer the MO beam 62 into the electrode region of the cavity as one pass beam 276 which may return to the output coupler 262 as a second pass beam 278 from a beam reverser/returner 270, which may include, e.g., a first maximally reflective mirror 272 and a second maximally reflective mirror 274. In such an embodiment where the beam(s) 276, 278 each pass through the gain medium formed between the electrodes (not shown) in each direction once during each round trip then the average energy output is greatly increased over a system in which only one direction of the "racetrack" arrangement passes through the gain medium.

FIG. 13 illustrates schematically and partly in block diagram form, according to aspects of an embodiment of the subject matter disclosed, a multi-pass regenerative ring power amplification stage laser system 280 in the form of a bow-tie configuration, this may comprise, e.g., a chamber 282, a seed laser 284, an injection seeding mechanism 260 and a beam reverser/returner 270, the latter two of which may be configured (angled), e.g., to effect a crossing of an input pass beam 286 and an output pass beam 288, e.g., at or near the intersection of the respective longitudinal and lateral center line axes of electrodes (not shown) generating a gain medium by gas discharge between the electrodes, and thus generally at the longitudinal and lateral axes intersection of the gain medium. In such an embodiment the angle between the two passes may be almost imperceptively small so that, in effect the beams 286,288 are almost aligned with the longitudinal center-line axis of the discharge formed between the electrodes, one of which, e.g., beam 288, may also form the optical axis of the beam 100 of the laser system. As shown schematically and well out of proportion in the applicable FIG.'s in this application neither beam path, e.g., 286,288 illustrated in FIG. 13 may be shown to extend along the longitudinal center-line axis of the electrodes or may be shown from a side view where the longitudinal center-line axis is not discernible. In practice however, one pass would be very slightly misaligned with their axis and the other essentially aligned with it insofar as such alignment is optically achievable and within the tolerances allowed for the optical trains of such laser systems.

FIG. 15 illustrates schematically and partly in block diagram format a plan view of an embodiment 280 such as illustrated in FIG. 13. e.g., where the MO output laser light pulse beam 62 comes from an MO positioned above (in the direction perpendicular to the plane of the paper) the power amplification stage chamber 282. Further, FIG. 16 illustrates schematically and partly in block diagram format a side view of the apparatus 280 of FIGS. 13 and 15. A turning mirror maximal reflector 430 turns the MO laser output light pulse beam 62 into, e.g., an seed injection mechanism 260 and the crossed (bow-tie) passes 276, 278 in the oscillation resonance cavity 424 formed by the rear mirror beam returner/reflector 270 (not shown in FIG. 16) and the injection seed mechanism 270 input/output coupler partially reflective mirror 262 to form laser system output light pulse beam 100 immerging through the optic 262 acting as a usual oscillator cavity output coupler, as is well known in the art of gas discharge laser oscillator cavities with output couplers. As can be seen in FIGS. 15 and 16, the MO output beam 62 enters the ring power amplification stage oscillation cavity through the partially reflective mirror 262, which also forms the cavity output coupler from a direction, in relation to the axis of the system output beam 100 that prevents reverse coupling of the system output beam 100 back to the MO. Also, part of the beam is transmitted to the maximally reflective mirror 264 and the input/output coupler 262 forms part of the multiple pass path of the amplification stage partially reflecting part of the beam 278 to the mirror 264 on each round trip of the beams 276, 278.

Figure 17:
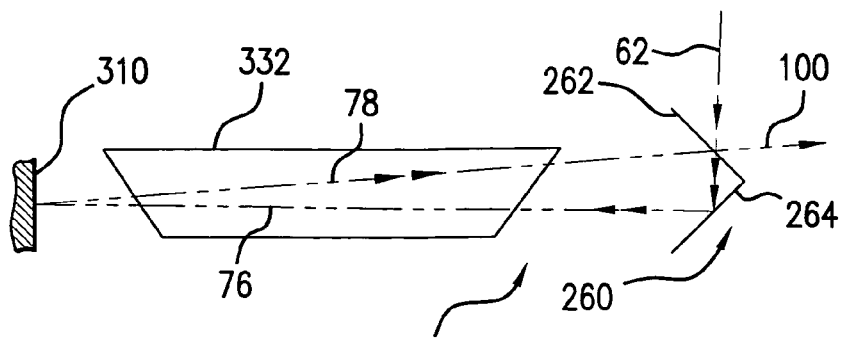
FIG. 17 illustrates schematically input coupling useful according to aspects of an embodiment of the subject matter disclosed.

FIG. 17 illustrates a schematically and partially in block diagram format an input/output coupling scheme for a single rear mirror cavity 300, e.g., with the multi-pass regenerative ring oscillator laser system 300, according to aspects of an embodiment of the subject matter disclosed, in the form of a bow-tie configuration, having, e.g., a single maximally reflective rear cavity mirror 310. In operation the MO laser input/output coupler, e.g., an orthogonal seed injection mechanism 160 may direct the MO laser output light pulse beam 62 into the cavity formed at the rear by, e.g., a single maximally reflective mirror 310 to form, e.g., a "half" bow-tie configuration having a first pass path 76 and a second pass path 78.

Figure 8:
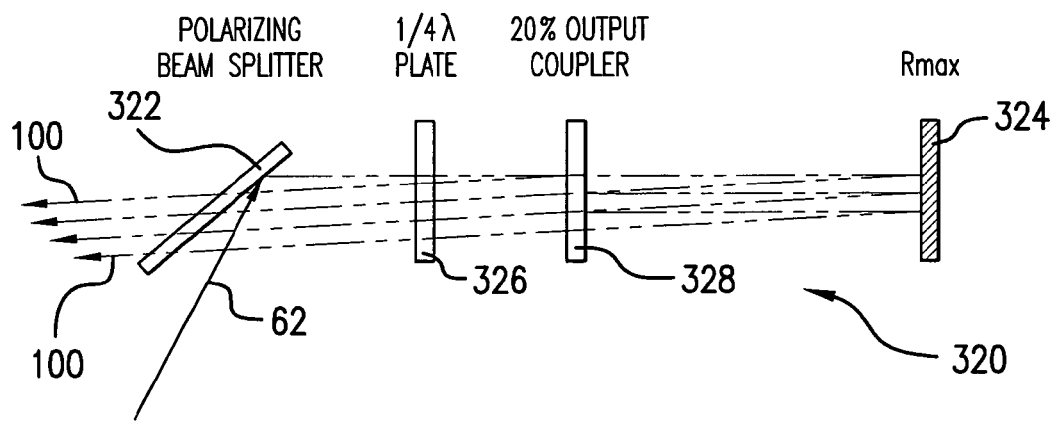
FIG. 8 illustrates schematically multiple reflections within a oscillator cavity due only to optical misalignment, according to aspects of an embodiment of the subject matter disclosed.

Turning now to FIG. 8 there is shown, according to aspects of an embodiment of the subject matter disclosed, what applicants refer to as an OPuS effect cavity 320 in which, e.g., a polarizing beam splitter 322 and a maximally reflective rear cavity mirror 324 may be used along with a quarter wave plate 326 and an output coupler 328. The system 320, according to aspects of an embodiment of the subject matter disclosed, may, e.g., due to slight misalignment of optical elements 322 and 324, have multiple passes generated within the oscillator cavity formed between the rear mirror 324 and output coupler 328, caused, e.g., by the misalignment.

Figure 18:
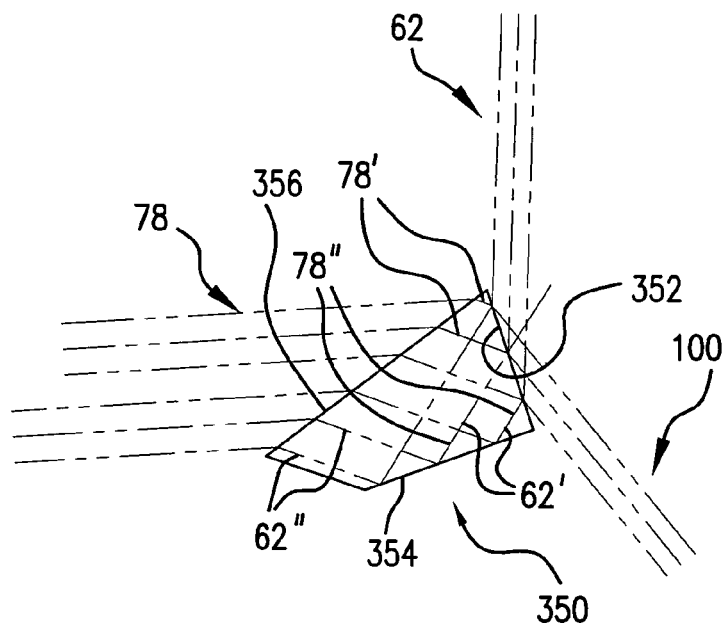
FIG. 18 illustrates schematically illustrates in cross section aspects of an embodiment of an orthogonal injection seeding mechanism according to aspects of an embodiment of the subject matter disclosed.

According to aspects of an embodiment of the subject matter disclosed, the orthogonal seed injection mechanism may comprise an orthogonal injection seeding optic such as, e.g., optical element 350, illustrated in FIG. 18 schematically and in cross-section across the longitudinal extent of the optic 350. Optical element 350 may be made of, e.g., $CaF_2$, e.g., uncoated $CaF_2$, and may comprise, e.g., according to aspects of an embodiment of the subject matter disclosed, an external input/output interface facing 352, a total internal reflection face 354, and an internal input/output interface face 356. In operation, as will be understood by those skilled in the optics art, the MO laser output light pulse beam 62 may be incident upon received by the external input/output interface facing 352, e.g., at an incidence angle of, e.g., about 70° and be refracted within the optic 350 as beam 62' to the total internal reflection face 354, which may be angled so as to totally internally reflect the beam 62' onto the internal input/output interface face 356 as beam 62" where it is refracted again upon entering the lasing gas medium environment inside of the chamber (not shown in FIG. 19), e.g., along a first path 76 and, after again passing through the gain medium, e.g., after reflection from a beam reverser (not shown in FIG. 19) it again is incident on and transmits through the face 356, as beam 78 and is refracted within the optic 350 as beam 78' to exit optic 350 as through this external input/output interface facing 352 the laser system output light pulse beam 100. The beams 76, 78 according to aspects of an embodiment of the subject matter disclosed, along with the beam reverser (not shown in FIG. 19), may cross, e.g., as shown in FIG. 13 or not as shown in FIG. 12. It will be understood that the beam 78' will also partially reflect onto the total internal reflecting surface 354 as beam 78" (62') and the partially reflected portion will become beam 62" and beam 76 again, so that the optic 350 acts as an output coupler until enough oscillations occur such that the stimulated emissions form a substantial laser system output laser light pulse beam 100.

Figure 19:
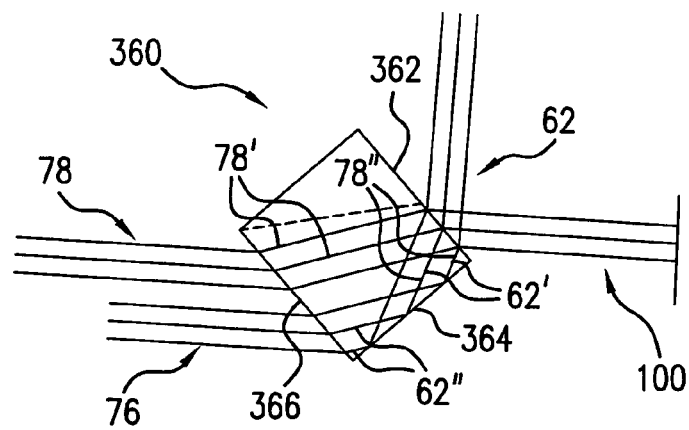
FIG. 19 illustrates schematically illustrates in cross section aspects of an embodiment of an orthogonal injection seeding mechanism according to aspects of an embodiment of the subject matter disclosed.

According to aspects of an embodiment of the subject matter disclosed another version of a seed injection optic 360, illustrated in FIG. 19, schematically and in cross section across a longitudinal axis thereof, may comprise, e.g., an external input/output interface facing 362, a total internal reflection face 364 and an internal input/output interface face 366. In operation the beam 62 from the MO may be incident upon the external input/output interface facing 362 and be refracted within the optic 360 as beam 62' to the total internal reflection face 364, and be reflected as beam 62" to the internal input/output interface face 366 where it will exit and again be refracted in the gas of the lasing medium environment as beam 76. After return from the beam reverser (not shown in FIG. 19) the beam 78 refracts in the optic 360 as beam 78' and transmits through the external input/output face 362 as laser system output light pulse beam 100. It will also be understood by those skilled in the laser art, as was so also with the embodiment of FIG. 18, that the beam 78' will also partially reflect onto the total internal reflecting surface 364 as beam 78" (62') and the partially reflected portion will become beam 62" and beam 76 again, so that the optic 360 acts as an output coupler until enough oscillations occur such that the stimulated emissions form a substantial laser system output laser light pulse beam 100.

According to aspects of an embodiment of the subject matter disclosed a variety of beam returners/reversers 370 may be utilized, e.g., as illustrated schematically in FIGS. 20-22. The optic 370 of FIG. 20 may incorporate, e.g., an input/output face 372, a first total internal reflection face 374, a second total internal reflection face 376 and a third total internal reflection face 378, such that, in operation the beam 76 transiting the gain medium in a first direction may be incident on the face 372, and be reflected by the faces 374, 376 and 378 to exit the optic 370 at the input/output interface face 372 as the beam 78 passing through the gain medium in a second direction. A similar beam reverser 380 is illustrated in cross section and schematically in FIGS. 21 and 22 wherein there are only two totally internal reflecting surfaces 384, 386 and 394, 396 in the optics 380 and 390 respectively.

It will also be understood by those skilled in the optics art that with three internal reflections, or with a three mirror arrangement, e.g., as is currently in use as a beam reverser on applicants' assignee's XLA model laser systems, the input beam 76 and output beam 78 will be effectively aligned and parallel and that relationship does not change, e.g., with rotation of the optic, e.g., optic 370, e.g., about an axis perpendicular to the plane of the page of FIG. 20. For the reversers 380, 390 respectively of FIGS. 21 and 22, the even number of internal reflections, e.g., two internal reflections allows for the beams 76, 78 to have variable angular relationship in the plane of the paper of FIGS. 21 and 22.

It will be understood by those skilled in the optics art that various combinations of the seed injection mechanism referred to in the present application and beam reversers/returners may be utilized to get the beams, e.g., on paths 76, 78 to cross, e.g., as illustrated in FIGS. 2, 3, 4 and 13 or not, e.g., as illustrated in FIG. 12. Also, manipulating these optics will be understood to enable the selection of, e.g., a crossing point for the paths, e.g., 76, 78, e.g., with respect to the extent of the lasing gain medium, e.g., along the longitudinal and/or vertical axis of the lasing gas gain medium during a discharge between the gain medium exciting electrodes. This may be utilized to vary parameters of the ultimate laser system output laser light pulse beam pulses, e.g., energy, energy stability and the like.

Figure 23:
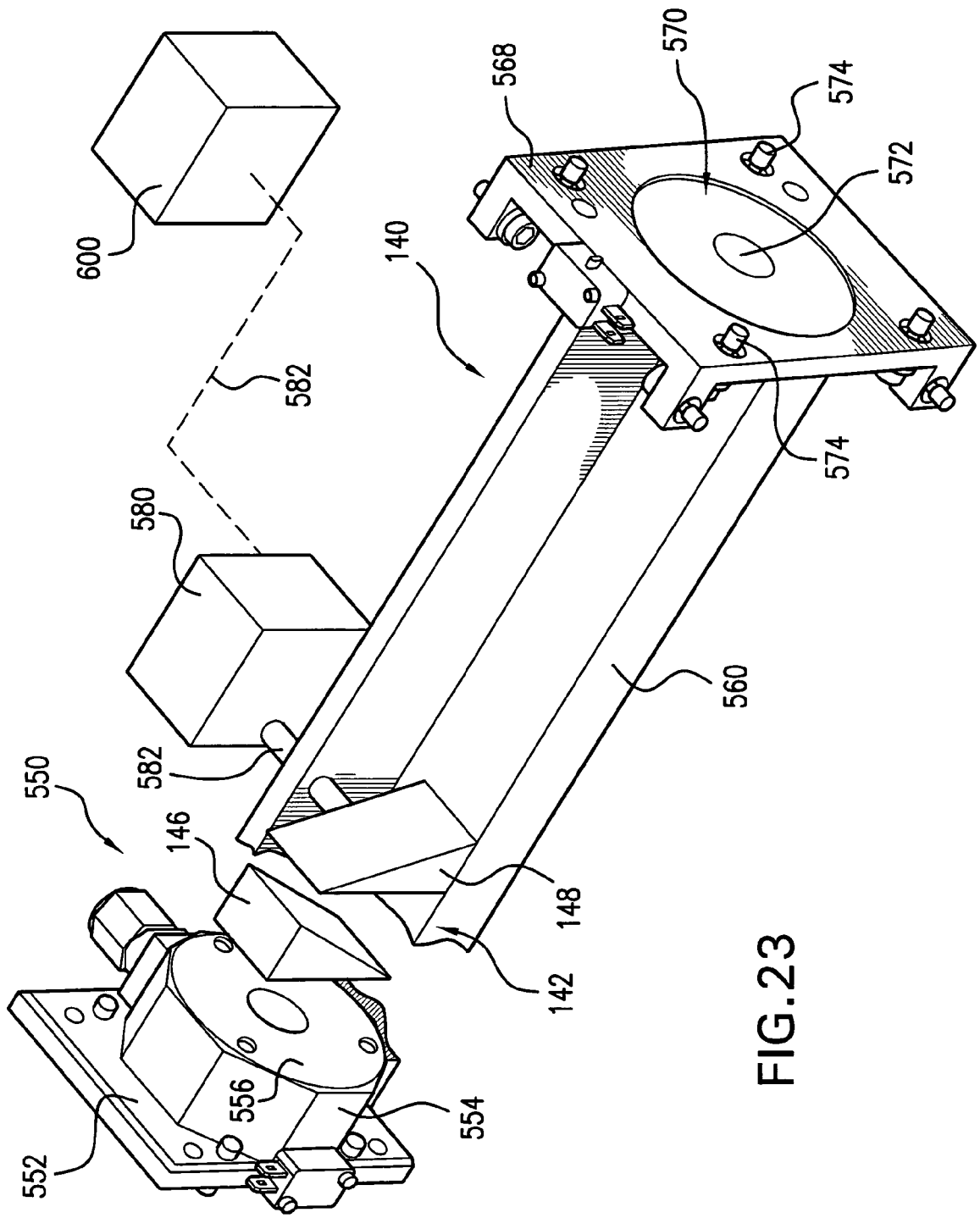
FIG. 23 illustrates partly schematically in a partially cut away perspective view an extension of a lasing chamber containing optical elements in the chamber according to aspects of an embodiment of the subject matter disclosed.

Turning now to FIG. 23 there is illustrated a snout 140, various versions of which are illustrated schematically, e.g., in FIGS. 2, 3 and 4. The snout 140 may comprise, e.g., a window housing 550, which may comprise an external mounting plate 552 and housing walls 554 machined with the housing plate 552 or otherwise affixed to the housing plate 552. Also a window mounting plate 556 is shown. This window housing 550 shown illustratively, according to aspects of an embodiment of the subject matter disclosed, may be similar to such window housings currently being used on applicants' assignee's laser systems and may have a window housing end plate (not shown in this view for clarity purposes), similar to the laser end plate 570, such as is shown in FIG. 23 at the laser side of the snout 140. The not shown window mounting laser end plate may be at the point of the window mounting plate 556. Similarly the snout 140 may have a window end plate (not shown in this FIG. for clarity) similar to the end plate 552 to affix the window housing 550 to the remainder of the snout 140. The laser chamber end mounting plate 568 may be attached to the laser chamber, e.g., 144 in FIG. 2, by mounting bolts 574, and have an aperture 572 through the beam, e.g., 76 enters the chamber 144 and beam 78 returns from the chamber 144.

As shown in FIG. 23 partly schematically and partly in block diagram form the beam expander 142, e.g., comprising beam expanding prism 146 and beam expanding prism 148, may be within the snout 140, as shown schematically in the cutaway of FIG. 23. At least one of the prisms 146, 148 may be mounted on mounts (not shown) for movement one relative to the other. This may be controlled, e.g., by a controller 600, e.g., by an actuator 580, e.g., a stepper motor or other suitable actuators known in the art of laser system optic positioning control as referenced in one or more of the above referenced patents or co-pending applications, connected to the respective at least one prism, e.g., prism 148 by an actuator shaft 582, e.g. for rotation of the prism 148 on the axis of the shaft 582, to change its position relative to the prism 142 and also other optics, e.g., an orthogonal seed injection mechanism (not shown in FIG. 23) and/or the beam returner/reverser (not shown in FIG. 23).

Similarly as illustrated schematically and partly in block diagram form, e.g., in FIGS. 13 and 15, the beam reverser/returner 270 and/or the seed input/output coupling optic 260 may be controlled by a controller 600 controlling the operation of an actuator 590 for the beam returner/reverser and 594 for the input output optic, e.g., an orthogonal seed injection mechanisms 260, with the actuators 590, 594 connected to the controller 600 by control signal lines 592 and 596 respectively.

A ring cavity, e.g., with an output coupler seed laser coupling, e.g., an seed injection mechanism, while perhaps more complex a configuration, makes most efficient use of seed laser energy.

According to aspects of an embodiment of the subject matter disclosed, for the seed laser input/output coupling a range of maximally reflecting mirrors may be utilized, e.g., from about a square 45 degree Rmax to about a square 30 degree Rmax, e.g., as is used on applicants' assignee's ArF 193 nm LNMs. Reflectivity for P-polarization is only about 85% at 45 degrees. Instead of a perhaps more desirable 45 degree output coupler with more desirable P-polarization and S-polarization properties, due to time constraints, applicants have so far only examined the use of an OPuS beamsplitter, rotated to 45 degrees in the horizontal, which provides, e.g., 24% reflectivity for P-polarization and 60% reflectivity for S-polarization. A more desirable set of values may be 20% for p-polarization and a smaller number, e.g., around 10% for s-polarization. In the development unit according to aspects of an embodiment of the subject matter disclosed a chamber window was held at the standard 47 degree angle of incidence, rather than at Brewster's angle, which could also be employed.

Applicants have measured P-polarization round trip transmission and S-polarization round trip transmission, as follows:

| P-polarization | S-polarization |
|---|---|
| 0.24 | 0.60 |
| 0.85 | 0.85 |
| $(1.00)^8 = 1.00$ | $(0.85)^8 = 0.27$ |
| $(0.969)^8 = 0.78$ | $(0.949)^8 = 0.66$ |
| $(1.00)^2 = 1.00$ | $(0.85)^2 = 0.72$ |
| 0.159 | 0.065 | with a ratio between S and P of 2.44:1.

According to aspects of an embodiment of the subject matter disclosed where attenuation of s-polarization may be needed, e.g., because of ASE, it may be achieved via Brewster reflections and insertion of partial reflectors in or into the power amplification stage cavity.

Also according to aspects of an embodiment of the subject matter disclosed, pulse duration may be controlled, e.g., to control ASE, and if so this may be done, e.g., using optics and electronics, e.g., useful in pulse trimming. Without controlling such timing and/or pulse trimming, according to aspects of an embodiment of the subject matter disclosed, e.g., the seed pulse duration may be longer than that desired, and, e.g., peak intensity may be lower for a given total energy.

Figure 7:
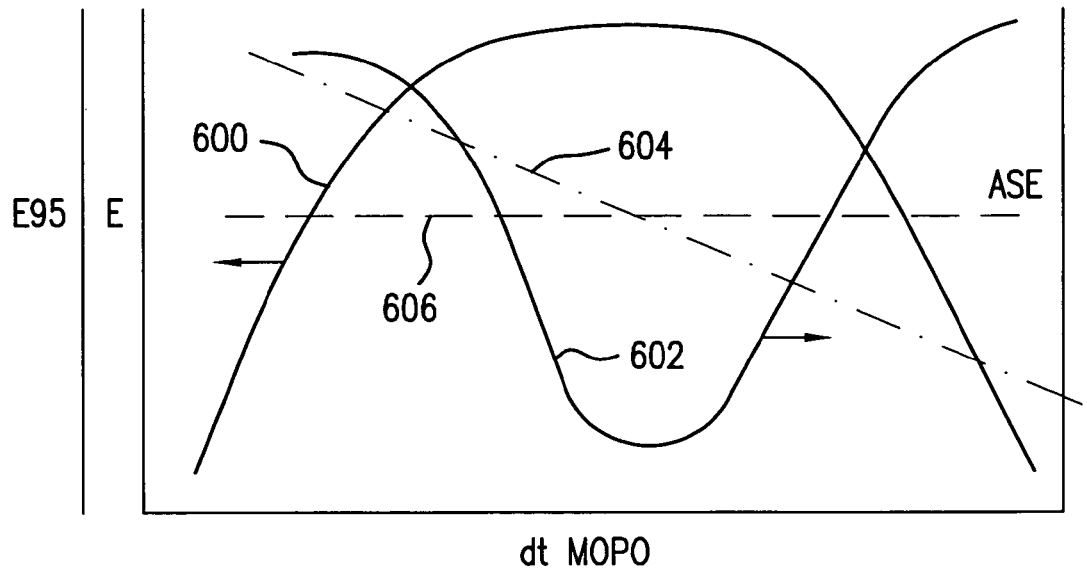
FIG. 7 illustrates a timing and control regime according to aspects of an embodiment of the subject matter disclosed.

MOPO energy vs. MO-AMPLIFICATION STAGE timing has been examined at different values of seed laser energy, ArF chamber gas mixture, percentage reflectivity of output coupler (cavity Q) and seed laser pulse duration, with the results as explained in relation to FIG. 7.

ASE vs. MO-PO timing has been examined for different values of seed laser energy, ArF chamber gas mixture, percentage reflectivity of output coupler (cavity Q) and seed laser pulse duration with the results also explained in relation to FIG. 7.

Figure 24:
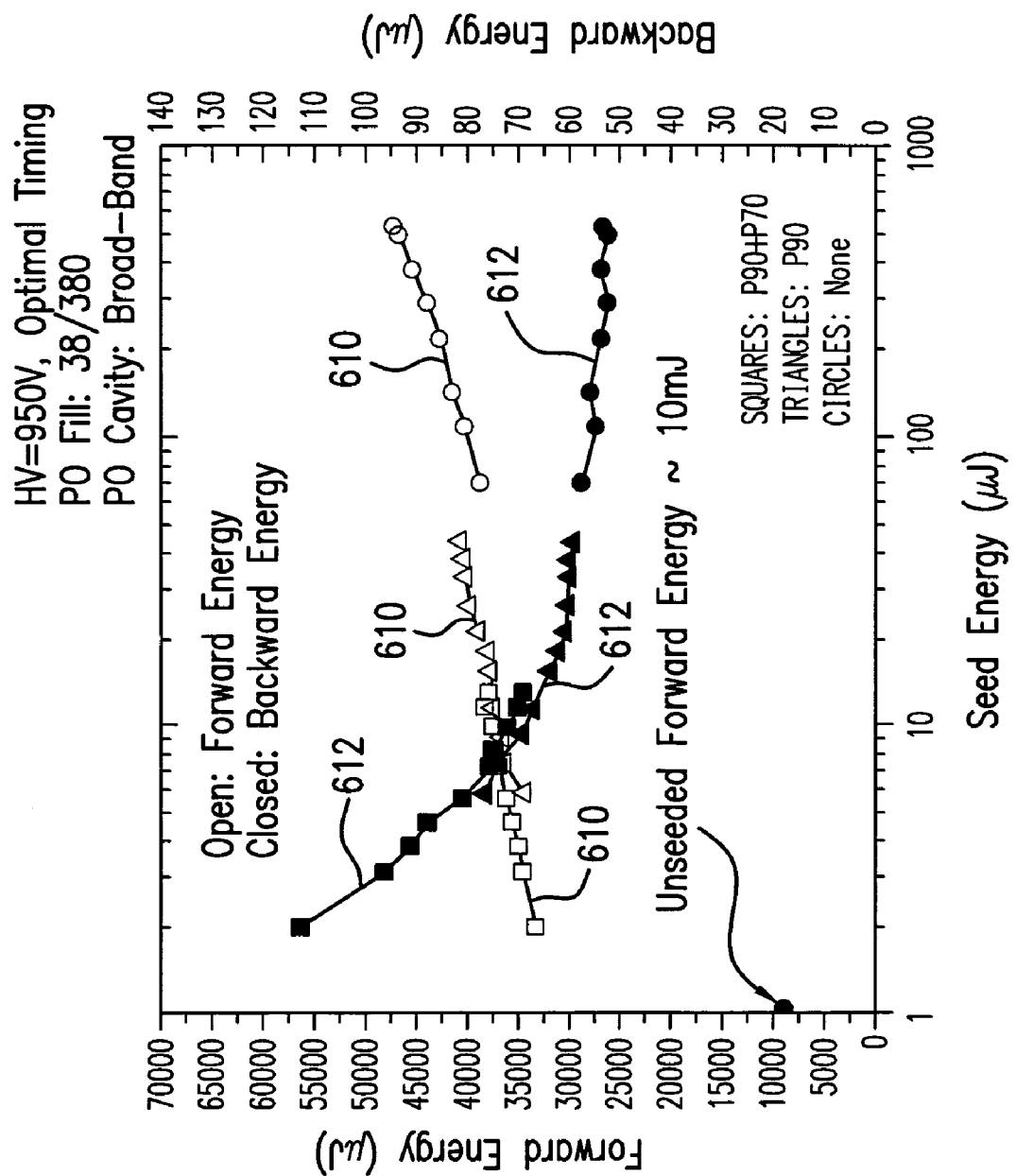
FIG. 24 illustrates measurements of forward and backward energy in a ring power amplifier according to aspects of an embodiment of the subject matter disclosed.
Figure 25:
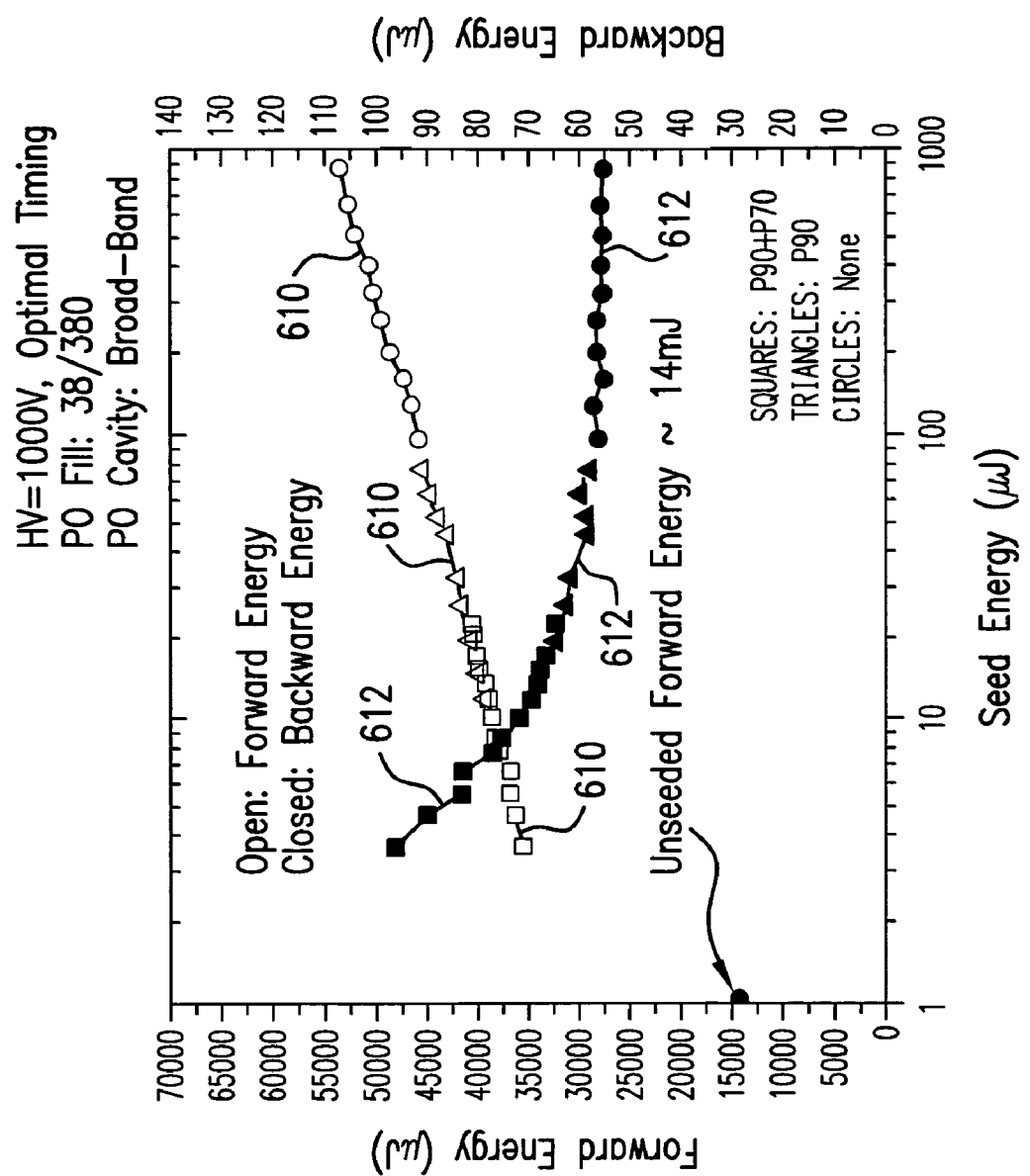
FIG. 25 illustrates measurements of forward and backward energy in a ring power amplifier according to aspects of an embodiment of the subject matter disclosed.

The relationship between forward energy and seed energy has also been examiner and the results of which are illustrated, e.g., in FIGS. 24 and 25. The measurements taken at what was considered to be optimum timing of the discharge in the lasing medium in the MO and the discharge in the lasing medium in the ring power amplification stage. In FIG. 24 the curves 610 represent forward energy values and the curves 612 representing backward energy values, with the square data points representing operation with P90+P70 filters and the realignment was performed after insertion of partial reflectors with the results as shown in FIG. 25.

ASE can be of great concern with MOPO designs. Improper timing may lead to increased ASE up to and including generations of only ASE when the MO and power amplification stages are so mis-timed that essentially only broad band (ASE) lasing occurs in the power amplification stage, which being an oscillator will lase when the discharge occurs between the electrodes in the power amplification stage. Unlike a power amplifier, such as in applicants assignee's XLA-XXX laser system where the seed beam passes through the amplification stage a fixed number of times depending on the optical arrangement, in systems according to aspects of an embodiment of the subject matter disclosed amplified spontaneous emission (ASE) lasing occurs whether the seed laser pulse is present for amplification or not. Back scatter from the amplifier cavity optics can form a parasitic laser cavity. Some amplifier cavity optics can form an unintended laser cavity between the amplifier and MO. Therefore careful control of timing is used, according to aspects of an embodiment of the subject matter disclosed, to keep ASE below limits that reduces or effectively eliminates the unwanted lasing. The back scattering or otherwise ASE at the MO may be measured by the ASE detector, which may comprise, e.g., a fluorescence detector.

ASE measurements have been made with medium and small seed input energy. For example for medium energy, e.g., seed energy of around 50 µJ, with a discharge voltage Vco of around 950V, and with a AMPLIFICATION STAGE gas fill of 38/380, fluorine partial pressure/total pressure, it has been shown that with a relative timing of between about −10 ns and +10 ns of optimum the ASE ratio is below about $3\times10^{-5}$. With low seed energy, e.g., around 5 µJ, with the same voltage and fill the ASE ratio is kept below about $6\times10^{-4}$ between about 10 ns to +10 ns of relative timing.

While a ring cavity can produce very low ASE with 50 uJ of seed energy, the present implementation according to aspects of an embodiment of the subject matter disclosed can reach the ASE upper limit specification limit at optimal relative timing of between about −10 ns and +10 ns of optimum with about 5 uJ of seed energy. Also according to aspects of an embodiment of the subject matter disclosed the seed pulse can be, e.g., electro-optically trimmed to produce, e.g., a desired 10 ns pulse duration, even from an excimer seed laser with normally about a 30 ns pulse duration. According to aspects of an embodiment of the subject matter disclosed applicants expect reduced ASE with 5 uJ of seed energy, e.g., due to higher peak intensity. Maintaining proper ASE performance may require selecting proper amplifier cavity optics that have appropriate selectivity to eliminate unwanted polarization (e.g., utilizing appropriate coatings/angles of incidence, etc.), which can result in better suppression of unwanted polarization, which can result in reduced ASE, e.g., from the S-polarization. Creating dispersion in the amplifier cavity, e.g., with beam expanding and dispersing prisms has also been determined by applicants, according to aspects of an embodiment of the subject matter disclosed, to be an effective method for further reducing the ASE ratio contributing to an effectively large enough margin against whatever ASE specification is selected.

According to aspects of an embodiment of the subject matter disclosed a method is proposed to reduce ASE in ring amplifiers, e.g., to take better advantage of other features of this architecture, e.g., low seed energy, high efficiency, energy stability etc. Applicants propose to introduce some broad band (at least much broader than the line narrowed seed radiation propagating in the opposite direction from that of the main radiation direction to increase ASE in this direction and reduce ASE in the main direction. That is to say broad band gain will be utilized in the opposite path around the ring to reduce the available gain for ASE in the main direction. This could be accomplished, e.g., with some scatter of the seed laser beam from the optics, e.g., by feeding florescence of the seed laser into the ring power amplification stage. The broad band emission can thereby, e.g., deplete gain available to the ASE and will be propagated oppositely to main radiation direction, reducing broad band emission in the main direction.

According to aspects of an embodiment of the subject matter disclosed it will be understood that solid state pulsed power systems such as the magnetically switched systems noted above in one or more of the referenced patents or patent applications and as sold with applicants' assignee's laser systems, having very tightly controlled timing of the firings of electric discharges between electrodes in the respective MO and amplification gain medium chambers, along with the properties of a ring power amplification stage in a MOPRO configuration (e.g., operating the ring power amplification stage at or very near total saturation), enables the delivery to a lithography tool or an LTPS tool, or the like, laser system output light pulse beam pulses having about twice the dose stability as is currently achievable, e.g., in applicants' assignee's XLA MOPA laser systems.

Figure 26:
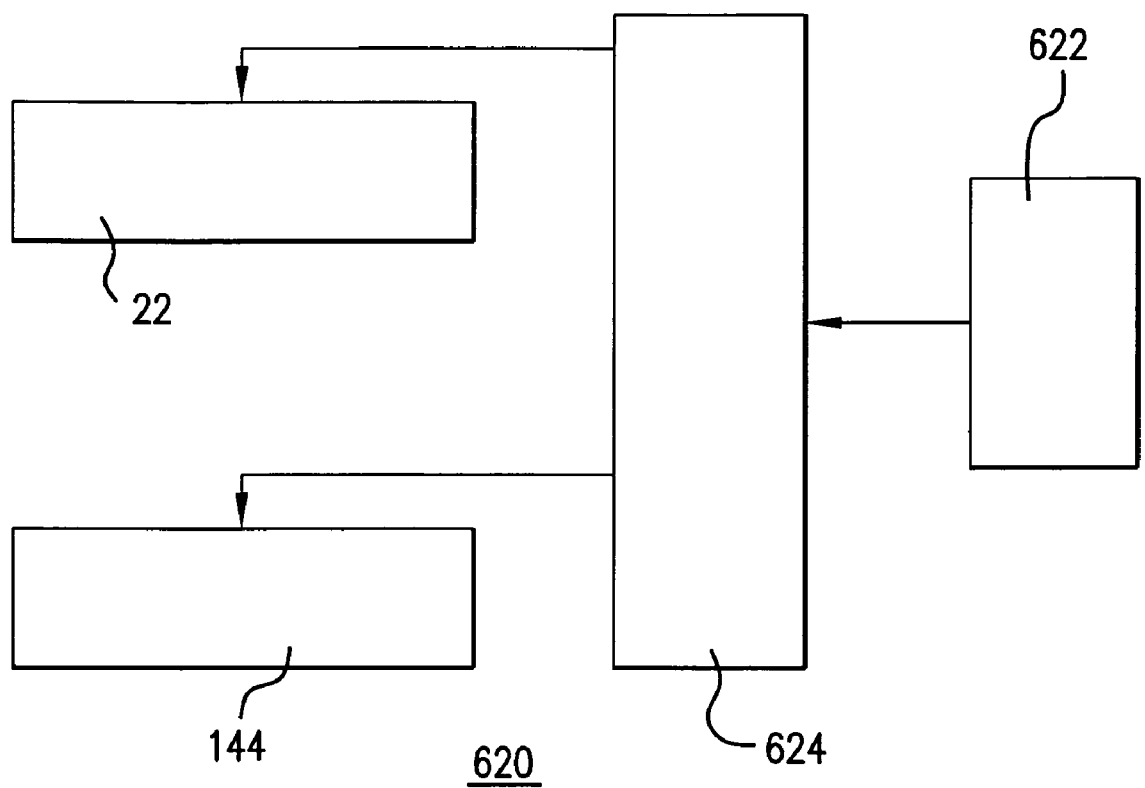
FIG. 26 illustrates schematically and in block diagram form a timing and control system for a MOPO according to aspects of an embodiment of the subject matter disclosed.
Figure 27:
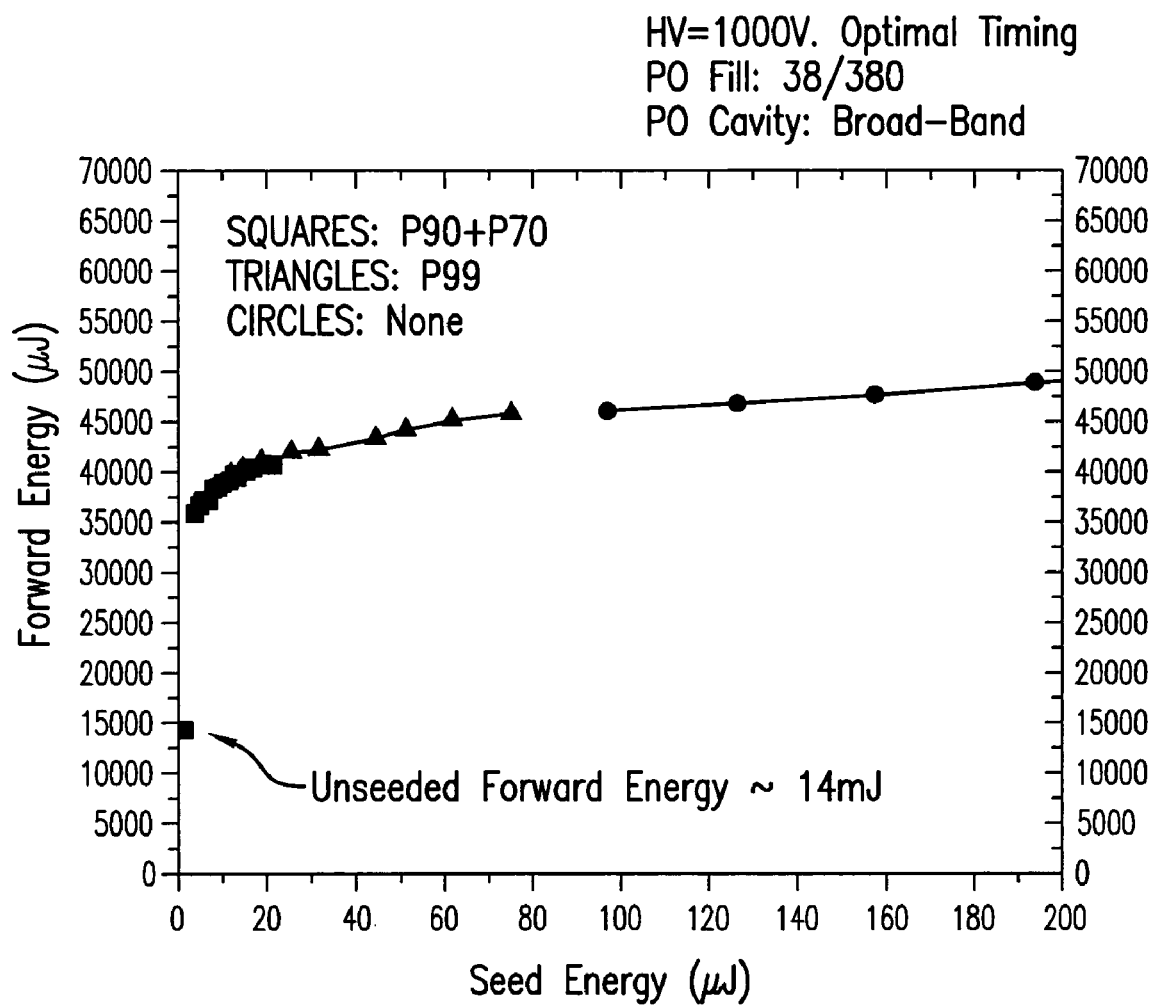
FIG. 27 illustrates the degree of saturation of a ring power oscillator with variation of MO output pulse energy according to aspects of an embodiment of the subject matter disclosed.

FIG. 26 shows schematically and in block diagram an energy/dose control system 620 according to aspects of an embodiment of the subject matter disclosed. As illustrated in block diagram form, the energy/dose controller 620 may include a solid state pulsed power system 624, such as a magnetically switched pulsed power system as noted above, which may be controlled, e.g., by a timing and energy control module 622 of the type sold with applicants' assignee's current laser systems, e.g., XLA MOPA configured laser systems and discussed in one or more of the above referenced patents or co-pending applications. Such timing end energy control modules in combination with the SSPPM 624 are capable of very fine pulse to pulse energy control, e.g., out of the MO and very fine, e.g., within a few nanoseconds, control of the relative timing of the firing of the electric discharge between a first pair of electrodes (not shown) in the MO 24 and a second pair of electrodes, e.g., electrodes 424 in the amplification stage 144 as illustrated, e.g., in FIGS. 15 and 16. This enables, as discussed in one or more of the above referenced patents and co-pending applications, e.g., the selection of a portion of the output laser light pulse beam pulse from the MO to initiate seeding of the amplification gain medium and the like, e.g., to control bandwidth and also impact other overall laser system output light pulse beam pulse parameters. This, in combination with the ring power oscillator operating at or nearly at saturation, e.g., within about 5-10% of saturation, or closer enables the system to delivery about twice the dose stability as is currently available in, e.g., lithography laser light sources, such as applicants' assignee's XLA laser systems or existing laser annealing light sources, e.g., for LTPS.

Figure 31:
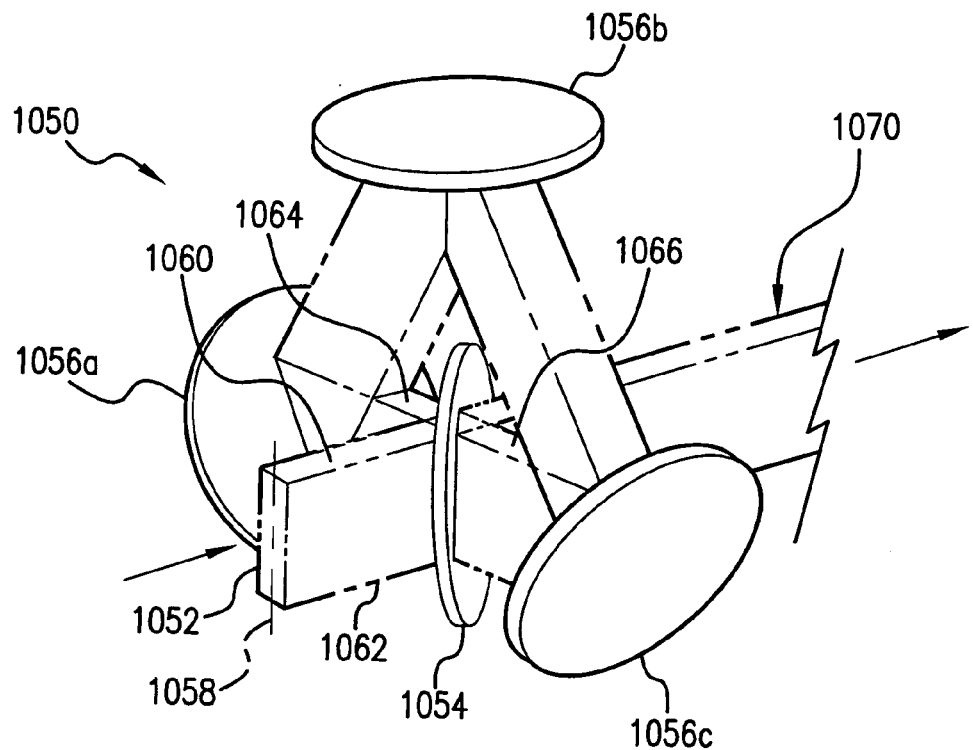
FIG. 31 shows schematically a coherency buster according to aspects of an embodiment of the disclosed subject matter.

Referring to FIG. 31, a beam mixer 1050 is shown for operation on a beam 1052 (which for illustrative purposes has been shown as having an upper white half and a lower black half). As explained in greater detail below, the beam mixer 1050 can be used to alter the intensity profile of a beam, e.g. improving intensity symmetry along a selected axis of a beam, and can be used to reduce beam coherency, or both. For the embodiment shown, the beam mixer 1050 includes a beam splitter 1054 and mirrors 1056a-c.

For the arrangement shown in FIG. 31, the beam 1052 can be initially incident upon the beam splitter 1054 whereupon a portion of the beam may directed, via reflection, toward mirror 1056a and the remainder is transmitted, (e.g., with substantially no change in direction) through the beam splitter 1054 and exits the beam mixer 1050 on an output beam path 1070. In one setup, a beam splitter 1054 reflecting about forty to sixty percent of the incident light, e.g., fifty percent, may be used. For this setup, about fifty percent of the initial beam incident upon the beam splitter 1054 is directed toward the mirror 1056a. For the beam mixer 1050, mirrors 1056a-c may typically be flat, maximum reflectivity mirrors. As shown in FIG. 31, mirror 1056a may be positioned and oriented to receive light from the beam splitter 1054 at an angle of incidence of approximately thirty degrees. As further shown, mirror 1056b may be positioned and oriented to receive light reflected from mirror 1056a at an angle of incidence of approximately thirty degrees, and mirror 1056c may be positioned and oriented to receive light reflected from mirror 1056b at an angle of incidence of approximately thirty degrees.

Continuing with FIG. 31, light reflected from mirror 1056c can be made to be incident upon the beam splitter 1054 at an angle of incidence of about forty-five degrees. For a fifty percent reflectivity beam splitter, about half of the light from mirror 1056c is reflected onto the output beam path 1070 and about half of the light from mirror 1056c passes through the beam splitter 1054 on a beam path toward mirror 1056a, as shown. Thus, the output beam path 1070 includes a combined beam containing the portion of the initial beam 1052 that passed through the beam splitter 1054 and the portion of light from mirror 1056c that is reflected from the beam splitter 1054. Similarly, the light on the path from the beam splitter 1054 to mirror 1056a includes a combined beam containing the portion of the initial beam 1052 that is reflected by the beam splitter 1054 and the portion of light from mirror 1056c that is transmitted through the beam splitter 1054.

The beam entering the beam mixer 1050 in FIG. 31 is shown illustratively as having a rectangular cross-section that defines a long axis 1058. This type of beam is typical of a laser beam produced by an excimer laser with the long axis corresponding to the direction from one discharge electrode to the other. A typical beam may have dimension of about 3 mm by 12 mm. Moreover, for the output of an excimer laser, the intensity profile in one axis, e.g., the long axis 1058 is typically unsymmetrical, whereas the intensity profile in the other axis, e.g., the short axis (i.e. the axis normal to the long axis 1058) is approximately Gaussian. Although the beam mixer 1050 shown is particularly suitable for improving symmetry of a high power excimer discharge laser, it is to be appreciated that it can be used in conjunction with other types of laser systems and for other applications, for example, the beam mixer may be used to reduce coherency in a beam generated by a solid state laser.

FIG. 31 shows that the beam extends along the axis 1058 from a first edge 1060 to a second edge 1062. FIG. 31 also shows that the mirrors 1056a-c establishing a spatially inverting path which has a beginning 1064 and an end 1066. As FIG. 31 illustrates, the inverting path may be characterized in that a part of the beam near the first beam edge 1060 at the beginning 1064 of the inverting path translates to the second beam edge at the end 1066 of the inverting path. More specifically, for the mixer 1050 shown, a photon at the 'top' of the beam which strikes mirror 1056a translates and leaves mirror 1056c at the 'bottom' of the beam. Since the inverting path constitutes a delay path, there will be some temporal stretching of the pulse, and this can be beneficial, especially in embodiments with the coherence busting mechanism between the master oscillator/seed laser and the amplification gain medium, e.g., the ring power amplification stage. The pulse stretching between the seed laser and amplification gain medium can stretch somewhat the pulse out of the amplification gain medium.

The beam mixer 1050 may be placed in between the seed beam laser portion and the amplifier laser portion of a MOPA or MOPRO (with, e.g., a ring power amplification stage), configured multi-chambered laser system, such as that shown in FIGS. 1-6 and 9-16. Other forms of coherency busting, of the passive type, may be used, e.g., between the MO and PA as discussed in above referenced in U.S. patent application Ser. No. 11/447,380, entitled DEVICE AND METHOD TO STABILIZE BEAM SHAPE AND SYMMETRY FOR HIGH ENERGY PULSED LASER APPLICATIONS, filed on Jun. 5, 2006, and Ser. No. 10/881,533, entitled METHOD AND APPARATUS FOR GAS DISCHARGE LASER OUTPUT LIGHT COHERENCY REDUCTION, filed on Jun. 29, 2004, and published on Dec. 29, 2005, Pub. No. 20050286599, as well as Ser. No. 11/521,904, entitled LASER SYSTEM, filed on the same day as the present application, referenced above.

It will be understood by those skilled in the art that as disclosed in the present application according to aspects of an embodiment of the subject matter disclosed, applicants have enabled the satisfaction of customer demands, both from scanner makers and semiconductor manufacturer end users, that have been placed on light source suppliers, e.g., ArF light sources, beyond even the traditionally expected power and bandwidth improvements. For example, further CoC Improvement is demanded because, e.g., ArF is now used in high volume production, e.g., on cost sensitive products, the industry expectation of equivalent reductions in cost of operation and thus cost of consumables for ArF as was historically demanded in KrF as that technology matured. In addition, energy stability improvements are met by the subject matter disclosed, e.g., critical dimension variation sensitivity to dose, which has become greater with the advent of low K1 lithography techniques. The double exposure concept, e.g., also trades off between overlay and dose control. Optical maskless lithography will require single pulse exposure control, improved by aspects of embodiments of the subject matter disclosed.

According to aspects of an embodiment of the subject matter disclosed Cost Of Consumables Improvement, e.g., in XLA MO Chamber Life are enabled, e.g., because the parameters that lead to long chamber life did not produce sufficient MO energy for proper operation in the XLA MOPA configuration, e.g., a requirement of at least about a 1 mJ MO output energy. According to aspects of an embodiment of the subject matter disclosed significantly less than 1 mJ energy is required from the MO cavity, e.g., for lithography uses, thus allowing significant reductions in CoC for such low light sources. Therefore, e.g., with operating parameters more conducive to long electrode life, e.g., the system may produce, e.g., around 100 μJ from the MO cavity. This can, e.g., in ArF lasers, e.g., increase the MO chamber life time to at or about that of the PA chamber lifetime, an approximately a 10× increase in MO lifetime before replacement as a consumable while still attaining system output average power from the amplification stage for effective lithography with 60-100 watts or so output. MO cavity optics, LNM optics and the MO output coupler, according to aspects of an embodiment of the subject matter disclosed, experience lower 193 nm intensity, ensuring very much longer optics lifetimes.

With regard to energy stability improvements, the Cymer XLA light source led to a significant improvement in energy stability by exploiting the saturation effects in the PA of a MOPA configuration, e.g., with a two pass PA amplification. The slope of Eout vs. Ein for XLA is about ⅓. MO energy instabilities are reduced by a factor of 3× when passed through such a PA. However, even with the 3× improvement through the PA, the MOPA system energy stability is still greatly impacted by, e.g., the MO energy instability. MO and PA contributions are about equal. Other contributions such as, voltage regulation, timing jitter, and MO pointing jitter are relatively smaller contributors, but not insignificant. The PA energy stability performance falls somewhere between a typical broadband oscillator and a fully saturated amplifier.

According to aspects of an embodiment of the subject matter disclosed, a recirculating ring configuration, e.g., a power ring amplification stage, operates in a much stronger region of saturation. The slope of Eout vs. Ein for a seed laser/amplification gain medium system, e.g., with a ring power amplification stage has been measured by applicants' employer at 0.059. MO energy instabilities can be reduced by a factor of 17×, e.g., when passed through a recirculating ring oscillator, e.g., a power ring amplification stage. At the planned operating point of about 100 μJ of MO energy, the Eout vs. Ein slope has been observed at or simulated at ¹⁄₁₇.

With the recirculating ring configuration the amplification stage energy stability will exhibit the characteristics of a fully saturated amplifier. Applicants expect at a minimum to see about a 1.5-2× improvement in energy stability.

$$\sigma_{System} = \sqrt{\frac{1}{17}\sigma^2_{MO} + \sigma^2_{PA} + \sigma^2_{voltage} + \sigma^2_{timing} + \sigma^2_{MO\ Pointing}}$$

A larger improvement is expected in the MO $\sigma^2$, e.g., due to reduced thermal transient effects at the approximately 10× lower required MO output pulse energy, a large improvement is expected in the amplification gain medium $\sigma^2$, e.g., due to operating at or near saturation. Improvement is also expected for MO pointing $\sigma^2$.

It will further be understood by those skilled in the art that according to aspects of an embodiment of the subject matter disclosed a power ring amplification stage may be utilized. Optics may be utilized to create, e.g., a combined bow-tie and race-track oscillation path for four passes per oscillation path, or optics may be utilized to, e.g., create two or more overlapping bow-ties or race tracks. Bow tie arrangements may sometimes be referred to in the art as a cat's cradle. Characteristic of such amplifier media, e.g., regenerative or recirculating ring power amplification stage can include parallel planarity which could be a stable oscillator, e.g., in half planes or an unstable oscillator. The beam returner/beam reverser could utilize multiple mirrors or prisms or a combination thereof, positioned inside or outside the chamber or a combination thereof, e.g., dependant upon exposure to certain levels of energy density by one or more of the optical elements. Unwanted light, e.g., mostly ASE is discriminated against in a variety of ways, e.g., preferentially being created in a direction opposite from the regeneration path of the oscillations of the seed laser pulse beam, e.g., in the ring power amplification stage. Coated optics may be avoided not just in the amplifier gain medium cavity but also, e.g., for the output coupler or in the LNM of the MO, e.g., for the nominal center wavelength selection maximally reflecting mirror (Rmax) or on the grating. Expanding the beam within the amplifier stage cavity, e.g., corresponding to the vertical direction of a Brewster angle window, also can serve to protect optical elements in the ring power oscillator cavity as well as disperse the light to lessen ASE. The output coupler portion of the seed inject mechanism may, e.g., have a reflectivity of around 20% for the desired (in-band) frequencies (or polarization or both) and 100% for undesired light, e.g., ASE, as a further means of ASE reduction. The output coupler may have, e.g., both input and output side surfaces coated with a 100% reflectivity coating for the unwanted light wavelengths, e.g., for ASE which may also, e.g., clean up birefringence induce polarization. Beam expansion may also be able to be performed with multiple prisms, some one or more of which may be inside and/or outside of the chamber enclosure. That is, while one or more of such prisms may be inside the chamber enclosure and exposed to the fluorine containing laser gas mixture, at least one may also be outside the chamber.

Turning now to FIG. 7 there is shown a chart illustrating by way of example a timing and control algorithm according to aspects of an embodiment of the subject matter disclosed. The chart plots laser system output energy as a function of the differential timing of the discharge in the seed laser chamber and the amplification stage, e.g., the ring power amplification stage as curve 600, which is referred to herein as dtMOPO for convenience, recognizing that the amplification stage in some configurations may not strictly speaking be a PO but rather a PA though there is oscillation as opposed to the fixed number of passes through a gain medium in what applicants' assignee has traditionally referred to as a power amplifier, i.e., a PA in applicants' assignee's MOPA XLA-XXX model laser systems, due, e.g., to the ring path length's relation to the integer multiples of the nominal wavelengths. Also illustrated is a representative curve of the ASE generated in the amplification stage of the laser system as a function of dtMOPO, as curve 602. In addition there is shown an illustrative curve 604 representing the change in the bandwidth of the output of the laser system as a function of dtMOPO. Also illustrated is a selected limit for ASE shown as curve 606.

It will be understood that one can select an operating point on the ASE curve at or around the minimum extremum and operate there, e.g., by dithering the control selection of dtMOPA to, e.g., determine the point on the operating curve 602 at which the system is operating. It can be seen that there is quite a bit of leeway to operate around the minimum extremum of the ASE curve 602 while maintaining output pulse energy on the relatively flat top portion of the energy curve to, e.g., maintain laser system output pulse energy and energy σ, and the related dose and dose a constant, within acceptable tolerances. In addition as shown, there can be a concurrent use of dtMOPO to select bandwidth from a range of bandwidths while not interfering with the E control just noted.

This can be accomplished regardless of the nature of the seed laser being used, i.e., a solid state seed or a gas discharge laser seed laser system. Where using a solid state seed laser, however, one of a variety of techniques may be available to select (control) the bandwidth of the seed laser, e.g., by controlling, e.g., the degree of solid state seed laser pumping. Such pump power control may, e.g., put the pumping power at above the lasing threshold in order to select a bandwidth. This selection of bandwidth may shift or change the pertinent values of the curve 604, but the laser system will still be amenable to the type of E and BW control noted above using dtMOPO to select both a BW and concurrently an operating point that maintains the output energy of the laser system pulses at a stable and more or less constant value in the flat top region of the illustrated energy curve 600. It is also possible to use a non-CW solid state seed laser and to adjust the output bandwidth. For example, selection of the output coupler reflectivity of the master oscillator cavity (cavity-Q) can adjust the output bandwidth of the seed laser system. Pulse trimming of the seed laser pulse may also be utilized to control the overall output bandwidth of the laser system.

It can be seen from FIG. 7 that either the selected ASE upper limit or the extent of the portion of the energy curve that remains relatively flat with changes in dtMOPO may limit the range of available bandwidth for selection. The slope and position of the BW curve also can be seen to influence the available operating points on the ASE curve to maintain both a constant energy output and a minimum ASE while also selecting bandwidth from within an available range of bandwidths by use of the selection of a dtMOPO operating value.

It is similarly known that the pulse duration of discharge pulses in a gas discharge seed laser, among other things, e.g., wavefront control may be used to select a nominal bandwidth out of the seed laser and thus also influence the slope and/or position of the BW curve 604 as illustrated by way of example in FIG. 7.

Figure 28:
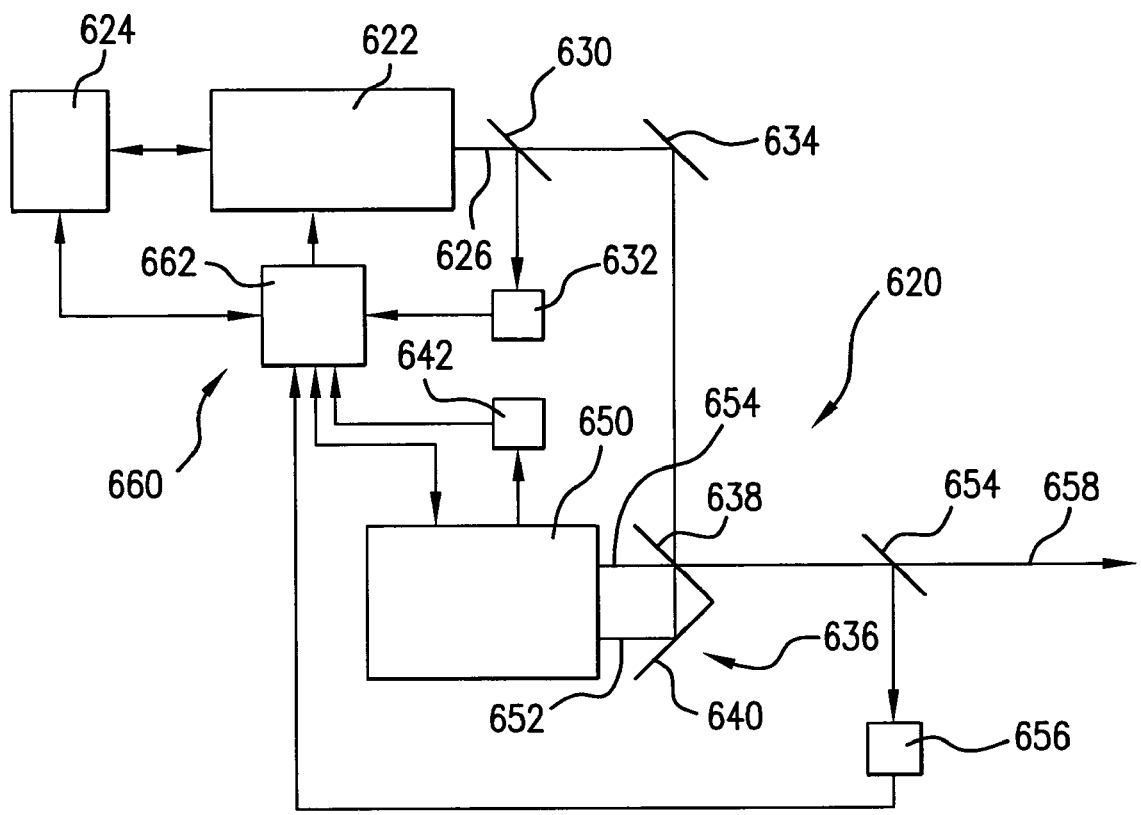
FIG. 28 shows schematically and in block diagram form a laser control system according to aspects of an embodiment of the subject matter disclosed.

Turning now to FIG. 28, there is shown an example in schematic and block diagram form of a laser system controller 620, according to aspects of an embodiment of the subject matter disclosed. The controller 620 may comprise part of a laser system including, e.g., a seed laser 622, such as a gas discharge laser known in the art of the type XeCl, XeF, KrF, ArF or $F_2$ or the like, which may have associated with it a line narrowing module 624, as is known in the art, for selecting a particular nominal center wavelength and at the same time narrowing the bandwidth to the ranges discussed above in the present application. The seed laser 622 may produce a seed laser output beam 626, which may pass through a beam splitter 630 which diverts a small portion of the output beam 626 to a metrology unit metrology module 632, which may include, among other things, an MO energy detector and a wavemeter, measuring, e.g., center wavelength and bandwidth.

The output beam 626 may then be turned by a maximally reflective mirror 634 (for the nominal center wavelength) to a seed injection mechanism 636. the seed injection mechanism may include, e.g., a partially reflective optical element 638 and a maximally reflective optical element 640, and may be two separate elements or a single optic as discussed elsewhere in the present application. As discussed elsewhere, the seed injection mechanism may inject the seed laser output pulse beam 626 into an amplification gain medium, such as a ring power amplification stage 650 along an injection path 652, whereby the pulse beam oscillates in a loop also comprising a return reverse path 654 and the partially reflective input/output coupler 638 until such time as enough amplification in the ring power amplification stage occurs by laser light oscillation in the cavity for the input/output coupler 638 to pass a laser system output light pulse beam 658 on to a tool using the output light. A beam splitter 654 can divert a small portion of the output beam 658 into a metrology unit 656 which may measure, e.g., output energy and bandwidth. A metrology unit 642 connected directly to the amplification gain medium laser 650 which can measure, e.g., ASE in the laser chamber 650.

A controller 660, which may comprise a processor 662, receives inputs from the various metrology units 632, 642 and 656, and others as appropriate, and utilize them as part of control algorithms referenced in one or more of the above noted patents and co-pending applications and also incorporate the control algorithm noted above regarding operating at or around the ASE curve minimum while maintaining energy constant and also selecting bandwidth within the limits imposed by a selected ASE limit. In addition, as is shown in one or more of the above referenced patents and co-pending applications the controller 660 may also control the timing of the creation of an output pulse in the seed laser and the creation of the output pulse in the amplification gain medium (dtMOPO for short) and also provide control signals to the line narrowing module, e.g., to control bandwidth, e.g., by wavefront manipulation or optical surface manipulation as discussed above and in one or more of the above referenced patents and co-pending patent applications.

Figure 29:
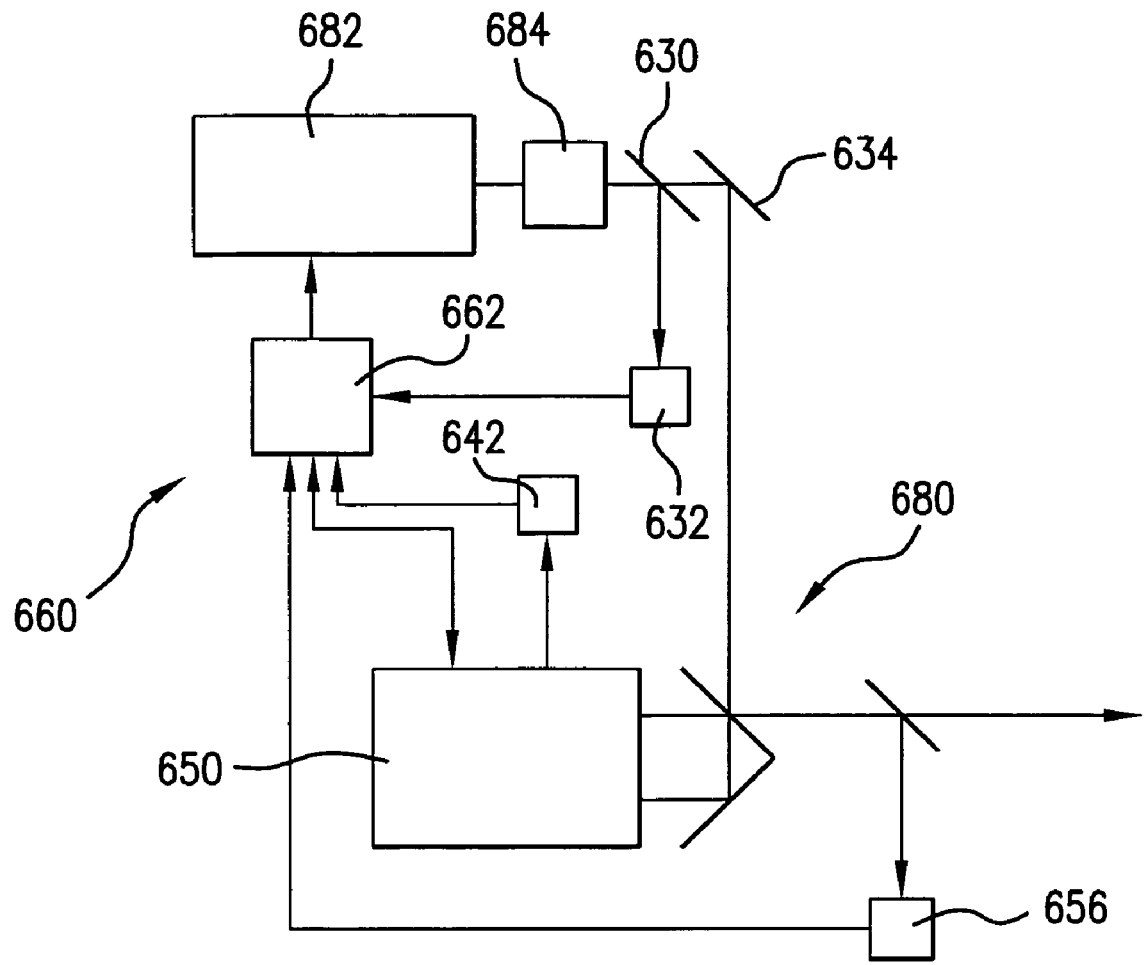
FIG. 29 shows schematically and in block diagram form a laser control system according to aspects of an embodiment of the subject matter disclosed.

Turning now to FIG. 29 there is illustrated schematically and in block diagram form a laser system 680 like that of the laser system 620 of FIG. 28 with the exception that the seed laser 682 is, e.g., a solid state seed laser with an associated frequency converter 684 to, e.g., modify the wavelength of the output of the seed laser 682 to a wavelength suitable for amplification in the amplification gain medium stage 650. In addition, the controller 660 may provide inputs to the seed laser 682 to control both the timing of the creation of the seed laser pulse and the bandwidth, e.g., by modifying the pumping power, as discussed above.

According to aspects of an embodiment of the subject matter disclosed one may need to select an edge optic, that is an optic that may have to be used, and thus perhaps coated, all the way to its edge, which can be difficult. Such an optic could be required, e.g., between the output coupler, e.g., 162 shown in FIG. 2 and the maximum reflector, e.g., 164, shown in FIG. 2, together forming a version of a seed injection mechanism 160, shown in FIG. 2, e.g., depending upon the separation between the two, since there may be too little room to avoid using an edge optic. If so, then the edge optic should be selected to be the Rmax, e.g., because of the ray path of the exiting beam as it passes through the OC portion 162. From a coatings standpoint it would be preferable to have the OC be the edge optic because it has fewer layers. However, an alternative design, according to aspects of an embodiment of the subject matter disclosed has been chose by applicants and is illustrated schematically and by way of example in FIG. 30, e.g., wherein the use of an edge optic can be avoided, e.g., if a large enough spacing is provided between out-going and in-coming ring power amplification stage beams, e.g., as created by the beam expander, 142 shown in FIG. 2, e.g., prisms 146, 148. For example, about a 5 mm spacing between the two beams has been determined to be satisfactory enough to, e.g., to avoid the use of any edge optics.

Figure 30:
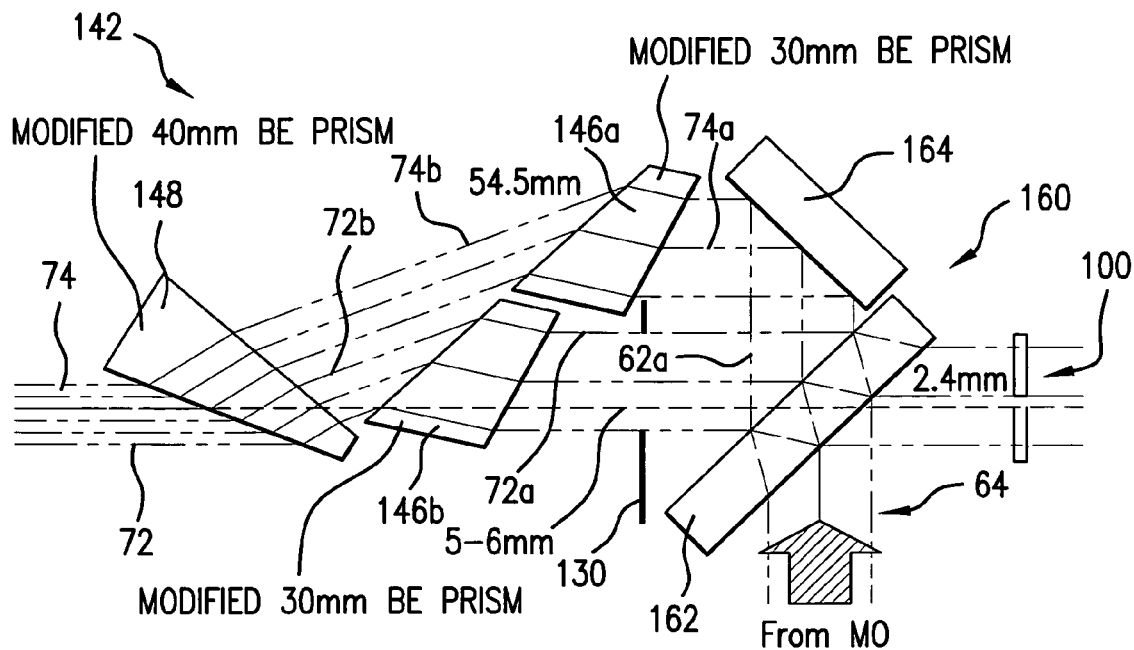
FIG. 30 shows schematically a seed injection mechanism and beam expander according to aspects of an embodiment of the subject matter disclosed.

As illustrated by way of example in FIG. 30 the laser system, e.g., system 110 illustrated by way of example in FIG. 2, may produce a laser system output pulse beam 100. e.g., using a ring power amplification stage 144 to amplify the output beam 62 of a master oscillator 22 in a ring power amplification stage 144. A beam expander/disperser 142, shown in more detail by way of an example of aspects of an embodiment of the subject matter disclosed may be comprised of a first expansion/dispersion prism 146a, and a second expansion/dispersion prism 146b, and a third prism 148.

The seed injection mechanism 160 may comprise a partially reflective input/output coupler 162, and a maximally reflective (Rmax) mirror 164, illustrated by way of example and partly schematically in FIG. 30 in a plan view, i.e., looking down on the seed injection mechanism and m expansion/dispersion 160 and the ring power amplification stage chamber (not shown) into and out of which, respectively the beams 74 and 72 traverse, that is from the perspective of the axis of the output beam 62 traveling from the master oscillator chamber 22, which in such an embodiment as being described may be positioned above the chamber 144 (the beam 62 having been folded into the generally horizontal longitudinal axis as shown (the beam also having been expanded in the MOPuS in its short axis, as described elsewhere, to make it generally a square in cross-sectional shape.

With regard to the configuration of the beam expansion prisms 146a, 146b and 148 inside the ring power amplification stage cavity a similar arrangement may be provided to that of the beam expansion on the output of the power amplifier ("PA") stage in applicants' assignee's XLA-XXX model laser systems, e.g., with a 4× expansion, e.g., provided by a 68.6° incident and 28.1° exit, e.g. on a single prism or on two prisms with the same incident and exit angles. This can serve to, e.g., balance and minimize the total Fresnel losses. Reflectivity coatings, e.g., anti-reflectivity coatings may be avoided on these surfaces since they will experience the highest energy densities in the system. According to aspects of an embodiment of the subject matter disclosed the beam expander/disperser 160 may be implemented with the first prism 146 split into to small prisms 146a, and 146b, which may be, e.g., 33 mm beam expander prisms, e.g., truncated, as shown by way of example in FIG. 30, to fit in the place where one similarly angled prism could fit, with the split prism having a number of advantages, e.g., lower cost and the ability to better align and/or steer the beams 72, 74 (in combination with the beam reverser (not shown in FIG. 30) and the system output beam 100.

The master oscillator seed beam 62 may enter the seed injection mechanism 160 through the beam splitter partially reflective optical element 162, acting as an input/output coupler, to the Rmax 164 as beam 62a, from which it is reflected as beam 74a to the first beam expander prism 146a, which serves to de-magnify the beam in the horizontal axis by about ½× (it remains about 10-11 mm in the vertical axis into the plane of the paper as shown in FIG. 30). The beam 74b is then directed to the second beam expansion prism 148, e.g., a 40 mm beam expansion prism, where it is again de-magnified by about ½× so the total de-magnification is about ¼× to form the beam 74 entering the gain medium of the ring power amplification stage (not shown in FIG. 30. the beam is reversed by the beam reverser, e.g., a beam reverser of the type currently used in applicants' assignee's XLA-XXX model laser system PAs and returns as beam 72 to the prism 148, e.g., having crossed in the gain medium in a bow-tie arrangement or having traveled roughly parallel, perhaps overlapping to some degree in a version of a race-track arrangement. from prism 148 where the beam 72 is expanded by roughly 2× the beam 72 b is directed to prism 142b and is expanded a further approximately 2× into beam 72a. Beam 72a is partially reflected back to the Rmax as part of beam 62a and is partially transmitted as output beam 100, which gradually increases in energy until an output beam pulse of sufficient energy is obtained by lasing oscillation in the ring power amplification stage. The narrowing of the beam entering the amplification gain medium, e.g., the ring power amplification stage has several advantageous results, e.g., confining the horizontal widths of the beam to about the width of the electrical gas discharge between the electrodes in the gain medium (for a bow-tie arrangement the displacement angle between the two beams is so small that they each essentially stay within the discharge width of a few mm even thought they are each about 2-3 mm in horizontal width and for the race track embodiment, the bean 72 or the bean 72 only passes through the gain medium on each round trip, or the beams may be further narrowed, or the discharge widened, so that both beams 72,74 pass through the discharge gain medium in each round trip of the seed beams 72, 74.

The positioning and alignment of the prisms 146a, 146b and 148, especially 146a and 146b can be utilized to insure proper alignment of the output beam 100 from the ring power amplification stage into the laser output light optical train towards the shutter. The beam leaving the input/output coupler 162 may be fixed in size, e.g., in the horizontal direction, e.g., by a horizontal size selection aperture 130, forming a portion of the system aperture (in the horizontal axis) to about 10.5 mm. Another aperture, e.g., in the position roughly of the present PA WEB, e.g., in applicants' assignee's XLA-XXX laser system products, can size the beam in the vertical dimension. Since the beam has about a 1 mRad divergence, the sizing may be slightly smaller in each dimension than the actual beam dimensions wanted at the shutter, e.g., by about 1 mm. According to aspects of an embodiment of the subject matter disclosed applicants propose that a system limiting aperture be positioned just after the main system output OPuS, e.g., a 4× OPus. A ring power amplification stage aperture may be located about 500 mm further inside the laser system. This distance is too great to avoid pointing changes turning into position changes at the specified measurement plane (present system aperture). Instead the limiting system aperture can be located just after the OPuS, and may have a 193 nm reflecting dielectric coating instead of a stainless steel plate commonly used. This design can allow for easier optical alignment, while at the same time reduce heating of this aperture.

According to aspects of an embodiment of the subject matter disclosed, applicants propose to implement a relatively stress-free chamber window arrangement similar to or the same as that discussed in the above referenced co-pending U.S. Patent application, e.g., at least on the bean reverser side of the chamber, because of the use of, e.g., a PCCF coated window a this location.

According to aspects of an embodiment of the subject matter disclosed, applicants propose to, e.g., place ASE detection, e.g., backward propagation ASE detection, in either the LAM or in an MO wavefront engineering box ("WEB"), or in a so-called MOPuS, which can, e.g., include elements of the MOWEB from applicants' assignee's existing XLA-XXX model laser systems along with the mini-OPuSs discussed elsewhere in this application and in the co-pending application Ser. No. 11/980,172 referenced herein, as well as, e.g., beam expansion, e.g., using one or more beam expansion prisms to expand the output beam of the MO in its short axis, e.g., to form generally a square cross-sectional beam. The current MO WEB and its beam turning function is represented schematically as the turning mirror, e.g., 44 shown in FIG. 2. As a preference, however, the backward propagation detector may be placed "in" the MO WEB/MOPuS, that is, e.g., by employing a folding mirror (fold #2), e.g., 44 in FIG. 2, with, e.g., a reflectivity of R=95% instead of R=100% and monitoring the leakage through this mirror 44. Some drift and inaccuracy of this reading may be tolerated, e.g., since it may be utilized as a trip sensor (i.e. measurements in the vicinity of 0.001 mJ when conditions are acceptable—essentially no reverse ASE—as opposed to around 10 mJ when not acceptable—there is reverse ASE), e.g., when the ring power amplifier is not timed to amplify the seed pulse, but still creates broad band laser light. Existing controller, e.g., TEM controller, cabling and ports and the like for new detectors may be employed. The detector may, e.g., be the detector currently used by applicants' assignee on existing XLA-XXX model laser systems to measure beam intensity, e.g., at the laser system output shutter.

According to aspects of an embodiment of the disclosed subject matter one or more mini-OPuS(s), which may be confocal, such that they are highly tolerant to misalignment and thus of potentially low aberration, e.g., for the off-axis rays needed in the proposed short OPuS(s), the so-called mini-OPuS, can have delay times of 4 ns and 5 ns respectively, where more than one is employed. These values were chosen so that both OPuSs exhibit low wavefront distortion with spherical optics in addition to appropriate delay paths for coherence busting. The low wavefront requirement may actually prevent significant speckle reduction from the mini-OPuS(s) unless an angular fan-out from the output of the mini-OPuS(s) is generated, e.g., by replacing a flat/flat compensating plate with a slightly wedged plate, so that the transmitted beam and the delayed beam in the mini-OPuS are slightly angularly offset from each other. The laser beam, e.g., from the master oscillator is partially coherent, which leads to speckle in the beam. Angularly offsetting the reflected beam(s) reentering the mini-OPuS output with the transmitted beam, along with the delay path separation of the main pulse into the main pulse and daughter pulses, can achieve very significant speckle reduction, e.g., at the wafer or at the annealing workpiece, arising from the reduction in the coherence of the laser light source pulse illuminating the workpiece (wafer or crystallization panel). This can be achieved, e.g., by intentionally misaligning the delay path mirrors, probably not possible with a confocal arrangement, but also with the addition of a slight wedge in the delay path prior to the beam splitter reflecting part of the delayed beam into the output with the transmitted beam and its parent pulse and preceding daughter pulses, if any. For example, a 1 milliradian wedge in the plate will produce an angular offset in the reflected daughter pulse beam of 0.86 milliradians.

Figure 48:
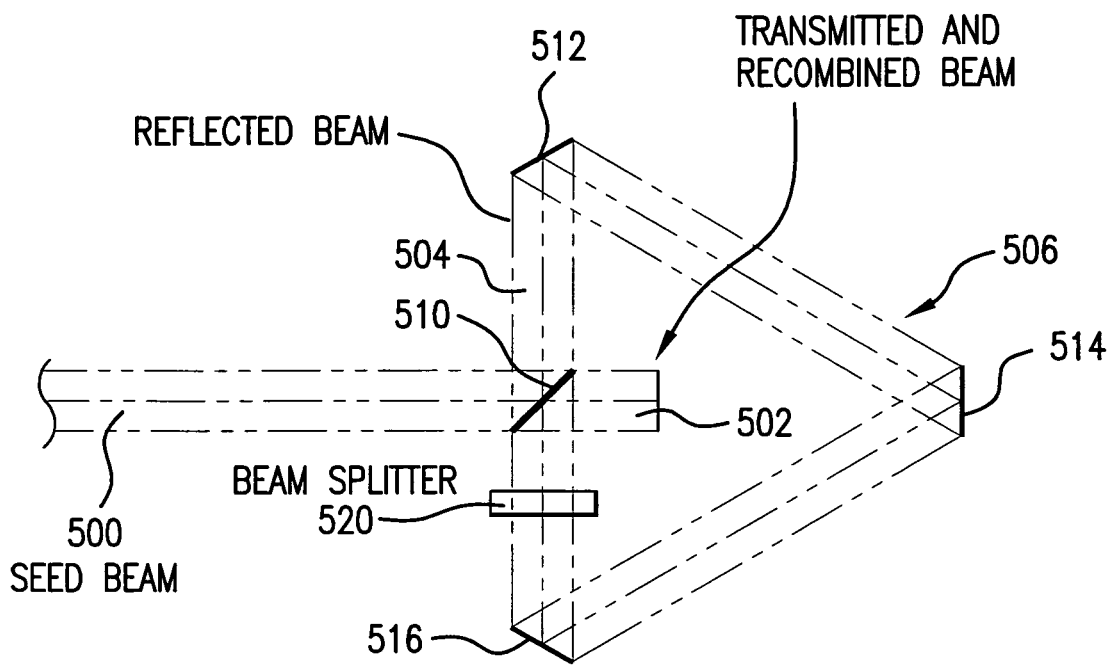
FIG. 48 shows schematically a coherence buster optical delay path according to aspects of an embodiment of the disclosed subject matter.

The optical delay path(s) of the mini-OPuS(s) may have other beneficial results in terms of laser performance and efficiency. According to aspects of an embodiment of the disclosed subject matter, as illustrated schematically in FIG. 48, the laser beam, e.g., seed beam 500 from the seed source laser (not shown in FIG. 48, may be split into two beams 502, 504 using a partially reflective mirror (beam splitter) 510. This mirror 510 transmits a percentage of the beam into the main beam 502 and reflects the rest of the beam 500 as beam 504 into an optical delay path 506. The part 502 that is transmitted continues into the rest of the laser system (not shown in FIG. 48). The part 504 that is reflected is directed along a delay path 506 including, e.g., mirrors 512, 514 and 516, with mirror 514 being displaced perpendicularly to the plane of the paper in the schematic illustration, in order to allow the main beam 502 to reenter the rest of the laser system, e.g., to form a laser output beam or for amplification in a subsequent amplification stage. The beam 504 may then be recombined with the transmitted portion 502 of the original beam 500. The delayed beam 504 may be passed through a wedge (compensator plate) 520 essentially perpendicularly arranged in the path of beam 504. Thus, the daughter pulse beam(s) 504 from the delay path 506 are slightly angularly displaced from the main part of the beam in the transmitted portion 502 in the far field. The displacement may be, e.g., between about 50 and 500 μRad.

The length of the delay path 506 will delay the beam pulses so that there is a slight temporal shift between the part of the beam that is transmitted and the part that is reflected, e.g., more than the coherence length, but much less than the pulse length, e.g., about 1-5 ns. By selecting the appropriate path length, which determines the delay time, the addition of the two beams can be such that the energy in the pulse is spread into a slightly longer $T_{is}$, which in combination with later pulse stretching in the main OPuS(s) can improve laser performance, as well as providing other beneficial laser performance benefits.

Figure 49:
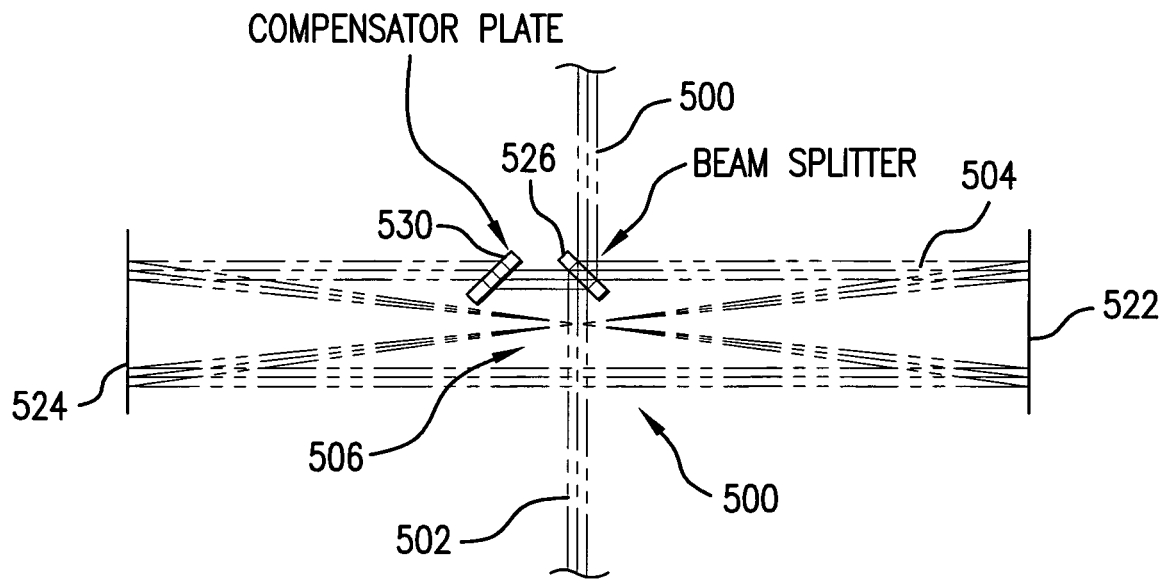
FIG. 49 shows schematically a coherence buster optical delay path according to aspects of an embodiment of the disclosed subject matter.

Two mini-OPuSs may be needed to achieve the desired effect. The offset time between the pulses from the two mini-OPuss may be, e.g., one nanosecond. Based upon optical and mechanical considerations, the delays selected for the stretchers may be, e.g., a 3 ns delay path in the first mini-OPus and a 4 ns delay path in the second. If the delay is shorter, the optical system, e.g., if it uses confocal or spherical mirrors can introduce unacceptable aberrations. If the delay is longer, it may be difficult to fit the system into the available space in the laser cabinet. The distance the beam must travel to achieve the 3 ns delay is 900 mm and to delay by 4 ns is 1200 mm. A confocal optical system 520, minimizing the sensitivity to misalignment, illustrated schematically in FIG. 49 may consist of two mirrors 522, 524, whose focal points are located at the same position in space and whose center of curvatures are located at the opposite mirror, along with a beam splitter 526. A compensator plate 530 (e.g., a wedge) can be added to insure that the reflected beam and the transmitted beam are slightly misaligned as noted above with respect to FIG. 48. In this case, the compensator plate is placed in the path of the delayed beam at an angle for proper functioning.

The delay path time(s) in the mini-OPuS(s) for coherence busting and other purposes may be as short as about the temporal coherence length and as long as practical due to the noted optical and space considerations, such as misalignment and aberration tolerance. If there are two or more mini-OPuSs then the delay path in each must be different in length, e.g., by more than the coherence length and selected such that there is no significant coherence reaction (increase) due to the interaction of daughter pulses from the separate OPuS(s). For example the delay path times could be separated by at least a coherence length and by not more than some amount, e.g., four or five coherence lengths, depending on the optical arrangement.

According to aspects of an embodiment of the subject matter disclosed applicants propose to employ a coherence-busting optical structure that, e.g., generates multiple sub-pulses delayed sequentially from a single input pulse, wherein also each sub-pulse is delayed from the following sub-pulse by more than the coherence length of the light, and in addition with the pointing of each sub-pulse intentionally chirped by an amount less than the divergence of the input pulse. In addition applicants propose to utilize a pair of coherence-busting optical delay structures, where the optical delay time difference between the pair of optical delay structures is more than the coherence length of the input light. Each of the two optical delay structures may also generate sub-pulses with controlled chirped pointing as noted in regard to the aspects of the previously described coherence busting optical delay structure.

According to aspects of an embodiment of the disclosed subject matter two imaging mini-OPuSs, which may be confocal, such that they are highly tolerant to misalignment and thus of potentially low aberration, e.g., for the off-axis rays needed in the proposed short OPuSs, the so-called mini-OPuSs, and can have delay times of 4 ns and 5 ns respectively. These values were chosen so that both OPuSs exhibit low wavefront distortion with spherical optics. The low wavefront requirement may prevent significant speckle reduction from the mini-OPuSs unless an angular fan-out from the mini-OPuSs is generated, e.g., by replacing a flat/flat compensating plate with the slightly wedged plate.

It will be understood by those skilled in the art that according to aspects of an embodiment of the disclosed subject matter, adequate coherence busting may be achieved sufficiently to significantly reduce the effects of speckle on the treatment of a workpiece being exposed to illumination from the laser system, such as in integrated circuit photolithography photoresist exposure (including the impact on line edge roughness and line width roughness) or laser heating, e.g., for laser annealing of amorphous silicon on a glass substrate for low temperature recrystallization processes. This may be accomplished by, e.g., passing the laser beam, either from a single chamber laser system or from the output of a multi-chamber laser system or from the seed laser in such a multi-chamber laser system before amplification in another chamber of the multi-chamber laser system, through an optical arrangement that splits the output beam into pulses and daughter pulses and recombines the pulses and daughter pulses into a single beam with the pulses and daughter pulses angularly displaced from each other by a slight amount, e.g., between, e.g., about 50 µRad and 500 µRad and with each of the daughter pulses having been delayed from the main pulse(s), e.g., by at least the temporal coherence length and preferably more than the temporal coherence length.

This may be done in an optical beam delay path having a beam splitter to transmit a main beam and inject a portion of the beam into a delay path and then recombining the main beam with the delayed beam. In the recombination, the two beams, main and delayed, may be very slightly angularly offset from each other (pointed differently) in the far field, referred to herein as imparting a pointing chirp. The delay path may be selected to be longer than the temporal coherence length of the pulses.

The angular displacement may be accomplished using a wedge in the optical delay path prior to the delayed beam returning to the beam splitter which wedge imparts a slightly different pointing to the delayed beam (a pointing chirp). The amount of pointing chirp, as noted above may be, e.g., between about 50 and 500 µRad.

The optical delay paths may comprise two delay paths in series, each with a respective beam splitter. In such an event each delay path can be different in length such that there is not created a coherence effect between the main and daughter pulses from the respective delay paths For example, if the delay in the first delay path is 1 ns the delay in the second delay path could be about 3 ns and if the delay in the first delay path is 3 ns the delay in the second could be about 4 ns.

The wedges in the two separate delay paths may be arranged generally othogonally to each other with respect to the beam profile, such that the wedge in the first delay path can serve to reduce coherence (speckle) in one axis and the wedge in the other delay path can reduce coherence (speckle) in the other axis, generally orthogonal to the first. Thus, the impact on speckle, e.g., contribution to line edge roughness ("LER") and/or line width roughness ("LWR"), e.g., at the wafer in exposure of photoresist in an integrated circuit manufacturing process can be reduced along feature dimensions in two different axes on the wafer.

According to aspects of an embodiment of the subject matter disclosed, with, e.g., a 6 mRad cross of the bowtie in a bowtie ring power amplification stage, the magnification prisms inside the ring cavity may be slightly different for the in-going and outgoing beams, and could be arranged so that the beam grows slightly as it travels around the ring or shrinks slightly as it travels around the ring. Alternatively, and preferably according to aspects of an embodiment of the subject matter disclosed, a result of breaking the larger beam expansion prism into two separate pieces, e.g., enabled by larger spacing between out-going and in-coming beams, e.g., about 5-6 mm, as illustrated by way of example in FIG. 30, applicants propose to adjust the angles of the two prisms, e.g., 146, 148 shown schematically in FIG. 4, such that they result in the same magnification for both out-going and in-coming beams, e.g., beams 100 and 62, respectively, shown illustratively and schematically in FIG. 30.

According to aspects of an embodiment of the subject matter disclosed applicants propose to place the Rmax, e.g., 164 and the OC, e.g., 162 portions of the version of the seed injection mechanism containing an Rmax 164 and an OC 162, e.g., along with the positioning of the system horizontal axis beam output aperture on that same stage. This enables, e.g., prior alignment of each as an entire unit and removes the need for field alignment of the individual components. This can allow, e.g., for the position of the Rmax/OC assembly, e.g., 160, shown in FIG. 2 (a seed injection mechanism) to be fixed, just like the OC location in a applicants' assignee's single chamber oscillator systems (e.g., XLS 7000 model laser systems) is fixed. Similarly, such an arrangement can allow for the achievement of tolerances such that the Rmax/OC are positioned relative to the system aperture properly without need for significant ongoing adjustment. The beam expansion prism may be moveable for alignment of the injection seed mechanism assembly with the chamber 144 of the amplification gain medium and the output beam 100 path with the laser system optical axis.

According to aspects of an embodiment of the subject matter disclosed applicants propose to position a mechanical shutter to block the MO output from entering the ring, when appropriate, similar to such as are utilized on applicants' assignee's OPuSs, e.g., to block them during alignment and diagnosis. The exact location could be, e.g., just above the last folding mirror prior to the ring power amplification stage, where the mini-OPuSes are protected during unseeded ring power amplification stage alignment and operation.

It will be understood by those skilled in the art that there is disclosed herein an apparatus and a method for use of a line narrowed pulsed excimer or molecular fluorine gas discharge laser system which may comprise a seed laser oscillator producing an output comprising a laser output light beam of pulses comprising: a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser output light beam of pulses, which may comprise a ring power amplification stage. The ring power amplification stage may comprise an injection mechanism which may comprise a partially reflecting optical element, e.g., a beam splitter, which may be a partially reflective optical element and may be polarization sensitive, through which the seed laser oscillator output light beam is injected into the ring power amplification stage. The seed laser oscillator may provide an output at less than 1 mJ, and may be as low as, e.g., around 1-10 µJ. The ring power amplification stage may comprise a bow-tie loop or a race track loop. The pulse energy of the output of the seed laser oscillator may be less than or equal to 0.1 mJ, or 0.2 mJ, or 0.5 mJ, or 0.75 mJ. The ring power amplification stage may amplify the output of the seed laser oscillator cavity to a pulse energy of over 1 mJ, or 2 mJ, or 5 mJ, or 10 mJ or 15 mJ. The laser system may operate at, e.g., an output pulse repetition rate of up to 12 kHz, or $\geq 2$ and $\leq 8$ kHz or $\geq 4$ and $\leq 6$ kHz. The laser system may comprise a seed laser oscillator producing an output comprising a laser output light beam of pulses which may comprise a first gas discharge excimer or molecular fluorine laser chamber; a laser amplification stage containing an amplifying gain medium in a second gas discharge excimer or molecular fluorine laser chamber receiving the output of the seed laser oscillator and amplifying the output of the seed laser oscillator to form a laser system output comprising a laser output light beam of pulses, which may comprise a ring power amplification stage. The laser system may operating within a matrix of operating values that can serve to optimize laser lifetime and produce other advantageous results including better pulse energy stability and the like, e.g., the seed laser oscillator containing a lasing gas comprising a mixture of fluorine and other gases and operating at $\leq 350$ kPa of total lasing gas pressure, or $\leq 300$ kPa of total lasing gas pressure, or $\leq 250$ kPa of total lasing gas pressure, or $\leq 200$ kPa of total lasing gas pressure or $\geq 35$ kPa of fluorine partial pressure, or $\geq 30$ kPa of fluorine partial pressure, $\geq 25$ kPa of fluorine partial pressure, or $\geq 20$ kPa of fluorine partial pressure and combinations of the above. The system may further comprise a coherence busting mechanism intermediate the seed laser oscillator and the ring power amplification stage. The coherence busting mechanism may sufficiently destroy the coherence of the output of the seed laser reduce speckle effects in a processing tool using the light from the laser system. The coherence busting mechanism may comprise a first axis coherence busing mechanism and a second axis coherence busing mechanism. The coherence busting mechanism may comprise a beam sweeping mechanism. The beam sweeping mechanism may be driven in one axis by a first time varying actuation signal. The beam sweeping mechanism may be driven in another axis by a second time varying actuation signal. The first actuation signal may comprise a ramp signal and the second actuation signal may comprise a sinusoid. The time varying signal(s) may have a frequency such that at least one full cycle occurs within the time duration of a seed laser output pulse. The coherence busting mechanism may comprise an optical delay path with misaligned optics producing a hall of mirrors effect. The coherence busting mechanism may comprise an optical delay path longer than the coherence length of the seed laser output pulse. The coherence busting mechanism may comprise an active optical coherency busting mechanism and a passive optical coherency busting mechanism. The active coherence busting mechanism may comprise a beam sweeping device and the passive coherence busting mechanism may comprise an optical delay path. The coherence busting mechanism may comprise a first optical delay path with a delay longer than the coherence length of the seed laser output pulse and a second optical delay path in series with the first optical delay path and having a delay longer than the coherence length of the seed laser output pulse. The delay of the second optical delay path may be greater than or equal to about 3 times the coherence length of the seed laser output pulse. The coherence busting mechanism may comprise a pulse stretcher. The pulse stretcher may comprise a negative imaging optical delay path. The pulse stretcher may comprise a six mirror OPuS. The coherence busting mechanism may a beam flipping mechanism. The system and method may comprise the use of a line narrowed pulsed excimer or molecular fluorine gas discharge laser system which may comprise a seed laser oscillator producing an output comprising a laser output light beam of pulses which may comprise a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser output light beam of pulses, which may comprise a ring power amplification stage; a coherence busting mechanism intermediate the seed laser oscillator and the ring power amplification stage. The ring power amplification stage may comprise an injection mechanism comprising a partially reflecting optical element through which the seed laser oscillator output light beam is injected into the ring power amplification stage. The system and method may comprise the use of a broad band pulsed excimer or molecular fluorine gas discharge laser system which may comprise a seed laser oscillator producing an output comprising a laser output light beam of pulses which may comprise a first gas discharge excimer or molecular fluorine laser chamber; a laser amplification stage containing an amplifying gain medium in a second gas discharge excimer or molecular fluorine laser chamber receiving the output of the seed laser oscillator and amplifying the output of the seed laser oscillator to form a laser system output comprising a laser output light beam of pulses, which may comprise a ring power amplification stage; a coherence busting mechanism intermediate the seed laser oscillator and the ring power amplification stage. The ring power amplification stage may comprise an injection mechanism comprising a partially reflecting optical element through which the seed laser oscillator output light beam is injected into the ring power amplification stage. The system and method may comprise the use of a pulsed excimer or molecular fluorine gas discharge laser system which may comprise a seed laser oscillator producing an output comprising a laser output light beam of pulses which may comprise a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser output light beam of pulses; e.g., a MOPA or MOPO configured dual chamber seed laser/amplifying laser system, such as applicants' assignee's MOPA XLA-XXX model laser systems, and further comprising a coherence busting mechanism, of the kind(s) discussed herein, intermediate the seed laser oscillator and the amplifying gain medium stage. The amplification stage may comprise a laser oscillation cavity. The amplification stage comprising an optical path defining a fixed number of passes through the amplifying gain medium.

The laser system, e.g., for lithography use may operate within a matrix of MO operating conditions. The pulse energy of the output of the seed laser oscillator being less than or equal to 0.1 mJ, or 0.2 mJ, or 0.5 mJ, or 0.75 mJ. The ring power amplification stage may amplify the output of the broad band seed laser oscillator cavity to a pulse energy of over 1 mJ, or 2 mJ, or 5 mJ, or 10 mJ or 15 mJ. The laser system may operating at an output pulse repetition rate of up to 12 kHz, or $\geq 2$ and $\leq 8$ kHz or $\geq 4$ and $\leq 6$ kHz. The system may comprise the seed laser oscillator containing a lasing gas comprising a mixture of fluorine and other gases and operating at $\leq 350$ kPa of total lasing gas pressure, or $\leq 300$ kPa of total lasing gas pressure, or $\leq 250$ kPa of total lasing gas pressure, or $\leq 200$ kPa of total lasing gas pressure. The system may comprise $\leq 35$ kPa of fluorine partial pressure, or $\leq 30$ kPa of fluorine partial pressure, $\leq 25$ kPa of fluorine partial pressure, or $\leq 20$ kPa of fluorine partial pressure.

Figure 32:
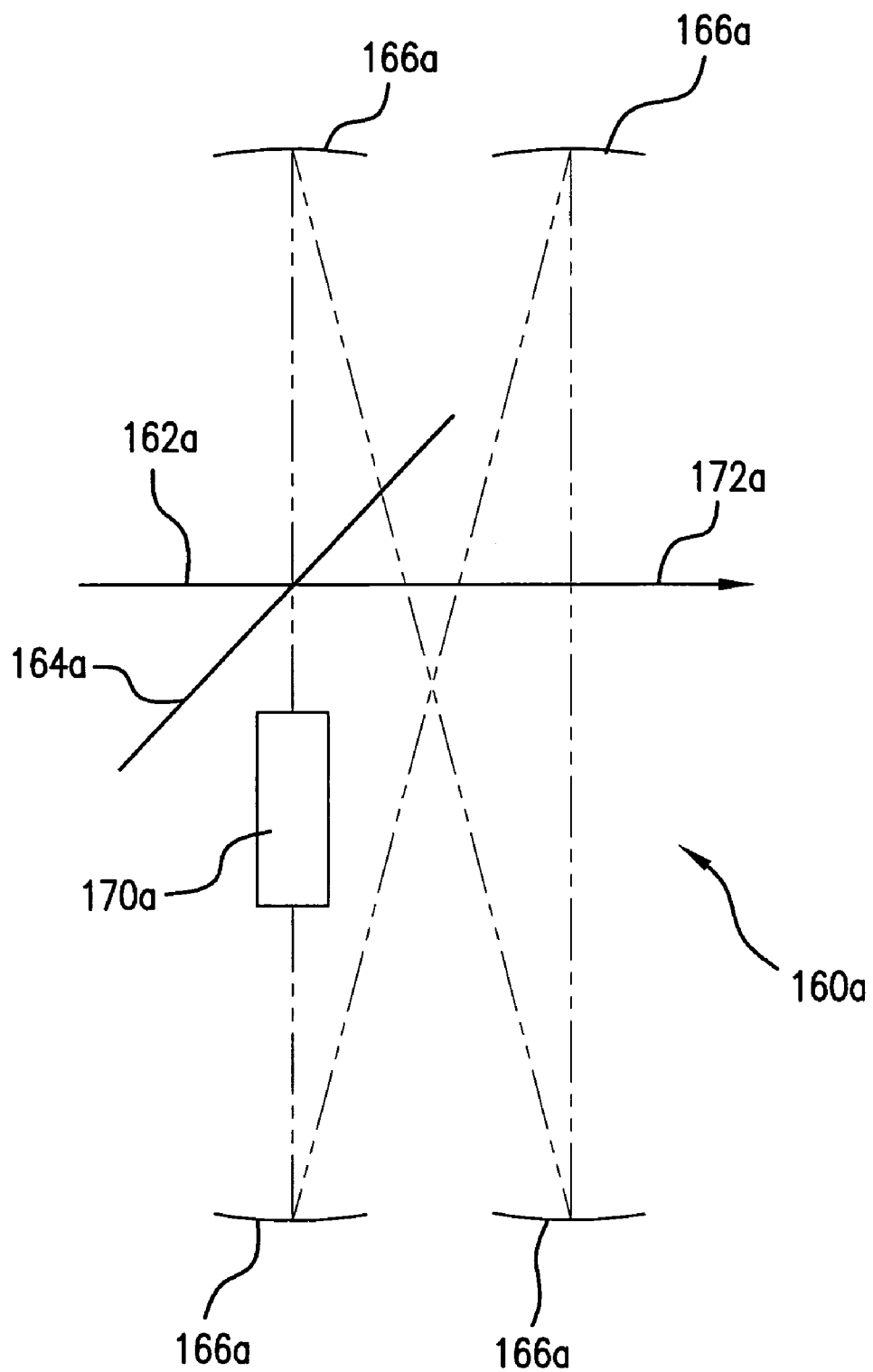
FIG. 32 shows schematically a coherence buster according to aspects of am embodiment of the present invention.

Turning now to FIG. 32 there is shown in schematic form a pulse stretcher 160a, which can be, e.g., a version of the optical pulse stretcher ("OPuS") sold with applicants' assignee's laser systems however with, e.g., much shortened delay paths not designed for pulse stretching per se, i.e., enough stretching for significant pulse elongation in the spatial and temporal domains, e.g., increasing the $T_{is}$ by 4× or more as in applicants' assignee's currently sold OPuS pulse stretchers. However, the same folding/inverse imaging effects on the beam for coherency busting purposes, or also as explained in regard to the beam mixer of FIG. 31, can be achieved.

The coherency buster 160a may have an input beam 162a incident on a beam splitter 164a, e.g., a partially reflective mirror 164a for the pertinent wavelength. Part of the beam 162a that is reflected into the delay path comprised of a plurality of mirrors, e.g., confocal mirrors 166a, is negatively imaged, e.g., twice, and on the final leg of the delay path pass through a pulse trimmer 170a. It will be understood that such optical coherence busters may have more than four mirrors, e.g., six mirrors, but are illustrated schematically with only four for convenience and clarity. A portion of the light exiting the pulse trimmer 170a is reflected into the output beam 172a and a portion reenters the delay path. The delay path may be much shorter than the seven to ten meters or so of, e.g., a 4× OPus, such that the second and third passes through the delay path do not substantially overlap the pulses entering and leaving the coherency buster 160a, but rather do not even substantially stretch the pulses. There may be, however, overlapping in the high frequency components of the pulses, which serves in coherence busting. The pulse trimmer 160a may be used, e.g., to shorten the ultimate output pulse 172a, e.g., by cutting off a portion of the pulse circulating in the coherency buster delay path using the pulse trimmer 170a, or much or all or substantially all of the second and subsequent passes through the delay path. The pulse trimmer 170a may be, e.g., a Pockels cell or other suitable fast acting light transmission switch, e.g., a light beam modulator/deflector, e.g., an electro-optic or acousto-optic device, e.g., a crystal that changes refractive index when excited by a field, e.g., an electric field, an acoustic field or a magnetic field.

Figure 33:
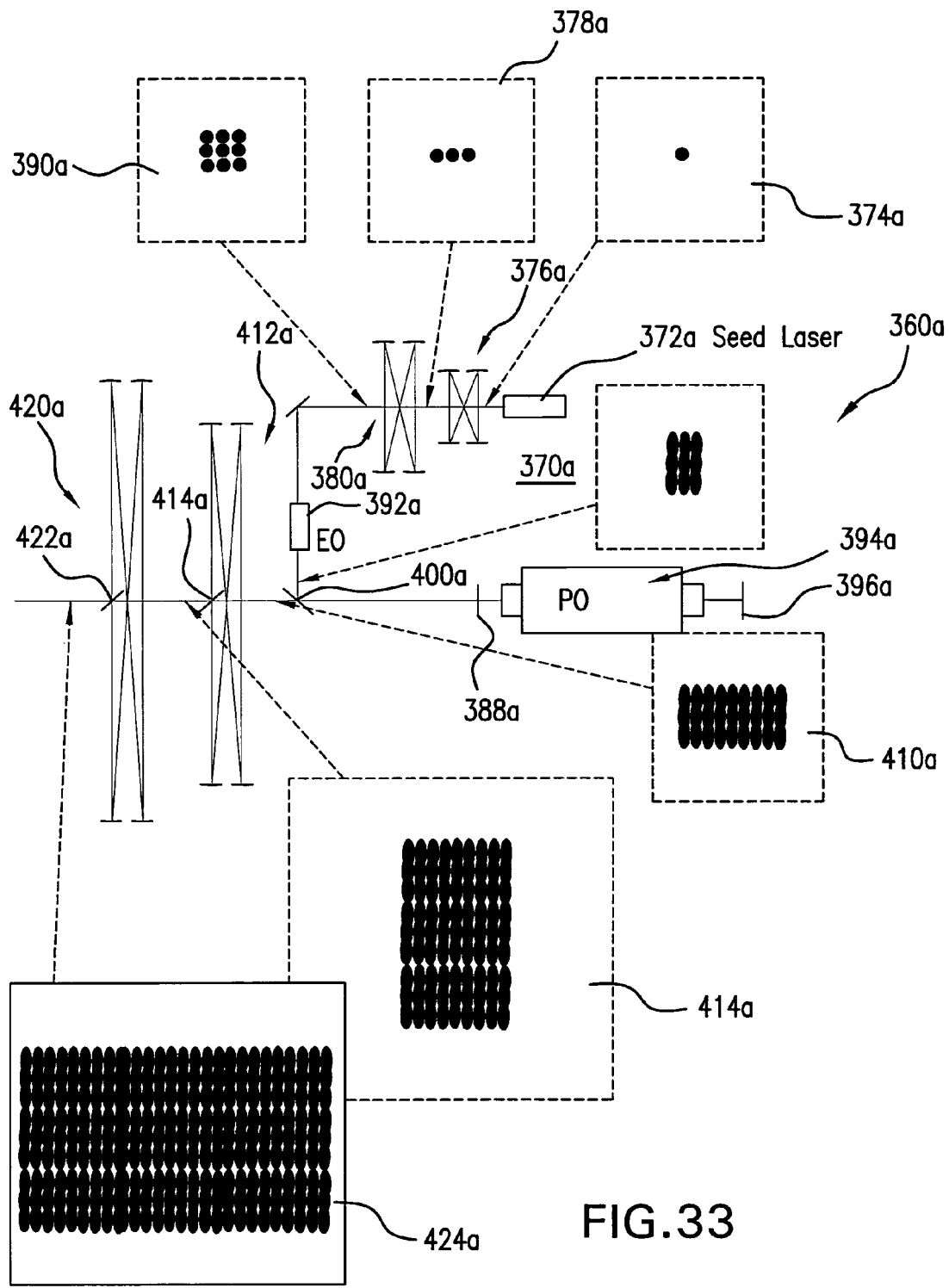
FIG. 33 shows partly schematically and partly in block diagram for an example of elements of a coherence busting scheme and the results of aspects of the scheme according to aspects of an embodiment of the disclosed subject matter.

FIG. 33 shows partly schematically and partly in block diagram form an example of a coherence busting scheme 360a and the results of aspects of the scheme according to aspects of an embodiment of the disclosed subject matter, e.g., in terms of beam divergence and thus coherence busting. The illustrated system may incorporate, e.g., an oscillator/amplifier laser 370a, e.g., including a solid state or excimer seed laser 372a, and an oscillator amplifier laser 394a, or other power amplification stage, e.g., a ring power amplification stage. The amplifier gain medium 394a may be, e.g., an excimer laser arranged in a power oscillator configuration, e.g., with a fully reflective rear cavity mirror 396a and an input/output coupler, e.g., 398a. It will be understood that other seed laser/amplification stage arrangements, some of which are discussed herein, may also be used with the schematically illustrated coherence busting scheme shown by way of example in FIG. 33.

At the output of the seed laser 372a is illustrated a representation of the seed laser output laser light pulse beam pulse coherency 374a containing a single dot indicative of relatively high coherency. The output of the seed laser 372a may be passed through one or more coherency busters, e.g., 376a, 378a, e.g., as shown by example in FIG. 32, or 1050 illustrated in FIG. 31 (discussed in more detail in the co-pending application Ser. No. 11/447,380 or other optical elements such as disclosed in US20050286599, referenced above, or one or more mini-OPuS coherence busting mechanisms discussed above, or combinations thereof. A possible embodiment according to aspects of an embodiment of the disclosed subject matter may be the use of a confocal OPuS, e.g., one like that disclosed in the co-pending U.S. patent application Ser. Ser. No. 10/847,799, entitled LASER OUTPUT LIGHT PULSE STRETCHER, filed on May 18, 2004, referenced above, with, e.g., two confocal spherical mirrors and four passes of delay path, i.e., from the beam splitter to mirror No. 1 to mirror No. 1 and back to mirror No. 2 and then returned to the beam splitter, passing through, e.g., an offset correction optic, e.g., as discussed in the co-pending U.S. patent application Ser. No. 11/394,512, entitled CONFOCAL PULSE STRETCHER, filed on Mar. 31, 2006, referenced above. This version of a so-called "mini-OpuS" may comprise two pulse stretchers in series, e.g., with a delay path offset selected to slightly shift the high frequency peaks in the temporal pulse intensity curve of the output of the master oscillator, such that individual mini-peaks superimposed on the general humped or multi-humped shape of the output pulse from the MO become interleaved in the treated pulse, which is beneficial in reducing speckle. This may be achieved by, e.g., a delay offset of about 2 ns for a first 1 ns and then three ns delay line mini-OPuS pair or about a 1 ns delay between a 3 ns and 4 ns delay line mini-OPuS pair in series or for a 4 ns and 5 ns delay line mini-OPus in series. It will be understood that the pulse itself will not be stretched significantly, e.g., to come even close to overlap other pulses, but rather will essentially not be stretched at all, since the delay path is so much shorter than the ten or so meters of delay path in the normal pulse stretching OPuSs currently sold by applicants' assignee.

The preferred embodiment uses a first delay something more than Ins due to increased alignment problems with the shorter delay and increased aberrations in the pulse as stretched in a shorter delay path. Each of the delay paths is, however longer than the coherence length of the pulse and the second delay path is longer than the first, to achieve coherence busting, e.g., due to high frequency mini-peak interleaving effects discussed herein.

The mini-OPuS pulse stretchers may be selected and arranged to, e.g., fold the beam on itself or fan it out in first one axis, e.g., in a first mini-OPus 376a, resulting in the coherency representation 378a and then in another orthogonally related axis, e.g., in a second mini-OPuS 380a, resulting, e.g., in the coherency representation 390a. A pulse trimmer/pulse steerer 392a, e.g., and electro-optical ("E-O") element 392a may sweep (paint) the seed beam into the input/output coupler 400a of the amplifier portion 394a resulting in the blurring in one axis as shown in the pulse coherency representation out of the power oscillator 410a (and also the coherence representation 410 into the amplification gain stage 394a). The "regular" or "standard" OPuS, e.g., a 4× $T_{is}$ OPuS (roughly tem meters of delay path), which may contain, e.g., 2 delay paths 412a, 420a initiated by a first beam splitter 414a and a second beam splitter 422a, similarly may be arranged to fold the beam on itself in first one axis and then a second resulting, e.g., in the pulse coherency representations of, respectively, 414a and 424a. The final coherency representation 424a shows schematically that the coherency of the seed beam has been greatly reduced, i.e., the beam has been smeared in its passage from the seed laser 372a to the amplifier gain medium 394a and as amplified in the amplifier gain medium 394a and subsequently further having its coherency busted in the 4× regular OPuS 412a, 420a.

It will be understood by those skilled in the art that depending on the initial coherency of the pulse, e.g., out of the seed laser, e.g., almost completely coherent in the case of solid state seed lasers to very little coherency, but still coherency that is desired to be even further reduced, e.g., with an excimer seed laser the type, number and arrangement of coherency busting elements may vary. For example, it may only be necessary to do active coherency busting, e.g., with one form or another of pulse steering/painting, for solid state seed lasers, and this may in some cases for some applications prove to need only a ramp or only AC pulse deflection, i.e., in one axis or the other, or may prove to need both DC and AC pulse painting (Hybrid painting) along with OPuS effect coherency busting both between the MO and amplifier gain medium, e.g., PO or PA or other amplification gain medium stage, e.g., a ring power amplification stage, and also may need to employ the effect of the regular OPuS pulse stretcher(s) on the output of the amplifier gain medium. With an excimer gas discharge laser MO, with relatively much lower coherency than from a solid state seed laser, only passive coherency busting, e.g., between the MO and gain amplifier medium may be needed, e.g., with one or both of the mini-OPuSs 376, 380 or other passive optical elements as noted above between the MO and amplifier gain medium.

One may still need, however, to do beam steering also, e.g., with an active beam steering mechanism for even more smearing of the pulse (more divergence), that may be less essential and need a smaller sweeping angle. Such a seed laser mini-OPuS is believed to need approximately only a 1 foot total path delay each and can also be conveniently built onto the seed laser optical table as is currently the practice for relay optics in applicants' assignee's XLA series laser systems.

Figure 34:
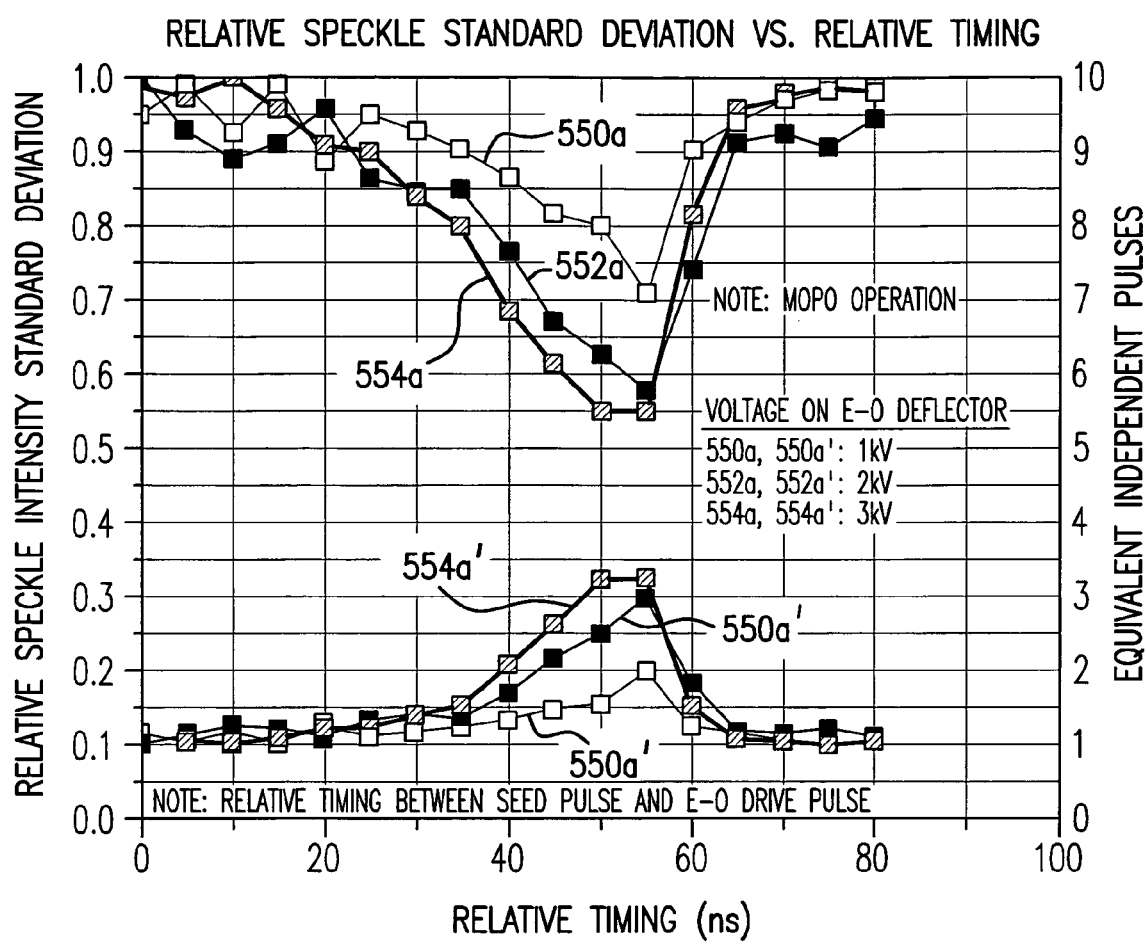
FIG. 34 illustrates relative speckle intensity for a various E-O deflector voltages related to relative timing between the E-O and the pulse generation in the seed laser according to aspects of an embodiment of the disclosed subject matter.

FIG. 34 illustrates an exemplary relative speckle intensity for a 1 kV E-O deflector voltage v. relative timing. The relative standard deviation curve 550a is for 1 kV and the equivalent pulse curve is curve 550a'. A 2 kV E-O deflector voltage curve 552a and equivalent pulse curve 552a' are also shown as is a 3 kV E-O deflector voltage curve 554a and equivalent pulse curve 554a'. An example of a point shift vs. E-O voltage curve 560a is shown by way of example in FIG. 35.

Figure 36:
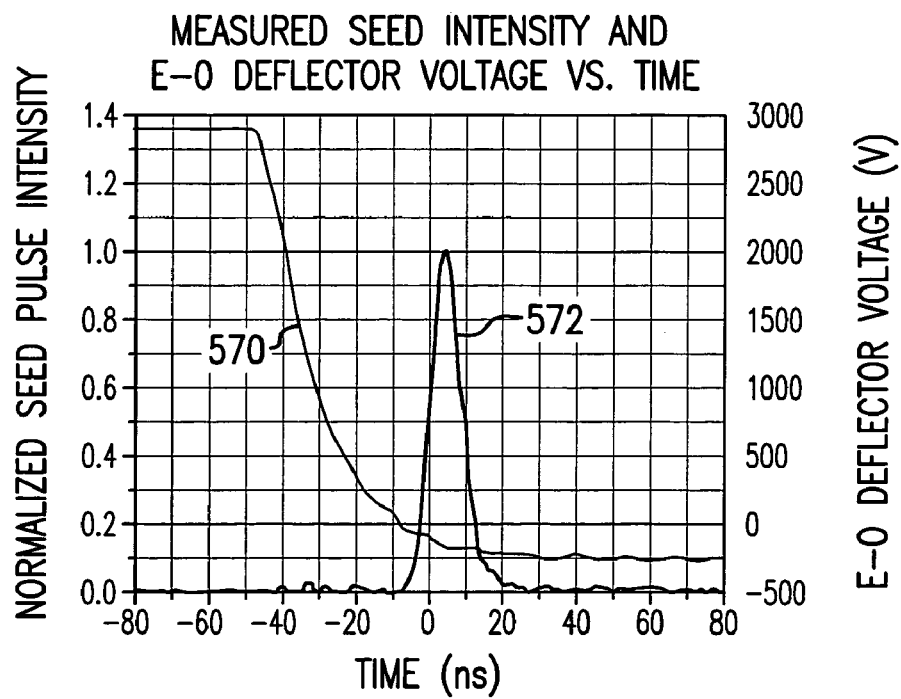
FIG. 36 illustrates an example of the timing of an E-O deflection voltage and a seed laser pulse spectrum according to aspects of an embodiment of the disclosed subject matter.
Figure 44:
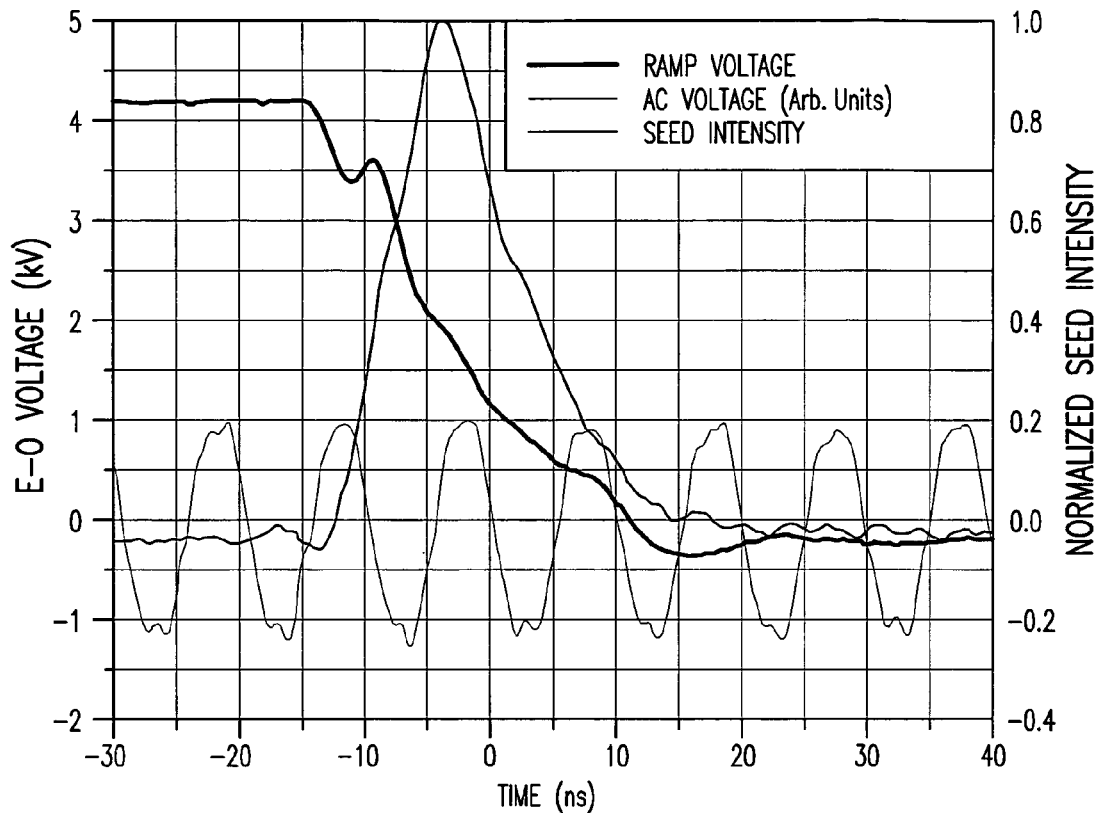
FIG. 44 illustrates a test E-O supply voltage with respect to a seed pulse intensity spectrum over time, according to aspects of an embodiment of the disclosed subject matter.

According to aspects of an embodiment of the disclosed subject matter it is contemplated to apply a time changing voltage on a timescale similar to the seed pulse duration, e.g., by applying a DC voltage level until triggered, at which point the high voltage may be shorted to ground, e.g., via a stack of fast MOSFETS, e.g., illustrated schematically in FIG. 44 as a single transistor 1130a. A plot of the applied voltage and the seed laser pulse shape are shown in FIG. 36. Placing a series resister between the E-O cell terminal and voltage supply can be used to control, e.g., the voltage slope applied to the E-O cell. The 50 pF capacitance of the E-O cell in series with, e.g., a 200Ω resister gives an initial slope of about $10^{11}$ μrad/s. The voltage across the E-O cell drops, e.g., as seen in FIG. 36 from the DC level to nearly zero in a time similar to the seed pulse duration. By changing the relative timing between the E-O cell pulser and the seed laser one can, e.g., change the amount of pointing sweep that occurs during the seed pulse. In addition, one can change the value of the initial DC voltage to effect a greater or lesser pointing sweep during the seed pulse. Applicants have tested this fast pointing capability, e.g., with the seed laser only and reflecting from an OC only, therefore, with no OPuS effect from the multiple reflections from the OC and Rmax and no effects due to MOPO operation. Without optimizing for relative timing between the E-O cell and the seed pulse, applicants captured speckle patterns for a range of timing between the two. Applicants applied three difference levels of DC voltage to the E-O cell in order to change the maximum available pointing slope. The results showed a minimum speckle intensity normalized standard deviation at about 57 ns relative timing as seen, e.g., in FIG. 34. Without any angular shift during the seed pulse, at both small and large relative timing values, below and above 57 ns the speckle contrast is high. This correlates with values found by applicants during static testing. When, e.g., the relative timing places the E-O Cell voltage slope coincident with the seed pulse, the speckle pattern of a single pulse is smeared in the vertical direction, in a dramatic and satisfactory way.

One can normalize these contrast values to the maximum value in order to evaluate the percentage reduction in contrast, e.g., brought about by the dynamic pointing shift. At the optimum relative timing point the speckle contrast was found to be reduced to about 40% of its peak. Using the $1/\sqrt{N}$ assumption for equivalent number of independent pulses the data can be used to derive the number of pulses required to achieve this level of speckle contrast reduction. At the optimum relative timing, and with 3 kV applied to the E-O cell, the contrast reduction was found to be equivalent to 6 pulses. Even higher voltage levels (and thus even larger pointing shift during a single pulse) could improve this result. Applicants performed similar measurements with the seed laser pulse entering the MOPO amplification stage cavity, but no discharges between the AMPLIFICATION STAGE electrodes and noted that reflections from the OC and the Rmax in the XeF cavity, from the OPuS effect, beam spreading alone, indicated that the maximum speckle contrast was reduced by the amount predicted by the OPuS effect (N=1.56 with a 20% OC, giving $1/\sqrt{n}=0.80$. Thus 70% contrast becomes 56%). The effect of smearing, even though the initial speckle contrast is lower, appears not to change when adding the secondary reflections from the full XeF cavity. The equivalent pulse for speckle reduction is still about 6.

Applicants performed similar measurements with AMPLIFICATION STAGE cavity electrodes discharging and thus implicating the effects of the amplification within the AMPLIFICATION STAGE cavity, which indicated as shown in FIG. 34 the decrease in the impact on speckle reduction through seed beam sweeping. With such a configuration, the effect was found to be just over half of the equivalent number of pulses produced, i.e., about 3, when operating as a MOPO, also found was a rather large reduction in peak speckle contrast, with no smearing. Previous measurements of MOPO operation showed a reduction equivalent to about 6 pulses. These results show a reduction equivalent to about 8 pulses. Applicants suspect that the AMPLIFICATION STAGE cavity may discriminate against off-axis ray angles, e.g., in a flat-flat cavity, and thus the spray of angles sent into the cavity may not all be equally amplified (this could be corrected, e.g., with a true stable cavity, e.g., employing a curved OC and a curved Rmax). Another explanation may be that not all of the seed pulse takes part in controlling the AMPLIFICATION STAGE characteristics. Maybe only, e.g., the first 5 ns of the seed pulse's 10-15 ns pulse duration controls the AMPLIFICATION STAGE and thus the E-O sweep is not fast enough to occur within that smaller window. This may also be corrected, e.g., by using a smaller resister and a shorter sweep.

Figure 37A:
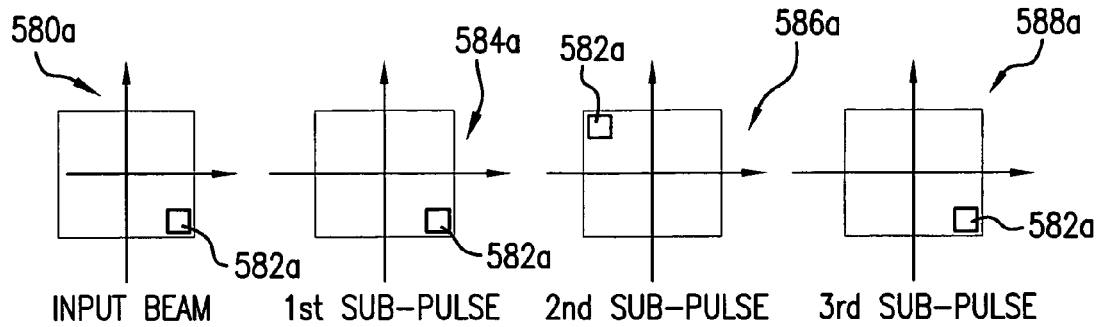
FIGS. 37A and B illustrate the effect on beam coherency from folding a beam upon itself according to aspects of an embodiment of the disclosed subject matter.
Figure 37B:
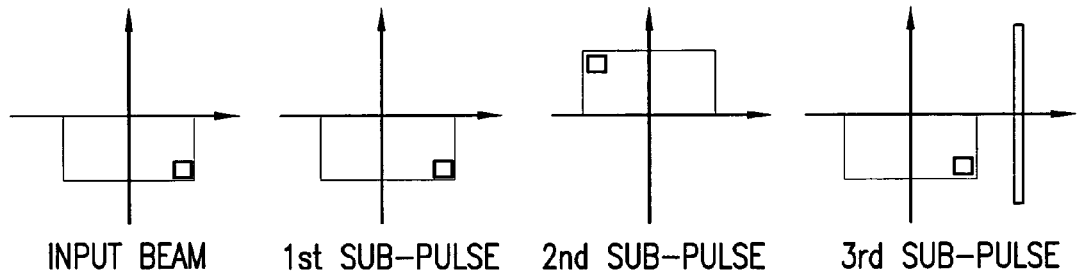

According to aspects of an embodiment of the disclosed subject matter applicants propose to use a 6 mirror coherency busting mechanism (for convenience herein optical pulse delay paths are indicated schematically as having four mirrors per delay path) which has been developed by applicants' assignee for additional path delay inside either or both of the $1^{st}$ or $2^{nd}$ pulse stretchers in the OPuS used with applicants' assignee's XLA model multi-chamber laser systems. Such a delay path can, e.g., produce −1 imaging for each sub-pulse. This is illustrated schematically and in cartoon fashion, e.g., in FIG. 37A wherein is illustrated the summation of these "flipped" sub-pulses. The flipped sub-pulses shown, e.g., in FIG. 37B can be used, e.g., for improved profile uniformity and symmetry. A 6 mirror design can convert pointing shifts into a divergence increase which may, e.g., be beneficial in a ring arrangement for ASE reduction. The standard 4 mirror design does not. It will be understood that the delay path for this coherency busting purpose need not be as long as the actual OPuS used for pulse stretching to get a much increased pulse $T_{is}$, e.g., for photolithography uses. Rather the coherency busting mechanism, a so-called "mini-OPuS", just needs to fold the pulses a certain number of times. This is illustrated by the pulse 580a, with the corner (pre-flip) designated 582a and the pulses 584a, 586a, 588a. In addition, due to the almost inevitable misalignment of mirrors in the delay path, a "hall of mirrors" or so-called OPuS effect, may also reduce the coherency in the seed laser pulse, and, e.g., so long as the delay path exceeds the spatial coherency length of the beam further coherency busing occurs in the delay path. In this regard, a four mirror mini-OPuS, e.g., with confocal spherical mirrors for ease of alignment, may serve as a satisfactory coherency buster, even without beam flipping in both axis.

Figure 41:
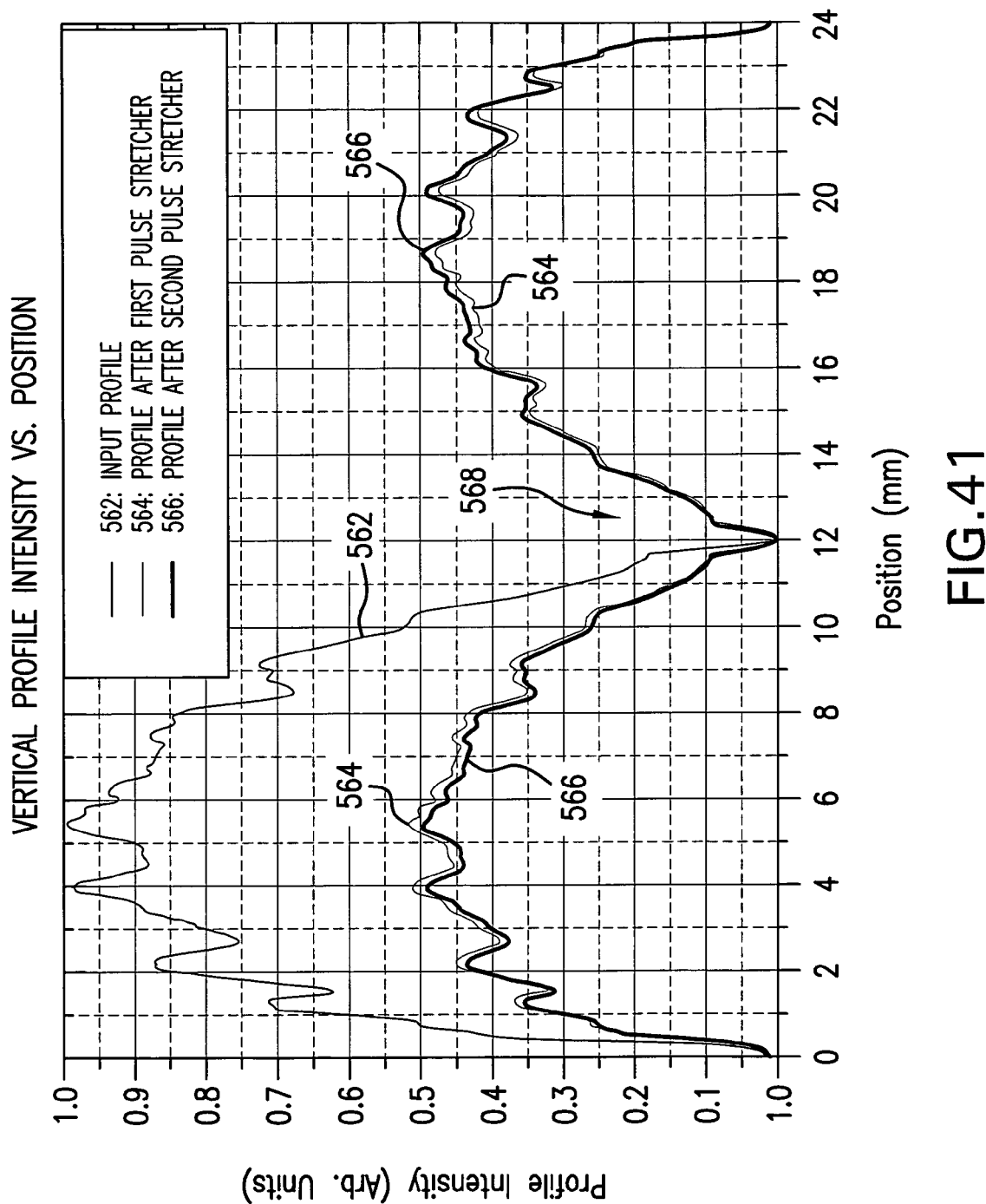
FIG. 41 illustrates results of simulated beam pulse flipping results.

According to aspects of an embodiment of the disclosed subject matter it may be necessary to combine two separate laser beams at various points within a system according to aspects of an embodiment of the disclosed subject matter. If only half of the entrance to a 6 mirror pulse stretcher is illuminated, the sub-pulses flip between top and bottom as shown, e.g., in FIG. 37B. The summation of these "flipped" sub-pulses can lead to a filled in, full size profile, e.g., as illustrated in the pulse flipping simulation shown in FIG. 41, with the curve 562a showing the pulse before entering the delay path and curve 564a (black) after one delay path and 566a (red) after a second delay path. Laser divergence may then be used to fill in the center portion 568a, e.g., after some propagation, e.g., over about 1 m or so.

Use of a solid state laser source for lithography has been proposed in the past and not pursued for two reasons. Solid state lasers are not considered capable of the high average power required for lithography and a solid state laser produces single mode output which is highly (perfectly) coherent. According to aspects of an embodiment of the disclosed subject matter applicants propose to address the low average power problem with, e.g., a hybrid solid state seed/excimer amplifier combination. The high coherence properties of the solid state seed can be addressed in a number of ways according to aspects of embodiments of the disclosed subject matter, e.g., by creating sub-pulses, e.g., that are separated in time longer than the coherence length, or by, e.g., changing the seed laser pointing, e.g., over very short time scales, e.g., within a single laser pulse, or a combination of both. Coherency busting has been found by applicants to be of benefit in dual chamber gas discharge (e.g. excimer) seed/gas discharge (e.g., excimer) amplifier portion lasers as well.

Figure 38:
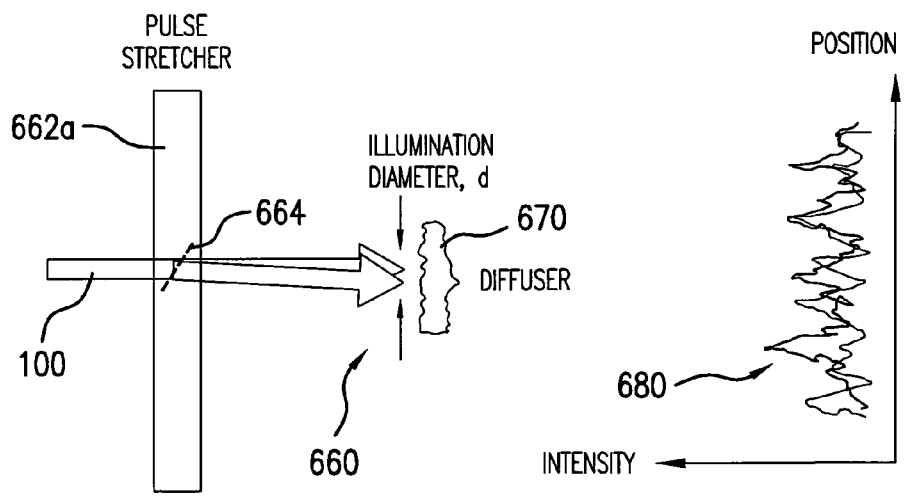
FIG. 38 illustrates the effect of beam sweeping/painting on coherency according to aspects of an embodiment of the disclosed subject matter.

De-phasing of a speckle pattern can be seen from a diffuser 670a to occur with a $\lambda/2d$ where d is the illumination distance for a slot aperture and diameter for a circular aperture, e.g., as illustrated schematically and in cartoon fashion in FIG. 38. Incoherence of a speckle pattern can also be seen to occur from each sub-pulse produced by a pulse stretcher, which can, e.g., be further exploited by, e.g., intentionally misaligning each pulse stretcher, e.g., a mirror(s) in the pulse stretcher, by a very slight amount. In point of fact, applicants' employer has discovered by testing that it is very hard to precisely align the mirrors in, e.g., an $4 \times T_{is}$ OPuS type of pulse stretcher, and they are slightly out of alignment almost all the time, without having to intentionally misalign them. This amount of "ordinary" misalignment has been found by applicants' employer to be an amount sufficient to achieve a desired level of speckle reduction and is illustrated schematically in FIG. 40, as discussed elsewhere.

The effective number of equivalent independent laser pulses can be seen to be equal to the $T_{is}$ magnification of the each pulse stretcher. Each OPuS pulse stretcher of the kind noted above may have a multiplication of around ~2.4×. With, e.g., three stages of pulse stretching, the number of independent sub-pulses will be $(2.4)^3=13.8$. Since speckle contrast scales with the number of independent sub-pulses, N, as $1/\sqrt{N}$, pulse stretchers can provide an output speckle contrast of $1\sqrt{13.8}=26.9\%$ with an input speckle contrast of 100%. Since this may still be too high a speckle contrast, according to aspects of an embodiment of the disclosed subject matter a mechanism(s) may be provided to reduce the speckle contrast into or out of the pulse stretcher(s). The same can be said for the so-called mini-OPuSs discussed elsewhere.

Pulse trimming has been demonstrated, e.g., with the utilization of electro-optics, e.g., at 193 nm. Rather than polarization rotation, used in some other forms of pulse trimming, electro-optics can be used for beam steering, e.g., steering a seed laser light pulse beam within a single pulse in the beam. Utilization of such, e.g., at the output of the seed laser, can result in, e.g., according to aspects of an embodiment of the disclosed subject matter, the electro-optic material(s) only needing to be subject to a low average power seed laser beam. By, e.g., randomly and/or continuously changing the beam steering, e.g., within a single laser pulse, the angular acceptance of the power amplification stage can be "painted" or filled in for each laser pulse. As a result, a main pulse can have a divergence set, e.g., by the MO/power amplification stage optical configuration and not, e.g., by the seed laser characteristics. A greatly reduced coherence for the laser system output laser light pulse can be the result.

According to aspects of an embodiment of the disclosed subject matter an injection controlled amplifier laser system, e.g., with a plane cavity and flat rear mirror, may have suitable energy stability, e.g., for seed pulse inject energies in the range of 0.0085 to 0.99 mJ. This energy of the beam may be, e.g., incident on the rear mirror of, e.g., a power amplification stage, which may form the input coupler from the seed laser. This reflector may have, e.g., about a 90% reflection and about 8% transmission. Therefore, the seeding energy entering the amplification stage cavity itself may be, e.g., about an order of magnitude smaller than what is incident onto the back reflector. With a ring cavity, especially with a partially reflecting seed injection mechanism according to aspects of an embodiment of the disclosed subject matter, discussed elsewhere herein, e.g., the input seed energy may be much less wasted, e.g., admitting around 80% of the seed laser light. An Rmax and OC can be in an $F_2$ containing environment, and thus more robust, though, e.g., if polarization coupling is used, coupling efficiency may still be less than optimum for certain applications. A suitable architecture, e.g., in a MOPA configuration may be a 2-channel ("tic-toc") solid state seed laser, e.g., a $3^{rd}$ harmonic Nd:YLF MO or Nd:YAG system (tuned, e.g., to 351 nm) along with a pair of two 3-pass XeF PA modules. Such a system in a MOPO, e.g., a master oscillator/power amplification stage (such as a ring power oscillator amplification stage) configuration is also considered as an effective alternative. Such a two channel MOPO approach may be similar to the MOPA configuration, i.e., with two seeded power oscillators. Various coupling techniques could be used, e.g., MO coupling using a polarization technique or a seed inject mechanism. Efficiency v. $E_{mo}$ for differing PO/PA configurations has been found to be better for a MOPO or a three pass MOPA, though four pass MOPAs were not tested. Exemplary pulse width (FWHM) has been found to be for an MOPO about 17.3 ns, for a MOPA, single pass, about 13.9 ns and for a MOPA triple pass about 12.7 ns.

Applicants have examined speckle patters for decorrelation with angular shift, e.g., in a MOPO output beam, e.g., with a Nd-YLF seed laser and a XeF power oscillator (e.g., a flat-flat polarization coupled arrangement). With the relative timing between the XeF discharge and the seed laser pulse adjusted and angular and spatial adjustment also made for maximum suppression of the weak line (353) produced by the XeF gain.

The maximum intensity of the seed pulse has been observed to occur during the initial, very low level, fluorescence of the amplification stage. This very low level fluorescence (and thus gain) is believed to be enhanced by this seed light, as observed in MOPO output. Adjustment of the timing of the seed earlier than or later than, e.g., about 20 or so ns before the amplification stage firing can, e.g., lead to an increase in weak line output, an indication of, e.g., when the "primordial" photons are generated in the AMPLIFICATION STAGE.

Figure 39:
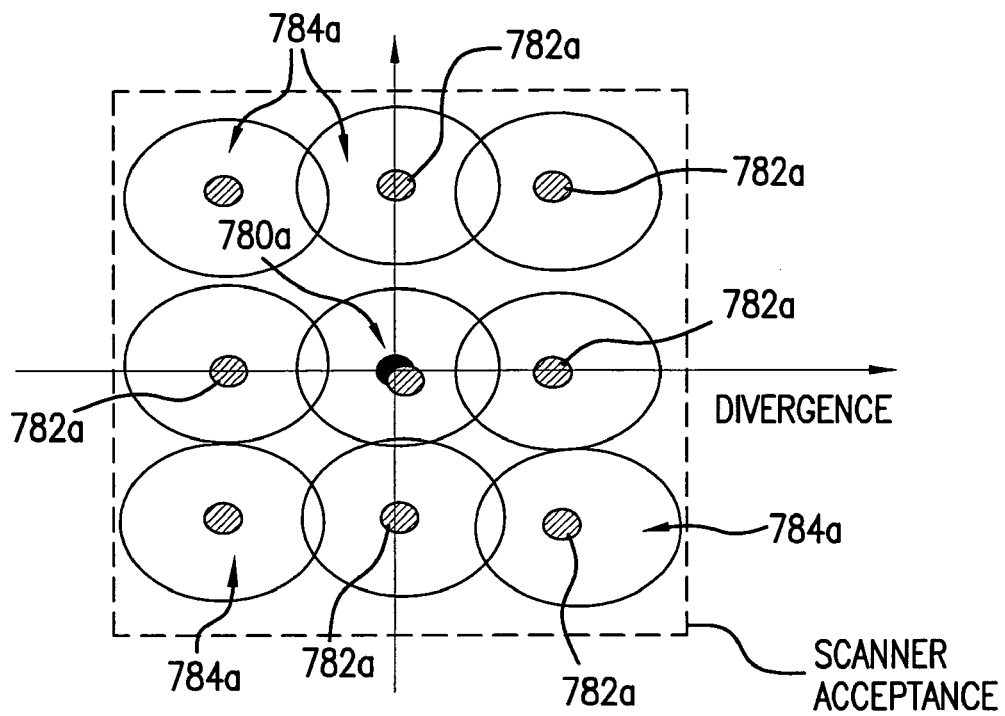
FIG. 39 shows schematically and in cartoon fashion the effects of multiple coherence busing schemes.

FIG. 39 illustrates schematically the results of a coherency busting scheme on an output laser pulse, e.g., in relation to a scanner acceptance window, e.g., introducing horizontal and vertical (as illustrated in the plane of the page drawing of FIG. 39) directions. The dot 780a illustrated schematically and by way of example an initial seed laser output pulse profile 780a. The pattern of pulses 782a illustrate a pattern of sub-pulse profiles 782a after beam folding in a perfectly aligned beam delay path, or through a misaligned beam delay path or both, or a combination thereof, and the circles 784a around each represent the effect on the profile of electro-optical smearing.

Figure 40:
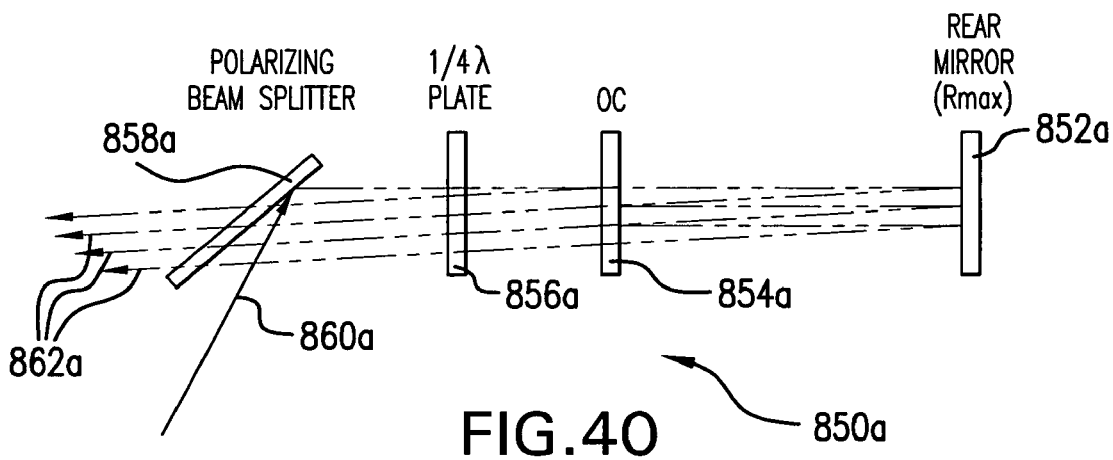
FIG. 40 illustrates schematically a coherency reduction scheme according to aspects of an embodiment of the disclosed subject matter.

Turning now to FIG. 40 there is shown a schematic representation of the effects of coherence busting according to aspects of an embodiment of the disclosed subject matter. Utilizing an imaging delay path, e.g., a pulse stretcher, e.g., a so-called optical pulse stretcher ("OPuS"), e.g., a 4× $T_{is}$ six mirror OPuS sold with the above noted applicants' assignee's laser systems, and illustrated in United States patents and co-pending applications noted above, or a modified version thereof with a shorter delay path used, e.g., for folding the beam on itself and/or for delay exceeding the coherence length as discussed above, the so-called mini-OPuS, one can achieve a degree of coherence busting, e.g., between the MO and amplifier gain medium, e.g., a PA or a PO or a ring power amplification stage. Other forms of coherence busting e.g., as illustrated in FIG. 31 could be used alone or in combination with such a "mini-OPuS," e.g., as illustrated in FIG. 33 and elsewhere herein.

Figure 42:
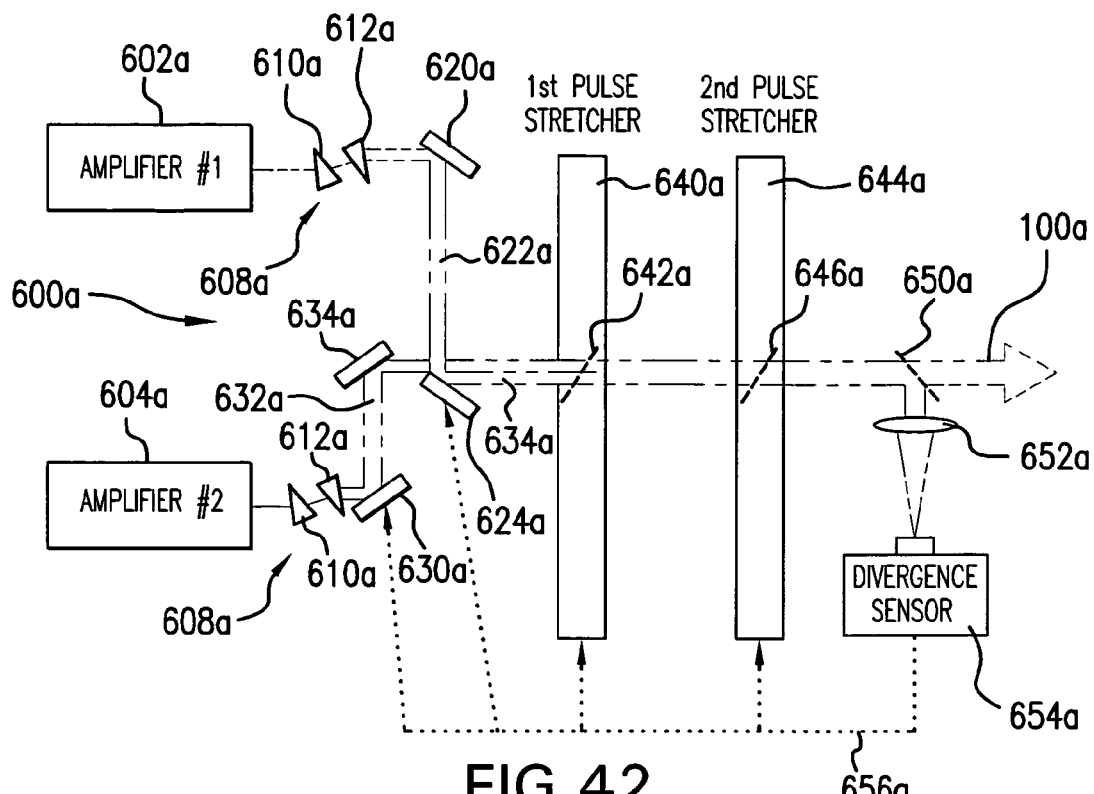
FIG. 42 illustrates schematically and in partly block diagram form a beam combiner with divergence control according to aspects of an embodiment of the disclosed subject matter.

According to aspects of an embodiment of the disclosed subject matter, the pointing/divergence sensitivity of a pulse stretcher, e.g., a 4 mirror 6 mirror pulse stretcher, e.g., a regular OPuS such as a 4× $T_{is}$ OPuS, or a so-called mini-OPuS, or the delay path discussed in more detail in regard to FIG. 31, can be put to advantage, e.g., by adding active mirror control with feedback from, e.g., a pointing/divergence sensor, illustrated, e.g., in FIGS. 13, 14 and 42. Such advantages include creating, e.g., a hall of mirrors effect whereby, e.g., the laser output light pulse beam being smoothed in the delay path and, further, actually becomes something like a plurality of beams of very slightly different pointing and thus angles of incidence on the various mirrors of the pulse stretcher. Applicants assignee has observed this in pulse stretchers where it is very difficult to perfectly align the mirrors, e.g., of the currently used 4× $T_{is}$ OPuS pulse stretcher, thus creating the hall of mirrors effect that reduces the coherence of the laser output light pulse beam exiting the pulse stretcher. Thus the beam 860a forms a plurality of separate beams 82a. In FIG. 40 this is also illustrated schematically and as a result of a flat-flat cavity 850a with slightly misaligned mirrors forming the rear of the cavity 852a and an output coupler 854a, but the same effect has been observed in an OPuS by applicants employer with the coherence busting effect noted above. The cavity illustrated in FIG. 40 may also have a polarizing input coupler 858a and a quarter wave plate 856a.

FIG. 40 illustrates a reduction in coherency, e.g., when using both the reflectivity of an OC and an Rmax, e.g., in a flat-flat cavity with, e.g., a polarizing input coupling from a seed laser source of seed laser pulses. The angles have been exaggerated for clarity of illustration. There are, e.g., multiple rays produced by a static fan out, i.e., "hall of mirrors" effect, e.g., created between the OC and the Rmax. The theoretical energy weighting of these rays, assuming no transmission losses through the cavity and perfect reflectivity is shown below.

| Ray Number | Fractional Energy | Normalized Energy |
|---|---|---|
| 1 | 0.2 = 0.200 | 0.3125 |
| 2 | 0.8*0.8 = 0.640 | 1.000 |
| 3 | 0.8*0.2*0.8 = 0.128 | 0.2000 |
| 4 | 0.8*0.2*0.2*0.8 = 0.0256 | 0.0400 |
| 5 | 0.8*0.2*0.2*0.2*0.8 = 0.00512 | 0.0080 |
| 6 | 0.8*0.2*0.2*0.2*0.2*0.8 = 0.00102 | 0.0016 |

One may assume that each ray is incoherent from all others, e.g., where the path length between the OC and the Rmax is maintained to be longer than the temporal coherence length. Each ray may also be assumed, e.g., to be angled slightly different from all others since, e.g., perfect alignment is believed to be extremely difficult, especially in the vertical direction. Applicants believe that about 37 μrad of angle difference in the vertical direction is needed to create uncorrelated speckle. Summing the normalized energy weighting to give the equivalent number of independent pulses and taking the square root to give the reduction in standard deviation, the sum from the above is 1.56. The square root is 1.25 and thus the standard deviation when using both OC and Rmax reflections is predicted to be 0.551/1.25=0.440, which comports well with a value that applicants have measured, i.e., 0.427.

Static fan out, otherwise referred to herein as a hall of mirrors effect, believed to be essentially unavoidable with manual alignment, produces a single pulse speckle contrast with amplification in an amplification gain medium that is 2.50× smaller than the seed laser alone. This reduction is the equivalent of 6.3 uncorrelated sub-pulses. Some of this contrast reduction is due to the weak line content from the XeF power oscillator used for testing the effects of the oscillation amplification stage, but most is believed to be due to the static fan out effect. Likely, many of the sub-pulses created by the OPuS-like static fan out characteristics of the OC-Rmax (OC-rear cavity mirror) reflections are all amplified to nearly equal intensities and thus create more equivalent independent pulses than shown in the above table.

Figure 46:
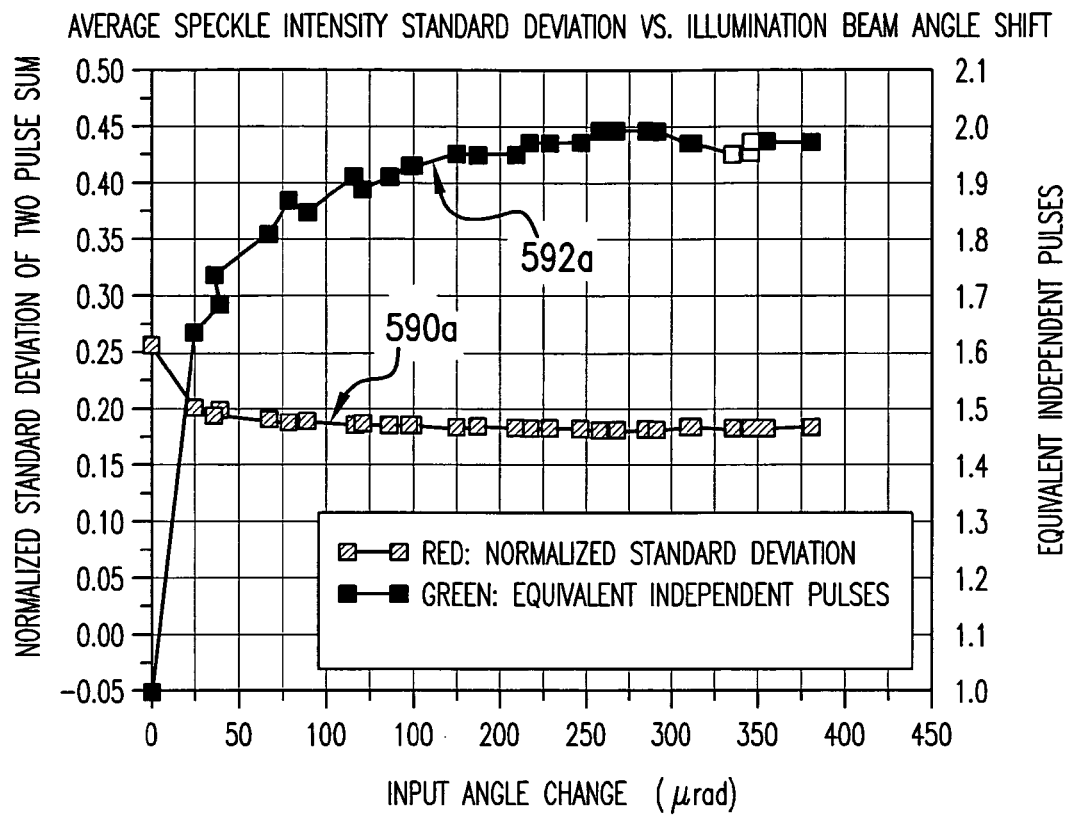
FIG. 46 illustrates exemplary test results according to aspects of an embodiment of the disclosed subject matter.

Tilt angle required to produce uncorrelated speckle patterns may be significant. The first big jump in equivalent pulses, from 1.0 to 1.55, is believed by applicants to be mostly due to the poor pulse-to-pulse repeatability of the speckle patterns when running as a MOPO. Even without changing the mirror tilt at all, two pulses are correlated no better than 30-35%. With seed only, this pulse-to-pulse correlation has been found to be about 85-90%. The long slow rise in equivalent pulse number does not even reach a value of 2.0 until about 400 μrad of mirror tilt as illustrated, e.g., in FIG. 46. This result could mean, e.g., there may be a need for a large angular sweep, of about ±500-1000 μrad, e.g., to create several uncorrelated speckle patterns in a single pulse.

Through experimentation relating to coherence applicants' employer has learned that, e.g., sub-pulses produced by a pulse stretcher are incoherent and lead to a different fringe pattern if their angles are slightly shifted. The pin hole fringe pattern shifts maximum to minimum when input angle is λ/2d.

Figure 35:
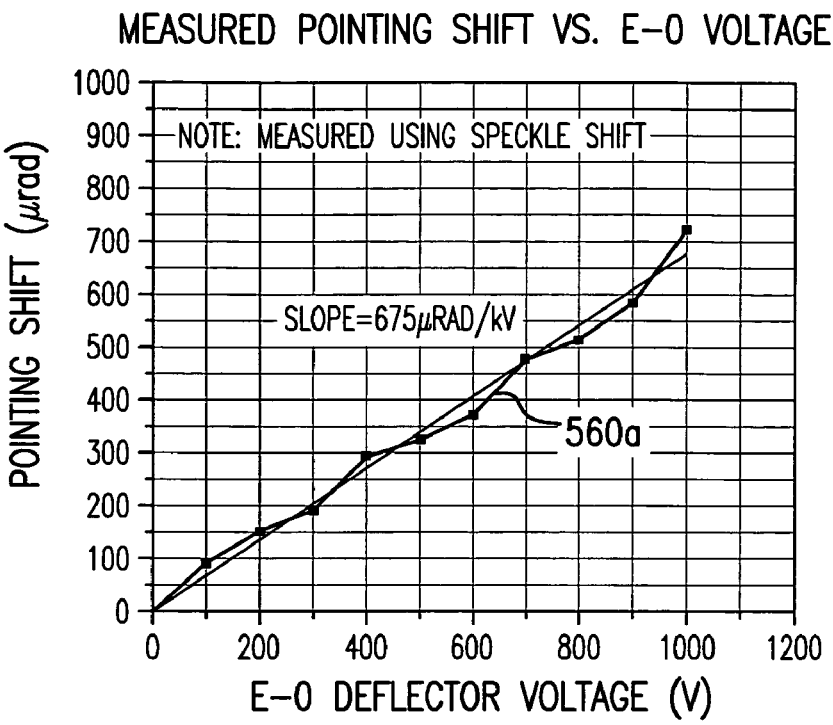
FIG. 35 illustrates pointing shift relative to E-O voltage according to aspects of an embodiment of the disclosed subject matter.

A plot of pointing shift (inferred by applicants from speckle shift measurements) v. E-O cell applied voltage is shown in FIG. 35. According to aspects of an embodiment of the disclosed subject matter applicants propose to sweep the pointing of the seed laser within a single pulse in order to reduce the speckle contrast within. This may be done, e.g., with electro optical elements, e.g., element 392a illustrated schematically in FIG. 33. Using vertical expansion prior to input of a seed laser pulse into an excimer power oscillator, e.g., a XeF chamber, placed as close to an input coupler, e.g., a beam splitter, and with a clear aperture of the E-O deflector at around 3.2 mm in diameter, the deflector may have to be upstream of the vertical expansion (not shown in FIG. 33). To minimize any translation in the oscillator cavity, e.g., associated with the angular tilt from the E-O deflector, it may be desirable to place the E-O deflector as close to the amplifier cavity as possible.

Turning now to FIG. 42 there is shown schematically and partly in block diagram form a beam combiner system 600a, according to aspects of an embodiment of the disclosed subject matter. The beam combiner system 600a may include, e.g., a first amplifier gain medium portion 602a and a second amplifier gain medium portion 604a, each of which may be, e.g., a PA or PO or ring power amplification stage, as described elsewhere in the present application. The output of each of the amplifier portions 602a, 604a may pass through a beam expander 608, which may include a prism 610a and a prism 612a, e.g., magnifying the beam by 2×. A turning mirror 620a may steer a first laser system output light pulse beam 622a from the amplifier 602a to a second turning mirror 624a which may steer the pulse beam 622a to form a pulse beam 632a onto a beam splitter for a first pulse stretcher 640a and thence to a beam splitter 646a for a second pulse stretcher 644a. A turning mirror 630a may steer a second laser system output light pulse beam 632a from the second amplifier 604a to a second turning mirror 634a, which may steer the beam 632a to form a beam 634a to be incident on the beam splitter 642a and thence the beam splitter 646a. The output of the first OPuS and second OPuS, which may be "mini-OPuSs" as discussed elsewhere in the present application, may pass through another beam splitter 650a, where, e.g., a small portion of the laser system output laser light pulse beam may be diverted, e.g., for metrology purposes, e.g., focused by a focusing lens 652a into a divergence detector 654a, which may be part of a control system (not shown) providing feedback control signals 656a, e.g., to the beam splitters 642a, 646a of the first and/or second OPuSs 640a, 644a or the turning mirrors for each of the beams 632a, 634a to increase or decrease divergence. Such coherencey busting may be at the input to the amplifiers 602a, 604a, e.g., shown in FIG. 42 as opposed to the outputs.

Figure 43:
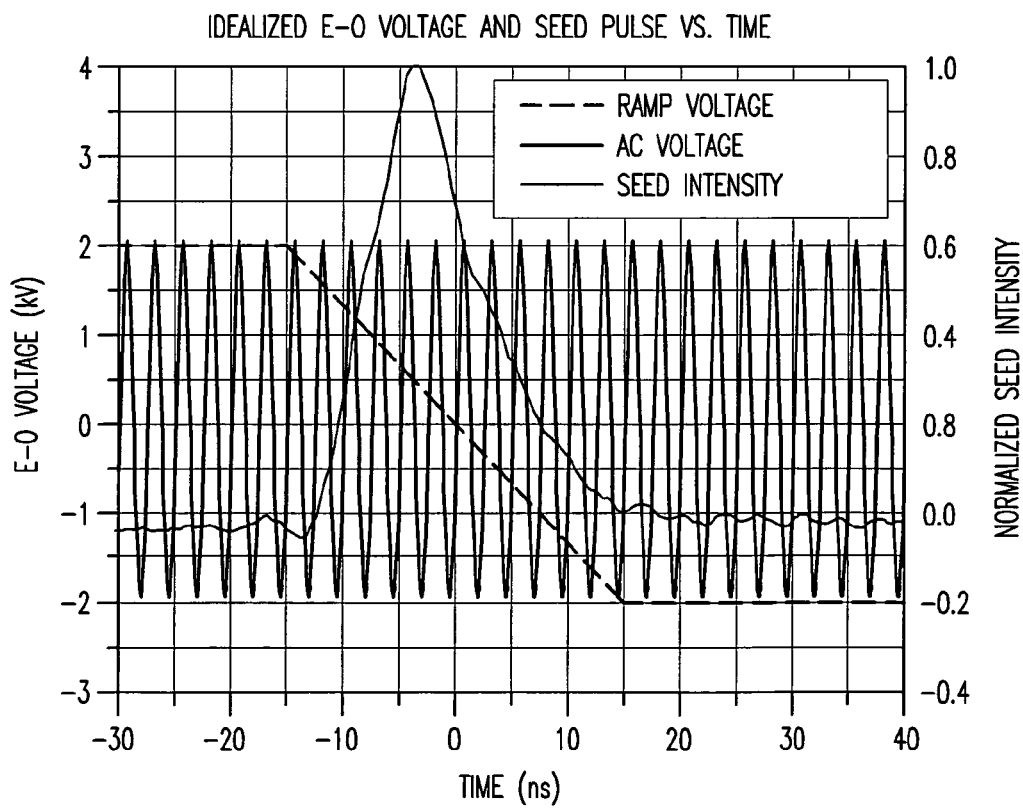
FIG. 43 illustrates a simulated E-O supply voltage with respect to a seed pulse intensity spectrum over time, according to aspects of an embodiment of the disclosed subject matter.

FIG. 43 gives an example of an idealized high frequency painting E-O voltage signal superimposed on a ramped (time varying) E-O DC voltage signal in relation to the intensity of the seed pulse being "painted", e.g., into a delay path or into the amplifying gain medium, e.g., a PA or PO or other power amplification stage. The ramp voltage may be created, e.g., by a fast R-C decay of an E-O cell capacitance as illustrated schematically in the circuit of FIG. 45. Due to certain constraints on a test circuit that applicants have so far built and tested, e.g., limited RF frequency, impedance mismatch, E-O load cell capacitance mismatch and the like, the actual voltages delivered by the "painting" circuit are shown in FIG. 44, as best as could be measured considering difficulties with probe loading, etc. These are approximately 25% of the needed RF frequency (e.g., about 100 MHz as opposed to 400 MHz) and 10% of the needed peak to peak voltage (e.g., around ±200 kV as opposed to ±2000 kV). The painting voltages could, of course, be better optimized, however, the test circuit was used to demonstrate the effectiveness of "painting" the seed beam into the amplifier gain medium for coherency/speckle reduction, e.g., with hybrid painting using both time varying DC steering and AC modulation, e.g., one in one axis and the other in a second axis, e.g., orthogonally related to each other.

Applicants experimental measurements have determined that with no ramp and no AC voltage the 2D speckle contrast overall is 76.8% and varies from the horizontal to the vertical axis. With painting using the ramp alone the speckle contrast overall was 29.4%, again varying in the two axes. Painting with the AC alone gave a speckle contrast overall of 59.9%, again varying in the two axes. With the ramp and AC voltages applied the spectral contrast was 28.1% overall and varying in both axes. This was using a less optimized circuit than the one of FIG. 40, which was not available for the testing and the actual tested circuit test results are shown in FIG. 44.

Figure 45:
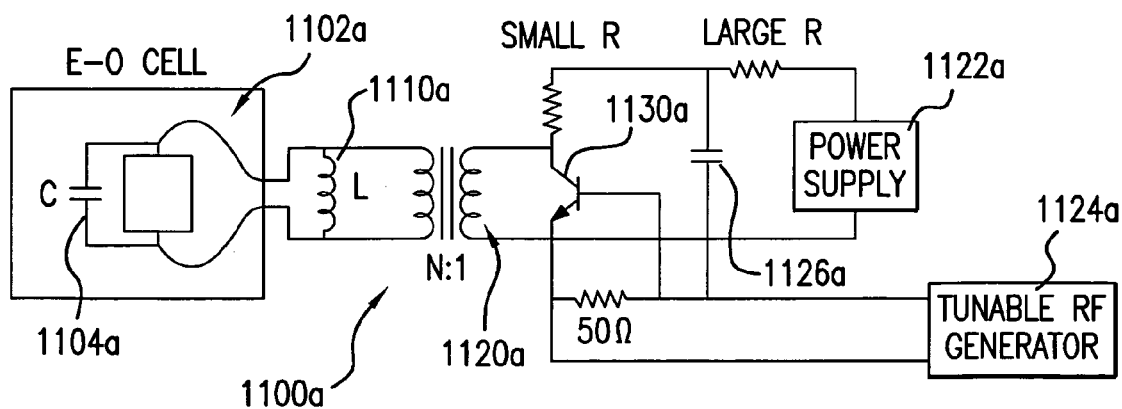
FIG. 45 illustrates a E-O cell drive circuit according to aspects of an embodiment of the disclosed subject matter.

Applicants believe that a more optimized circuit, shown by way of example in FIG. 45, will even improve further the reduction in speckle contrast. The circuit 1100*a* of FIG. 40 may include, e.g., an E-O cell, such as noted above, with an E-O cell capacitance 1104*a* and an impedance matching inductor 1110*a*, and an N:1 step-up transformer 1120*a*. Also included as illustrated may be, e.g., a DC power supply 1122*a* charging a capacitor 1126*a* through a large resistor 1130*a* and an RF frequency generator connected to a fast acting switch, e.g., a transistor 1140*a* (in reality a bank of such transistors in parallel), through a resistor. Also the capacitor 1126*a* discharges through a small resistor 1142*a* when the switch 1140*a* is closed.

Figure 47:
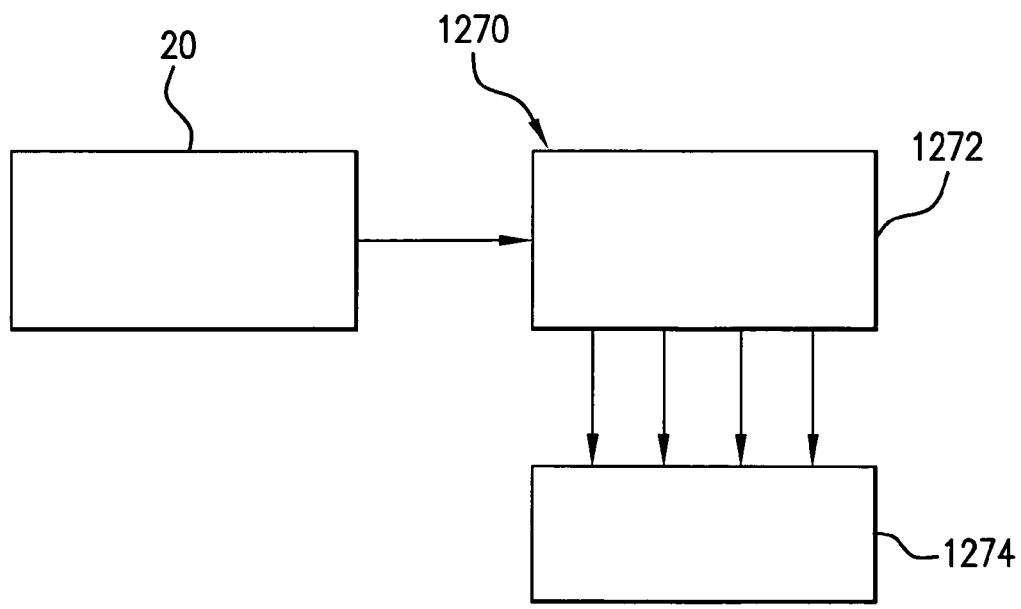
FIG. 47 illustrates schematically and in block diagram form a broad band light source and laser surface treatment system using the DUV laser light according to aspects of an embodiment of the disclosed subject matter.

Turning to FIG. 47 there is illustrated schematically and in block diagram form a laser treatment system, e.g., and LTPS or tbSLS laser annealing system, e.g., for melting and recrystallizing amorphous silicon on sheets of glass substrates at low temperature. The system 1070 may include, e.g., a laser system 20 such as described herein and a optical system 1272 to transform the laser 20 output light pulse beam from about 5×12 mm to 10 or so microns×390 mm or longer thin beams for treating a workpiece, e.g., held on a work piece handling stage 1274.

It will be understood by those skilled in the art that disclosed herein is a method and apparatus which may comprise a line narrowed pulsed excimer or molecular fluorine gas discharge laser system which may comprise a seed laser oscillator producing an output comprising a seed laser output light beam of pulses which may comprise a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, which may comprise a ring power amplification stage; a seed injection mechanism which may comprise a first partially reflecting optical element through which the seed laser oscillator output light beam is injected into the ring power amplification stage. The partially reflective element may comprise an input/output coupler. The partially reflecting optical element may transmit the seed laser output laser pulse beam onto a maximally reflective mirror oriented to reflect the seed laser output beam into the ring power amplification stage. The seed injection mechanism may comprise a maximally reflective second optical element upon which is incident a transmitted portion of the seed oscillator output laser light pulse beam transmitted through the first partially reflective optical element, positioned to reflect the portion of the seed oscillator output laser light pulse beam into the ring power amplification stage generally orthogonally to the path of the seed oscillator output laser light pulse beam incident on the seed injection mechanism. The first partially reflecting optical element may comprise a beam splitter; The second optical element may comprise a mirror selected for maximal reflection of the nominal center wavelength of the seed oscillator laser output pulses. The beam splitter may comprise a surface of incidence coated with an anti-reflectivity coating; the mirror may comprise a multilayer reflectivity coating. The seed injection mechanism may comprise an single piece optical element comprising a partially reflecting input surface of incidence upon which is incident the seed oscillator laser output light pulse beam, and which may further comprise: a totally internally reflective surface upon which is incident a transmitted portion of the seed oscillator output laser light pulse beam transmitted through the partially reflecting surface, positioned to reflect the seed oscillator output laser light pulse beam to a surface of exit of the single piece optical element positioned such that the exit of the transmitted portion of the seed oscillator output laser light pulse beam from the single piece optical element is generally orthogonally to the seed oscillator laser output light pulse beam at the partially reflecting input surface of incidence and into the ring power amplification stage. The surface of exit of the transmitted portion of the seed oscillator output laser light pulse further may comprise an output surface of incidence of an oscillator cavity output coupler for the ring power amplification stage. The single piece optical element may comprise an uncoated optical element. The single piece optical element may comprise an optic having a rectangular cross-section. The single piece optical element may comprises a truncated prism. The single piece optical element may comprise a prism. The ring power amplification stage may comprise a beam returner. The beam returner may comprise a bow-tie beam returner comprising an even number of reflecting surfaces. The beam returner may comprise a race track beam returner comprising an odd number of reflecting surfaces. The path of the laser system output light beam of pulses may be sufficiently misaligned with the path of the seed laser output light beam of pulses incident on the seed injection mechanism to avoid reverse coupling between the ring power amplification stage and the seed laser oscillator. The line narrowed pulsed excimer or molecular fluorine gas discharge laser system may comprise a seed laser oscillator producing an output comprising a seed laser output light beam of pulses which may comprise a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, which may comprise a ring power amplification stage; a seed injection mechanism through which the seed laser oscillator output light beam is injected into the ring power amplification stage. The seed injection mechanism may comprise an edge coupler. The seed injection mechanism may comprise an on axis partially reflective optical element. The seed injection mechanism may comprise a Brewster's angle wedge. The seed injection mechanism may comprise a polarization coupler. The seed injection mechanism may comprise an optical switching element within the amplifier gain medium cavity. The switching element comprising a Q-switch. The polarization coupler may comprise a Faraday rotator. The apparatus and method may comprise a beam expander within the ring power amplification stage. The beam expander may be enclosed within an enclosure of the ring power amplification stage chamber. The seed injection mechanism may be enclosed within an enclosure of the ring power amplification stage chamber. The beam returner may be enclosed within an enclosure of the ring power amplification stage chamber. The beam expander may comprise at least one prism. The at least one prism may comprise an uncoated optical element. The at least one prism may comprise a two prism beam expander. The two prism beam expander may comprise a beam expansion and dispersion prism optical elements. The apparatus and method may comprise the first prism of the two prism beam expander comprising a split prism and the second prism of the two prism beam expander comprising a one piece prism. The split prism may comprise a first section intermediate the maximally reflective mirror and the beam returner and a second section intermediate the partially reflective optical element and the beam returner. The split prism first and second sections may be separated from each other sufficiently to avoid either being an edge optic. The first portion of the split prism and the second prism may form a beam that contracts toward the beam returner and the beam first portion of the split prism and the second prism along with the beam returner may form a beam that expands between the beam returner and the second portion of the split prism. The apparatus and method may comprise an optical table to which is mounted the seed injection mechanism maximally reflective mirror, the seed injection mechanism partially reflective optical element, the first and second portions of the first split prism and the second single piece prism. An amplification stage output aperture may be mounted on the optical table. At least one of the first and second prisms may be mounted for movement relative to the other. The apparatus and method may comprise a beam relaying optical assembly intermediate the seed laser and the laser amplification stage which may comprise a beam expander; a coherency busting mechanism. The apparatus and method may comprise a line narrowed pulsed excimer or molecular fluorine gas discharge laser system which may comprise a seed laser oscillator producing an output comprising a seed laser output light beam of pulses which may comprise a first gas discharge excimer or molecular fluorine laser chamber; a line narrowing module within a first oscillator cavity; a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, which may comprise a ring power amplification stage; a solid state pulsed power system comprising timing control controlling the timing of the firing of the discharges between a first pair of electrodes in the seed laser oscillator and a second pair of electrodes in the ring power amplification stage to maintain a desired dose stability. The apparatus and method may comprise: a seed injection mechanism which may comprise a partially reflecting optical element through which the seed laser oscillator output light beam is injected into the ring power amplification stage. The ring power amplification stage may comprise a bow-tie configuration or a race track configuration.

Applicants have simulated through calculations speckle reduction as relates to the location of coherence lengths within a single gas discharge (e.g., ArF or KrF excimer) laser system output pulse after such a pulse has passed through the two OPuS pulse stretchers sold on laser systems manufactured by applicants' assignee Cymer, Inc., used for pulse stretching to increase the total integrated spectrum ($T_{is}$) to reduce the impact of peak intensity in the laser output pulse on the optics in the tool using the output light from the laser system, e.g., a lithography tool scanner illuminator. There are two OPuS in series, with the first having a delay path sufficient to stretch the $T_{is}$ of the output pulse from about 18.6 ns to about 47.8 ns and the second to stretch the pulse further to about 83.5 ns, e.g., measured at E955 (the width of the spectrum within which is contained 95% of the energy of the pulse.

Starting with the unstretched pulse, applicants divided the pulse into portions equal to the approximate coherence length, assuming a FWHM bandwidth of 0.10 pm and a Gaussian shape for the coherence length function. The impact of the pulse stretching on the coherence length portions of the pulse after passing through the first OPuS was to show that a first intensity hump in the spectrum of the stretched pulse was made up of the coherence length portions of the main pulse, a second intensity hump was mad up of coherence length portions of the main pulse overlapped with coherence length portions of a first daughter pulse. A third hump in the intensity spectrum is the result of overlapping of the first and second daughter pulses. Looking at the individual coherence length portions of the two humps applicants observed that the multiple versions (including daughters) of the coherence length portions remained sufficiently separated to not interfere with each other.

After passage through the second OPuS the simulated spectra, again only looking at the content of the first three humps in the stretched pulse, in the simulation (under the second hump were contributions from the original undelayed pulse, as before, the first delayed pulse from the first OPuS, as before and the first delayed pulse from the second OPuS), applicants observed that in this second pulse the multiple versions of the coherence length portions were very close together. This is caused by the fact that the first OPuS has a delay of ~18 ns and the second has a delay of ~22 ns. Thus only ~4 ns separates the versions of the coherence length portions, which is still not close enough for interference.

Under the third hump applicants observed contributions from the first delayed pulse from the first OPuS, the second delayed pulse from first OPuS, the first delayed pulse from the second OPuS, and the second delayed pulse from second OPuS. Applicants observed that the separation between some related coherence portions is larger than for others in the third hump in the intensity spectrum of the pulse stretched by two OPuSs. This increase in separation is due to the fact that two round trips through each OPuS equal ~36 ns=18*2 and ~44 ns=22*2. Thus the separation between coherence lengths grows with each round trip.

Applicants concluded that for a mini-OPuS as described in this application a single mini-OPuS with delay equal to one coherence length will create a train of pulses that dies out after about 4 coherence length values. Thus, applicants determined that for a single mini-OPuS to be effective, the two main OPuSs should not bring any daughter coherence lengths to within 4 coherence lengths of each other. but, applicants have observed in the simulation that the main OPuSs do just that, though only marginally so. The separation between coherence lengths for the third and greater humps is sufficient. Applicants believe that the impact of a single mini-OPuS between MO and amplification gain medium will be nearly the full expected coherence busting effect. A second mini-OPuS between MO and PA may not adequately interact with the two main OPuss. The empty spaces, not filled with related coherence length portions of the spectra pulse humps get more scarce when one combines a single min-OPuS and two regular OPuSs, and the second may be too much. According to aspects of an embodiment of the present invention applicants propose the coordinated change of the regular OPuS delay lengths when the mini-OPuS(s) are installed, including whether they are part of the laser system or installed down stream of the regular main OPuSs, e.g., in the lithography tool itself. Applicants believe that such mini-OPuS(s) can fill in the valleys of the pulse duration somewhat, leading to an increase in $T_{is}$ e.g., allowing a reduction in the delay lengths of one of the two main OPuSes for better overall coherence length separation.

While the particular aspects of embodiment(s) of the LASER SYSTEM described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter disclosed are merely exemplary, illustrative and representative of the subject matter which is broadly contemplated by the subject matter disclosed. The scope of the presently described and claimed aspects of embodiments fully encompasses other embodiments which may now be or may become obvious to those skilled in the art based on the teachings of the Specification. The scope of the present LASER SYSTEM is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It will be understood also be those skilled in the art that, in fulfillment of the patent statutes of the United States, applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, applicant(s) has disclosed only a single enabling example of any such aspect/feature/element of an embodiment or of any embodiment of the subject matter of what is claimed. Unless expressly and specifically so stated in the present application or the prosecution of this application, that applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

It will be understood by those skilled in the art that the aspects of embodiments of the subject matter disclosed disclosed above are intended to be preferred embodiments only and not to limit the disclosure of the subject matter disclosed(s) in any way and particularly not to a specific preferred embodiment alone. Many changes and modification can be made to the disclosed aspects of embodiments of the disclosed subject matter disclosed(s) that will be understood and appreciated by those skilled in the art. The appended claims are intended in scope and meaning to cover not only the disclosed aspects of embodiments of the subject matter disclosed(s) but also such equivalents and other modifications and changes that would be apparent to those skilled in the art. In additions to changes and modifications to the disclosed and claimed aspects of embodiments of the subject matter disclosed(s) noted above others could be implemented.

We claim:

1. An apparatus comprising:
a line narrowed pulsed excimer or molecular fluorine gas discharge laser system comprising:
a seed laser oscillator producing an output comprising a seed laser output light beam of pulses comprising:
a first gas discharge excimer or molecular fluorine laser chamber; and
a line narrowing module within a first oscillator cavity;
a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, comprising:
a ring power amplification stage including a beam expander; and
a seed injection mechanism comprising:
a first partially reflecting optical element through which the seed laser oscillator output light beam is injected into the ring power amplification stage, the partially reflecting optical element transmitting the seed laser output laser pulse beam onto a maximally reflective mirror oriented to reflect the seed laser output beam into the ring power amplification stage;
the first partially reflecting optical element comprising a beam splitter; and
a second optical element comprising a mirror selected for maximal reflection of the nominal center wavelength of the seed oscillator laser output pulses.

2. The apparatus of claim 1 further comprising:
the beam splitter comprising a surface of incidence coated with an anti-reflectivity coating;
the mirror comprising a multilayer reflectivity coating.

3. The apparatus of claim 1 further comprising:
the seed injection mechanism comprising:
a single piece optical element comprising a partially reflecting input surface of incidence upon which is incident the seed oscillator laser output light pulse beam, and further comprising:
a totally internally reflective surface upon which is incident a transmitted portion of the seed oscillator output laser light pulse beam transmitted through the partially reflecting surface, positioned to reflect the seed oscillator output laser light pulse beam to a surface of exit of the single piece optical element positioned such that the exit of the transmitted portion of the seed oscillator output laser light pulse beam from the single piece optical element is generally orthogonally to the seed oscillator laser output light pulse beam at the partially reflecting input surface of incidence and into the ring power amplification stage.

4. The apparatus of claim 3 further comprising:
the surface of exit of the transmitted portion of the seed oscillator output laser light pulse further comprising an output surface of incidence of an oscillator cavity output coupler for the ring power amplification stage.

5. The apparatus of claim 3 further comprising:
the single piece optical element comprising an uncoated optical element.

6. The apparatus of claim 3 further comprising:
the single piece optical element comprises an optic having a rectangular cross-section.

7. The apparatus of claim 3 further comprising:
the single piece optical element comprises a truncated prism.

8. The apparatus of claim 3 further comprising:
the single piece optical element comprising a prism.

9. The apparatus of claim 1 further comprising:
the beam expander enclosed within an enclosure of the ring power amplification stage chamber.

10. The apparatus of claim 1 further comprising:
the seed injection mechanism enclosed within an enclosure of the ring power amplification stage chamber.

11. The apparatus of claim 1 further comprising:
a beam returner enclosed within an enclosure of the ring power amplification stage chamber.

12. The apparatus of claim 11, wherein the beam returner is a prism that is configured to cross a light beam traveling along a first path through the amplifying gain medium with a light beam traveling along a second path through the amplifying gain medium.

13. The apparatus of claim 1 further comprising:
the beam expander comprising at least one prism.

14. The apparatus of claim 13 further comprising:
the at least one prism comprising an uncoated optical element.

15. The apparatus of claim 14 further comprising:
the at least one prism comprising a two prism beam expander.

16. The apparatus of claim 15 further comprising:
the two prism beam expander comprising beam expansion and dispersion prism optical elements.

17. The apparatus of claim 15 further comprising the first prism of the two prism beam expander comprising a split prism and the second prism of the two prism beam expander comprising a one piece prism.

18. An apparatus comprising:
a line narrowed pulsed excimer or molecular fluorine gas discharge laser system comprising:
a seed laser oscillator producing an output comprising a seed laser output light beam of pulses comprising:
a first gas discharge excimer or molecular fluorine laser chamber; and
a line narrowing module within a first oscillator cavity;
a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, comprising:
    a ring power amplification stage; and
    a seed injection mechanism comprising an edge coupler.

19. The apparatus of claim 18 further comprising:
a beam returner enclosed within an enclosure of the ring power amplification stage chamber.

20. The apparatus of claim 19 wherein the beam returner is a prism that is configured to cross a light beam traveling along a first path through the amplifying gain medium with a light beam traveling along a second path through the amplifying gain medium.

21. An apparatus comprising:
a line narrowed pulsed excimer or molecular fluorine gas discharge laser system comprising:
    a seed laser oscillator producing an output comprising a seed laser output light beam of pulses comprising:
        a first gas discharge excimer or molecular fluorine laser chamber; and
        a line narrowing module within a first oscillator cavity;
    a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, comprising:
        a ring power amplification stage; and
        a seed injection mechanism comprising an on axis partially reflective optical element.

22. The apparatus of claim 21 further comprising:
a beam returner enclosed within an enclosure of the ring power amplification stage chamber.

23. The apparatus of claim 22 wherein the beam returner is a prism that is configured to cross a light beam traveling along a first path through the amplifying gain medium with a light beam traveling along a second path through the amplifying gain medium.

24. An apparatus comprising:
a line narrowed pulsed excimer or molecular fluorine gas discharge laser system comprising:
    a seed laser oscillator producing an output comprising a seed laser output light beam of pulses comprising:
        a first gas discharge excimer or molecular fluorine laser chamber; and
        a line narrowing module within a first oscillator cavity;
    a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, comprising:
        a ring power amplification stage; and
        a seed injection mechanism comprising a Brewster's angle wedge.

25. The apparatus of claim 24 further comprising:
a beam returner enclosed within an enclosure of the ring power amplification stage chamber.

26. The apparatus of claim 25 wherein the beam returner is a prism that is configured to cross a light beam traveling along a first path through the amplifying gain medium with a light beam traveling along a second path through the amplifying gain medium.

27. An apparatus comprising:
a line narrowed pulsed excimer or molecular fluorine gas discharge laser system comprising:
    a seed laser oscillator producing an output comprising a seed laser output light beam of pulses comprising:
        a first gas discharge excimer or molecular fluorine laser chamber; and
        a line narrowing module within a first oscillator cavity;
    a laser amplification stage containing an amplifying gain medium in a second gas discharge excimer or molecular fluorine laser chamber receiving the output of the seed laser oscillator and amplifying the output of the seed laser oscillator to form a laser system output comprising a laser system output light beam of pulses, comprising:
        a ring power amplification stage; and
        a seed injection mechanism comprising a switching coupler.

28. The apparatus of claim 27 further comprising:
the seed injection mechanism comprising an optical switching element within the amplifier gain medium cavity.

29. The apparatus of claim 27 further comprising:
the seed injection mechanism comprising a polarization coupler.

30. The apparatus of claim 29 further comprising:
the polarization coupler comprising a Faraday rotator.

31. The apparatus of claim 27 further comprising:
the seed injection mechanism comprising a Q-switch.

32. The apparatus of claim 27 further comprising:
a beam returner enclosed within an enclosure of the ring power amplification stage chamber.

33. The apparatus of claim 32 wherein the beam returner is a prism that is configured to cross a light beam traveling along a first path through the amplifying gain medium with a light beam traveling along a second path through the amplifying gain medium.

* * * * *